US009900690B2

(12) United States Patent
Risberg et al.

(10) Patent No.: US 9,900,690 B2
(45) Date of Patent: Feb. 20, 2018

(54) CONTROL AND PROTECTION OF LOUDSPEAKERS

(71) Applicant: CIRRUS LOGIC INTERNATIONAL SEMICONDUCTOR LTD., Edinburgh (GB)

(72) Inventors: Pär Gunnars Risberg, Solna (SE); Erik Lindahl, Stockholm (SE); Marcus Arvidsson, Linköping (SE); Daniel Stahre, Stockholm (SE); Landy Toth, Newtown, PA (US)

(73) Assignee: CIRRUS LOGIC INTERNATIONAL SEMICONDUCTOR LTD., Edinburgh (GB)

( * ) Notice: Subject to any disclaimer, the term of this patent is extended or adjusted under 35 U.S.C. 154(b) by 0 days.

(21) Appl. No.: 14/430,707

(22) PCT Filed: Sep. 24, 2013

(86) PCT No.: PCT/IB2013/002668
§ 371 (c)(1),
(2) Date: Mar. 24, 2015

(87) PCT Pub. No.: WO2014/045123
PCT Pub. Date: Mar. 27, 2014

(65) Prior Publication Data

US 2015/0304772 A1 Oct. 22, 2015

Related U.S. Application Data

(60) Provisional application No. 61/705,130, filed on Sep. 24, 2012.

(51) Int. Cl.
*H03G 11/00* (2006.01)
*H04R 3/00* (2006.01)

(52) U.S. Cl.
CPC ............ *H04R 3/007* (2013.01); *H04R 3/002* (2013.01)

(58) Field of Classification Search
CPC ................................ H04R 3/007; H04R 3/002
See application file for complete search history.

(56) References Cited

U.S. PATENT DOCUMENTS

2010/0290643 A1* 11/2010 Mihelich ................ H04S 7/301 381/99
2011/0228945 A1* 9/2011 Mihelich ............... H04R 3/002 381/59

FOREIGN PATENT DOCUMENTS

CN 101233783 A 7/2008

OTHER PUBLICATIONS

Klippel, "Active Compensation of Transducer Nonlinearities", AES, XP040374476, May 23, 2003, pp. 1-17.

(Continued)

*Primary Examiner* — Regina N Holder
(74) *Attorney, Agent, or Firm* — Carter, DeLuca, Farrell & Schmidt, LLP

(57) ABSTRACT

A nonlinear control system and a loudspeaker protection system. In particular, a nonlinear control system including a controller, an audio system, and a model is disclosed. The controller is configured to accept one or more input signals, and one or more estimated states produced by the model to produce one or more control signals. The audio system includes one or more transducers configured to accept the control signals to produce a rendered audio stream therefrom. An active loudspeaker with an integrated amplifier is disclosed. A loudspeaker protection system and a quality control system are disclosed. More particularly, a system for clamping the input to a loudspeaker dependent upon a bank of representative models is disclosed.

33 Claims, 17 Drawing Sheets

(56) References Cited

OTHER PUBLICATIONS

International Search Report and Written Opinion issued in corresponding application No. PCT/IB2013/002668 on May 15, 2015.
Jakobsson et al., "Modelling and Compensation of Nonlinear Loudspeaker", Master's Thesis EX033/2010, Department of Signals and Systems Chalmers University Of Technology, Dec. 31, 2010. (51 pages).
Klippel, W., "End-of-Line Testing", Assembly Line-Theory and Practice, InTech, Aug. 31, 2011. (28 pages).
Office Action for corresponding Chinese Application No. 2013800614280 dated Jul. 12, 2017. (15 pages).

* cited by examiner

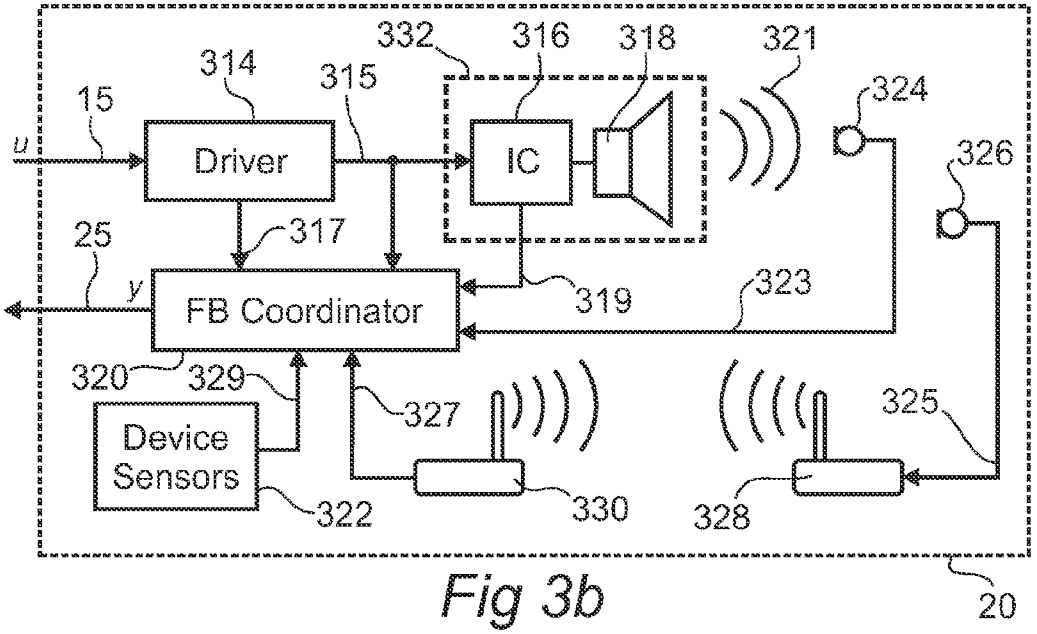
Fig 3b
Fig 3c
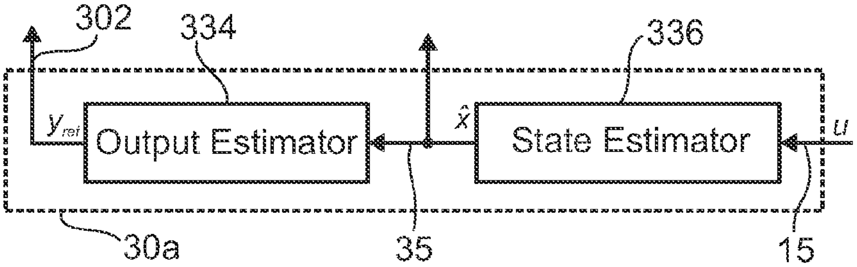
Fig 3d
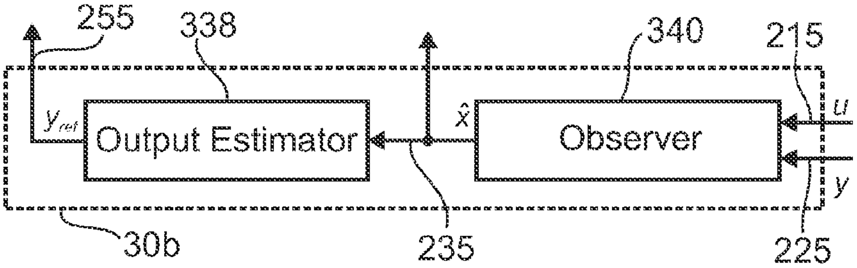
Fig 3e
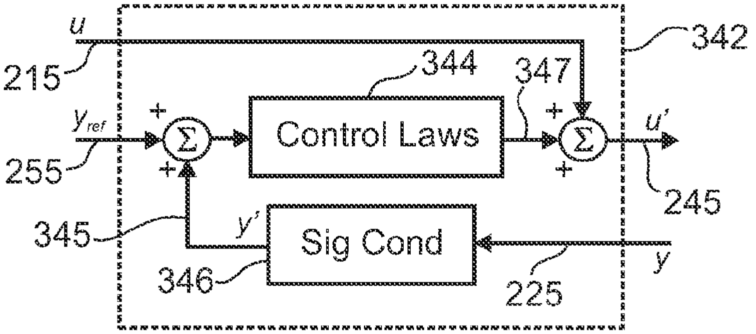

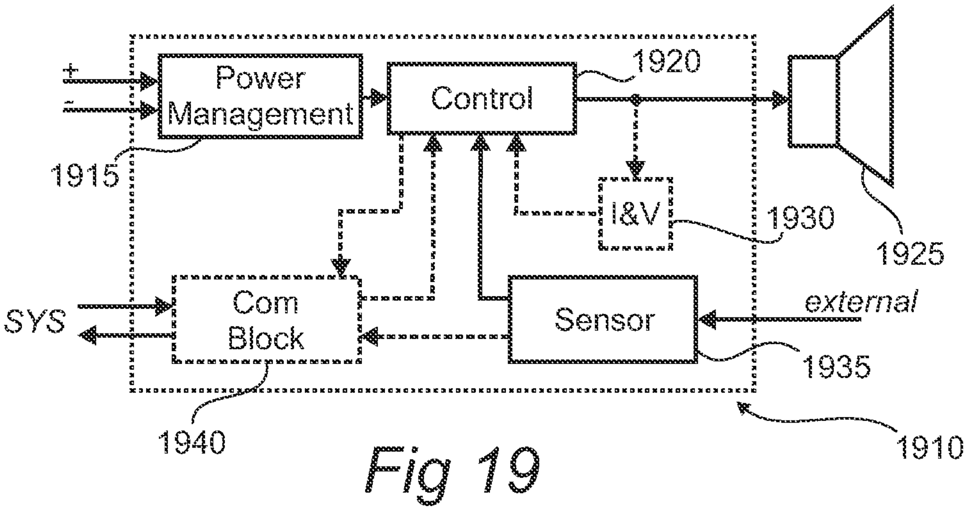
Fig 19
Fig 20
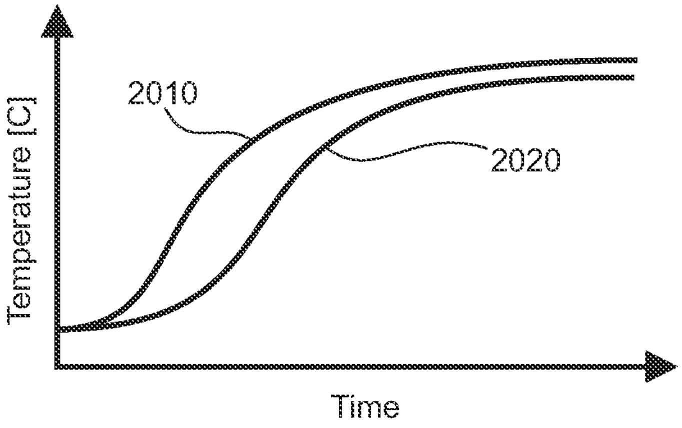
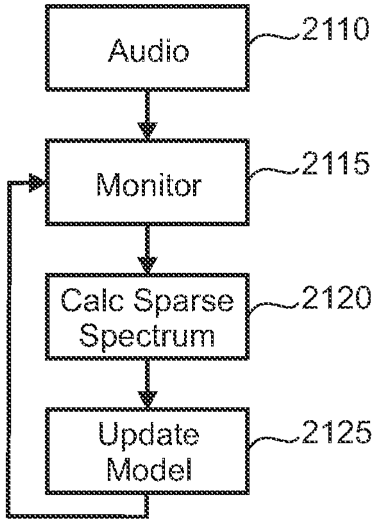
Fig 21a
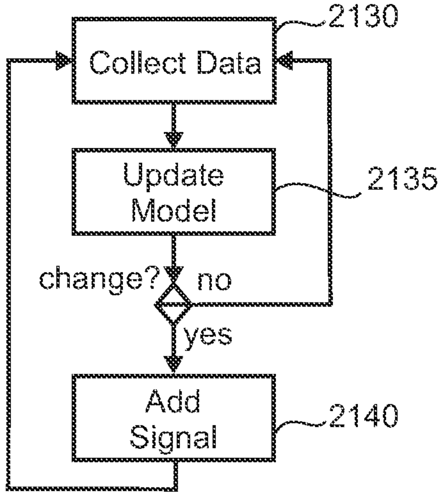
Fig 21b

CONTROL AND PROTECTION OF LOUDSPEAKERS

TECHNICAL FIELD

The present disclosure is directed to digital control and protection of loudspeakers and particularly to nonlinear digital control and protection systems for implementation in audio signal processing. The present disclosure is further directed towards protection of loudspeakers, earphones, headphones, and other electroacoustic transducer systems, and implementations for forecasting the usable lifetime thereof. The present disclosure is further directed towards systems and methods for predicting the remaining lifetime of a loudspeaker element in service.

BACKGROUND

Mobile technologies and consumer electronic devices (CED) continue to expand in use and scope throughout the world. In parallel with continued proliferation, there is rapid technical advance of device hardware and components, leading to increased computing capability and incorporation of new peripherals onboard a device along with reductions in device size, power consumption, etc. Most devices, such as mobile phones, tablets, and laptops, include audio communication systems and particularly one or more loudspeakers to interact with and/or stream audio data to a user.

Every device has an acoustic signature, meaning the audible characteristics of a device dictated by its makeup and design that influence the sound generated by the device or the way it interacts with sound. The acoustic signature may include a range of nonlinear aspects, which potentially depend on the design of the device, on the age of the device, the content of an associated stream (e.g., sound pressure level, spectrum, etc.), and/or the environment in which the device operates. The acoustic signature of the device may significantly influence the audio experience of a user.

Improved acoustic performance may be achieved, generally with additional cost, increased computational complexity, and/or increased component size. Such aspects are in conflict with the current design trend. As such, cost, computation, and size sensitive approaches to addressing nonlinear acoustic signatures of devices would be a welcome addition to a designer's toolbox.

Furthermore, the rate of product returns often associated with loudspeaker related failures and lifetime issue is a major industry concern. A combination of thermal and excursion related damage may be the root cause of such failures. A tradeoff between performance and lifetime is often necessary in order to balance such issues.

SUMMARY

One objective of this disclosure is to provide a control system for a loudspeaker.

Another objective is to provide a filter system for enhancing audio output from a consumer electronics device.

Yet another objective is to provide a manufacturing method for configuring a nonlinear control system in accordance with the present disclosure for an associated consumer electronics device.

Another objective is to provide a protection system for preventing damage to a loudspeaker during use.

Yet another objective is to provide a simplified and reliable loudspeaker.

The above objectives are wholly or partially met by devices, systems, and methods according to the appended claims in accordance with the present disclosure. Features and aspects are set forth in the appended claims, in the following description, and in the annexed drawings in accordance with the present disclosure.

According to a first aspect there is provided, a loudspeaker protection system for producing a rendered audio stream from one or more input signals including an estimator including one or more state estimating models, each state estimating model configured to accept one or more of the input signals, and to generate one or more estimated states therefrom; and a loudspeaker protection block configured to accept one or more of the input signals and/or delayed versions thereof and the estimated states and/or signals generated therefrom, and to produce an output signal from a combination thereof.

In aspects, the loudspeaker protection block may include a compressor, a limiter, a clipper, or the like in order to produce the output signal. One or more characteristics of the compressor/limiter/clipper (e.g., gain, cutoff amplitude, threshold for compression, etc.) may be dependent upon the estimated states, and applied to the input signal.

In aspects, the system may include a selector in accordance with the present disclosure coupled to the estimator and the loudspeaker protection block, configured to analyze one or more of the estimated states and/or state estimating models, and to generate an estimating signal therefrom, the loudspeaker protection block configured to use the estimating signal in the production of the output signal.

In aspects, the selector may be configured to select the worst case estimated state from the estimated states, the estimating signal dependent upon the worst case estimated state.

In aspects, the system may include a feedback block in accordance with the present disclosure coupled to an associated loudspeaker, the estimator, and/or the selector, configured to provide one or more feedback signals from the loudspeaker to the selector, the selector configured to use one or more of the feedback signals in the generation of the estimating signal.

In aspects, the system may include a feedback block in accordance with the present disclosure coupled to an associated loudspeaker and/or driver configured to provide one or more feedback signals or signals generated therefrom to the system, a model bank including a group of models each with associated characteristics, and a selector coupled to the feedback block, the model bank, and the estimator, the selector configured to accept one or more of the feedback signals or signals generated therefrom, to calculate one or more measured characteristics from the feedback signals, to compare one or more model characteristics to the measured characteristics to select a best fit model from the model bank, and to load, enable, and/or select an associated best fit model for operation within the estimator.

In aspects, some non-limiting examples of characteristic and/or feedback signal include one or more forms of feedback (e.g., current, voltage, impedance characteristics, excursion levels, voice coil temperature, microphone feedback, histories thereof, etc.), device level feedback (e.g., acceleration, rotational movement, user settings, histories thereof, etc.), ambient feedback (e.g., temperature, humidity, altitude, local pressure, histories thereof, etc.). In aspects, the characteristic may be related to loudspeaker impedance and the estimated state may be related to loudspeaker excursion.

In aspects, the system may include a feedback block in accordance with the present disclosure coupled to an associated loudspeaker and/or driver, configured to provide one or more feedback signals or signals generated therefrom to the system, a model bank in accordance with the present disclosure including a group of feedback estimating models each associated with a corresponding state estimating model, and configured to calculate a value from one or more of the input signals, and a selector coupled to the feedback block, the model bank, and the estimator, the selector configured to compare one or more of the values to the feedback signals to select a best fit feedback estimating model from the model bank, the selector configured to load, enable, and/or select the corresponding best fit state estimating model for operation within the estimator.

In aspects, the feedback signals may be related to loudspeaker current and/or voltage, and the estimated state may be related to loudspeaker excursion.

In aspects, the protection block may include a compressor and/or limiter configured to accept the input signals, the compressor and/or limiter including one or more properties, one or more of which may be configured by the estimated states and/or estimating signal.

In aspects, one or more components of the system may be configured to accept a power constraint from an external power manager and/or to generate a power prediction. In aspects, the power constraint and/or power prediction may be used in the generation of the output signal.

In aspects, the power protection block may be configured to accept a kinetic feedback signal representative of the movement of the loudspeaker within an environment, and to use the kinetic feedback signal in the generation of the output signal.

In aspects, some non-limiting examples of kinetic feedback signals include a linear acceleration, a rotational motion, a pressure change, a free-fall condition, an impact, or the like.

In aspects, one or more component in the system may be configured to upload one or more of the estimated states, state estimating models, and/or estimating signals to a data center in accordance with the present disclosure. In aspects, the system may be configured to download one or more models, characteristics, or the like from the data center.

In aspects, one or more component of the system may be configured to superimpose a test signal onto the output signal, one or more components configured to extract a test feedback signal related to the test signal from the feedback signal. In aspects, the selector may be configured to generate a model based upon the test signal and the test feedback signal, or the like.

In aspects, one or more component of the system may be implemented in an operating system compatible background service.

According to aspects, there is provided a consumer electronics device including a loudspeaker protection system and/or nonlinear control system in accordance with the present disclosure.

According to aspects, there is provided use of a loudspeaker protection system in accordance with the present disclosure in a consumer electronics device.

According to aspects, there is provided a method for protecting a loudspeaker including receiving an input signal including an audio stream, estimating one or more loudspeaker states from the audio stream, determining which loudspeaker states best represents the actual loudspeaker state, and modifying the audio stream based upon the best state estimate.

In aspects, the step of modifying may include limiting the audio stream amplitude based upon the value of one or more of the state estimates.

In aspects, the method may include measuring a feedback signal from the loudspeaker, and using the feedback signal in the determination. In aspects, the step of estimating may include calculating one or more of the state estimates with a feed forward model. In aspects, the method may include calculating state estimates and output estimates from corresponding model pairs, and comparing the output estimates from each model pair with a feedback signal from the loudspeaker to select the best model pair, and selecting the best state estimate from the best model pair.

In aspects, the method may include calculating a power estimate from the input signal and/or the feedback signal, using the power estimate in the step of modifying, receiving a power constraint, limiting the output signal based upon the power constraint, sending data corresponding to one or more state estimates to a data center, and/or receiving one or more power constraints from the data center.

In aspects, the method may include reverting to a safe operating mode if a best state estimate cannot be reliably determined. In aspects, the safe operating mode may include summing each of the estimates to form a worst case estimate, and modifying the audio stream based upon the worst case estimate.

According to aspects there is provided, an active loudspeaker including a movable membrane sized and configured for the production of an audible sound wave, an enclosure with one or more walls coupled to the movable membrane so as to form a cavity within the enclosure, one or more sensors coupled to the movable membrane configured to measure one or more states associated with the movement of the membrane to produce a sensory feedback signal, and a microcircuit electrically coupled to the sensor and the movable membrane, coupled to and/or embedded within one of the walls of the enclosure, configured to receive the sensory feedback signal, and to drive the movement of the membrane.

In aspects, some non-limiting examples of sensors include a capacitive sensor, an optical sensor, a thermopile, a pressure sensor, an infrared sensor, an inductive sensor, and the like. In aspects, one or more sensors may be an optical sensor, including an emitter and a detector, the emitter and detector optically coupled to the membrane.

In aspects, the active loudspeaker may include a plurality of optical sensors each optically coupled with the membrane and configured to produce an optical feedback signal, the microcircuit configured to compare a plurality of the optical feedback signals to determine the presence of a rocking vibration mode of the membrane, and optionally to reduce the movement of the membrane upon detection of the presence of a rocking mode.

In aspects, one or more of the sensors, and/or the microcircuit may be packaged into a single system on chip.

In aspects, the active loudspeaker may include a connector, coupled to the microcircuit configured to convey signals between the microcircuit and an external system, the microcircuit configured to communicate power, an audio stream, and/or configuration data via the connector with the external system. In aspects, the connector may include 2 terminals, through which the power, audio stream, and configuration data may be communicated.

In aspects, an active loudspeaker in accordance with the present disclosure may include a loudspeaker protection system in accordance with the present disclosure.

According to aspects, there is provided, a nonlinear control system for producing a rendered audio stream from one or more input signals including a controller configured to accept the input signal, and one or more estimated states, and to generate one or more control signals therefrom, a model configured to accept one or more of the control signals and generate one or more estimated states therefrom, and an audio system including at least one transducer, the audio system configured to accept one more of the control signals and to drive the transducer with the control signals or a signal generated therefrom to produce the rendered audio stream.

The model may include a feed forward nonlinear state estimator, configured to generate one or more of the estimated states.

The model may include an observer and the audio system may include a means for producing one or more feedback signals. The observer may be configured to accept one or more of the feedback signals or signals generated therefrom and to generate one or more of the estimated states from one or more of the feedback signals and one or more of the control signals.

The observer may include a nonlinear observer, a sliding mode observer, a Kalman filter, an adaptive filter, a least means square adaptive filter, an augmented recursive least square filter, an extended Kalman filter, ensemble Kalman filter, high order extended Kalman filters, a dynamic Bayesian network. In one non-limiting example, the observer may include an unscented Kalman filter or an augmented unscented Kalman filter to generate one or more of the estimated states.

The controller may include a protection block, the protection block configured to analyze one or more of the input signals, the estimated states and/or the control signals and to modify the control signals based upon the analysis.

The controller may include a feed forward control system interconnected with a feedback control system, and the model may be configured to generate one or more reference signals from one or more of the estimated states, the feed forward control system may be configured to perform a nonlinear transformation on the input signals to produce an intermediate control signal and the feedback controller may be configured to compare two or more of the intermediate control signal, the reference signals, and the feedback signals to generate the control signals. The feedback controller may include a PID control block for generating one or more of the control signals. The feed forward controller may include an exact input-output linearization controller to generate one or more of the intermediate control signals.

In aspects, the audio system may include a driver configured to interconnect the control signal with the transducer. The driver may be configured to monitor one or more of a current signal, a voltage signal, a power signal, and/or a transducer impedance signal and to provide the signal as feedback to one or more component of the nonlinear control system.

The audio system may include a feedback coordination block configured to accept one or more sensory signals generated by one or more sensors, transducers, in the system and to generate one or more feedback signals therefrom.

The controller may include a target dynamics block and an inverse dynamics block. The target dynamics block may be configured to modify the input signal or a signal generated therefrom to generate a targeted spectral response therefrom. The inverse dynamics block may be configured to compensate for one or more nonlinear property of the audio system on the input signal or a signal generated therefrom.

The nonlinear control system may include an adaptive algorithm configured to monitor a distortion aspect of one or more signals within the nonlinear control system and to modify one or more aspects of the controller to reduce said distortion.

The controller may include one or more parametrically defined parameters, the function of the controller dependent on the parameters and the adaptive algorithm may be configured to adjust one or more of the parameters to reduce the distortion aspect.

The nonlinear control system may include means for estimating a characteristic temperature of the transducer and delivering the estimate to one or more of the controller and/or the model. The controller and/or the model may be configured to compensate for changes in the system performance associated with the characteristic temperature estimate.

The nonlinear control system may be integrated into a consumer electronics device. A consumer electronics device may include a cellular phone (e.g., a smartphone), a tablet computer, a laptop computer, a portable media player, a television, a portable gaming device, a gaming console, a gaming controller, a remote control, an appliance (e.g., a toaster, a refrigerator, a bread maker, a microwave, a vacuum cleaner, etc.) a power tool (a drill, a blender, etc.), a robot (e.g., an autonomous cleaning robot, a care giving robot, etc.), a toy (e.g., a doll, a figurine, a construction set, a tractor, etc.), a greeting card, a home entertainment system, an active loudspeaker, a media accessory (e.g., a phone or tablet audio and/or video accessory), a sound bar, and the like.

The transducer may an electromagnetic loudspeaker, a piezoelectric actuator, an electroactive polymer based loudspeaker, an electrostatic loudspeaker, combinations thereof, or the like.

According to aspects there is provided use of a nonlinear control system in accordance with the present disclosure in a consumer electronics device.

According to aspects there is provided use of a nonlinear control system in accordance with the present disclosure to process an audio signal.

According to aspects there is provided, a method for matching the performance of a production speaker to a target speaker model including configuring the production speaker with a nonlinear control system in accordance with the present disclosure, analyzing the performance of the production speaker, comparing the performance of the production speaker to that of the target speaker model, and adjusting the nonlinear control system to modify the performance of the production speaker to substantially match that of the target speaker model.

The method may include iteratively performing the steps of analyzing, comparing, and adjusting.

The step of adjusting may be at least partially performed with an optimization algorithm in accordance with the present disclosure. In one non-limiting example, the step of adjusting may be at least partially performed with an unscented Kalman filter.

According to aspects there is provided, an active loudspeaker including a membrane actuator and/or transducer in accordance with the present disclosure, a housing coupled to the actuator, and an integrated circuit in accordance with the present disclosure coupled in electrical communication with the membrane actuator.

According to aspects there is provided, a loudspeaker protection system including a parameter extraction block in accordance with the present disclosure, coupled in electrical communication with a loudspeaker and a control system in accordance with the present disclosure.

BRIEF DESCRIPTION OF THE DRAWINGS

FIG. 3*a-e* show aspects of components of a nonlinear control system in accordance with the present disclosure;

FIG. 19 shows aspects of a schematic of an active loudspeaker control system in accordance with the present disclosure;

FIG. 20 shows a non-limiting example of a multi-temperature sensing configuration in accordance with the present disclosure;

FIGS. 21*a-b* shows aspects of methods for updating an adaptive model in accordance with the present disclosure;

DETAILED DESCRIPTION

Figure 1:
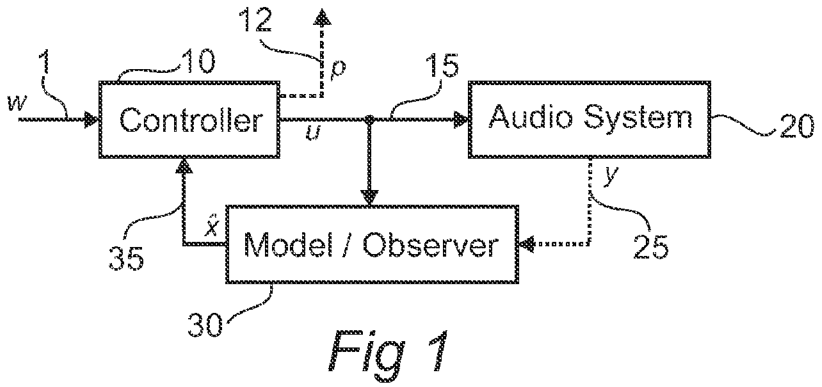
FIG. 1 shows a schematic of a nonlinear control system in accordance with the present disclosure.

Particular embodiments of the present disclosure are described hereinbelow with reference to the accompanying drawings; however, the disclosed embodiments are merely examples of the disclosure and may be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure. Like reference numerals may refer to similar or identical elements throughout the description of the figures.

The term consumer electronic device is meant to include, without limitation, a cellular phone (e.g., a smartphone), a tablet computer, a laptop computer, a portable media player, a television, a portable gaming device, a gaming console, a gaming controller, a remote control, an appliance (e.g., a toaster, a refrigerator, a bread maker, a microwave, a vacuum cleaner, etc.) a power tool (a drill, a blender, etc.), a robot (e.g., an autonomous cleaning robot, a care giving robot, etc.), a toy (e.g., a doll, a figurine, a construction set, a tractor, etc.), a greeting card, a home entertainment system, an active loudspeaker, a media accessory (e.g., a phone or tablet audio and/or video accessory), a sound bar, and so forth.

The term input audio signal is meant to include, without limitation, one or more signals (e.g., a digital signal, one or more analog signals, a 5.1 surround sound signal, an audio playback stream, etc.) provided by an external audio source (e.g., a processor, an audio streaming device, an audio feedback device, a wireless transceiver, an ADC, an audio decoder circuit, a DSP, etc.).

The term acoustic signature is meant to include, without limitation, the audible or measurable sound characteristics of a consumer electronic device and/or a component thereof (e.g., a loudspeaker assembly, with enclosure, waveguide, etc.) dictated by its design that influence the sound generated by the consumer electronic device and/or a component thereof. The acoustic signature may be influenced by many factors including the loudspeaker design (speaker size, internal speaker elements, material selection, placement, mounting, covers, etc.), device form factor, internal component placement, screen real-estate and material makeup, case material selection, hardware layout, and assembly considerations amongst others. Cost reduction, form factor constraints, visual appeal and many other competing factors are favored during the design process at the expense of the audio quality of the consumer electronic device. Thus, the acoustic signature of the device may deviate significantly from an ideal response. In addition, manufacturing variations in the above factors may significantly influence the acoustic signature of each device, causing further part to part variations that degrade the audio experience for a user. Some non-limiting examples of factors that may affect the acoustic signature of a consumer electronic device include: insufficient speaker size, which may limit movement of air necessary to re-create low frequencies, insufficient space for the acoustic enclosure behind the membrane which may lead to a higher natural roll-off frequency in the low end of the audio spectrum, insufficient amplifier power available, an indirect audio path between membrane and listener due to speaker placement often being on the back of a TV or under a laptop, relying on reflection to reach the listener, among others factors.

An acoustic signature may include one or more nonlinear aspects relating to material selection, design aspects, assembly aspects, etc. that may influence the audio output from the associated device, causing such effects as intermodulation, harmonic generation, sub-harmonic generation, compression, signal distortion, bifurcation (e.g., unstable states), chaotic behavior, air convective aspects, and the like. Some non-limiting examples of nonlinear aspects include eddy currents, cone positional nonlinearities, coil/field nonlinearities, DC coil displacement, electromechanical nonlinearities (e.g., magnetic and/or E-field hysteresis), viscoelastic and associated mechanical aspects (e.g., suspension nonlinearities, nonlinear damping, in the spider, mounting frame, cone, suspension geometry, etc.), assembly eccentricities, driver characteristics, thermal characteristics, acoustic radiation properties (e.g., radiation, diffraction, propagation, room effects, convection aspects, etc.), audio perception characteristics (e.g., psychoacoustic aspects), and the like.

Such nonlinear aspects may be amplitude dependent (e.g., thermally dependent, cone excursion dependent, input power dependent, etc.), age dependent (e.g., changing over time based on storage and/or operating conditions), operating environment dependent (e.g., based on slow onset thermal influences), aging of mechanical and/or magnetic dependent (e.g., depolarization of associated magnetic materials, aging of rubber and/or polymeric mounts, changes associated with dust collection, etc.), dependent upon part-to-part variance (e.g., associated with manufacturing in precision, positioning variance during assembly, varied mounting pressure, etc.), and the like.

A nonlinear control system in accordance with the present disclosure may be configured to compensate for one or more of the above aspects, preferably during playback of a general audio stream. Such nonlinear control systems may be advantageous to effectively extend the audio quality associated with an audio stream to the limits of what the associated hardware can handle.

In some applications, operational stresses on one or more elements of a loudspeaker may be estimated by prediction of the temperature of the loudspeaker in service. In many cases, to adequately protect the speaker, the speaker temperature may be measured with an accuracy of approximately +/−5 degrees centigrade. Oftentimes, the maximum allowed speaker coil temperature is typically 105 degrees centigrade while a typical operating temperature may be 80-90 degrees centigrade. Thus, a reasonably small operating window may exist within which to manage heat dissipation of the speaker (roughly 10-20 degrees centigrade). As a result, an accurate temperature measurement for the speaker coil may be advantageous in a practical loudspeaker protection system.

Often, the temperature changes in a speaker may be estimated by calculating the DC resistance of the speaker. This resistance is dependent on the temperature as a result of the temperature coefficient of the wire used for the speaker coil. However, the impedance may vary dramatically due to process variations during production. For a typical mobile phone speaker, the nominal resistance may vary by approximately +/−10 percent (e.g., for typical temperature dependence values, will lead to a temperature offset of approximately +/−25 degrees Centigrade).

In aspects, a speaker protection system is disclosed including an excursion estimator (e.g., an estimate for the voice coil excursion of an associated loudspeaker). In aspects, the excursion estimator may include or be coupled to a plurality of models, each model configured to estimate a loudspeaker excursion parameter. In aspects, the plurality of models may be derived for a class of loudspeakers (e.g., units produced within a particular product family, selected from manufacturing based testing of a product, or product family, etc.). The models may be configured to estimate loudspeaker excursion from an input signal. In aspects, the excursion estimator may select a worst case model (or the worst case output from the plurality of models at any given time in order to make a worst case estimate). In aspects, a feedback signal (e.g., a voltage, and/or current feedback, a device characteristic, etc.) may be extracted from or measured on the loudspeaker during operation and compared (e.g., within the estimator) with one or more of the models, so as to select a best fit model from the plurality of models to represent the device at any given time during operation thereof.

In aspects, the speaker protection system may be configured in an entirely feed-forward fashion, e.g., the excursion estimation may be made from one or more of the estimators without explicit excursion feedback from the loudspeaker or an associated driving circuit. In such a configuration, the plurality of models may be selected so as to ensure, for a given device or device family, that the estimated excursion (e.g., from one or more of the models) is always a worst case condition. Such a configuration may be advantageous for providing loudspeaker protection without the need for additional feedback related hardware, and/or additional computational resources (e.g., additional computational resources required for, real-time computation of models, spectral model calculation, testing procedures, etc.).

In aspects, the plurality of models may be generated during manufacture, updated post launch, etc. In aspects, a virtual model library may be generated and updated throughout the lifetime of the product. In such a configuration, the virtual model library may be updated, sub-classes of models from the library may be sent to devices in the field (e.g., as part of an update procedure, etc.). In aspects, sub-classes of models may be defined based upon manufacturing lots, aging related feedback (e.g., changes in impedance over time), user usage case classification (e.g., heavy user, mobile user, extreme user, light user, etc.). Such an update may be performed as part of a firmware update, as a way of preventing degradation of the loudspeaker (e.g., to reduce the loudspeaker output for a certain sub-class, or user class, etc., so as to extend working life, or reduce in-field failures, etc.). In aspects, the models that may be loaded onto a device could be derived from sub classes associated with a product ID number (e.g., a known manufactured batch of speakers, etc.).

In aspects, the system may include one or more models representative of a common failure mode (e.g., over-excursion related damage, heating related property changes, fatigue related damage, impact related damage, leakage related failure, adhesive detachment, etc.). In aspects, the system may include a test process to determine if an associated loudspeaker unit is operational, or if the loudspeaker unit has failed, perhaps due to an event, wear-and-tear, etc.

In aspects, one or more of the models may include a failure mode model for a leaking case scenario. Such a configuration may be advantageous in debugging failures associated with other aspects of the device (e.g., such as a leaky phone case, etc.) which may impact the performance of the loudspeaker.

In aspects, one or more of the models may include a free air test condition (e.g., performed over a range of temperatures), and/or a blocked vent condition such that a range of failures may be predicted without excessive computational effort or complex models.

In aspects, during periods of time, it may be the case that the protection system may not successfully identify the desired system states, a best fit may not be determined, etc. Such a condition may occur, for example, if the loudspeaker properties change dramatically during use (e.g., if the speaker gets blocked, damage occurs due to an impact, etc.). The system, selector, and/or protection block, may include a safe operating condition into which it may operate during such periods. In aspects, the safe operating mode may include over estimating the loudspeaker states from the estimates, summing the estimates to form a worst case state estimate, assessing a group of damage models, diagnosing the condition, running a test, uploading one or more state estimates to a data center, or the like. The system may be configured to continue assessing the states, and/or characteristics during such a period to determine if the system has returned to a normal operating state.

In aspects, the feedback signal may be used within or in communication with the estimator to compare one or more speaker characteristics with those predicted by and/or associated with one or more of the models to determine the best fit to the actual device at any given period in time. In aspects, the estimator may include means for loading the best fit model into a real-time estimator block, for selecting between two or more "nearest" fit models, etc. Such a configuration may be advantageous for effectively forming a worst case excursion estimate while operating with very little computational overhead. In aspects, the selection process may be adaptive, may be performed within a cloud service (e.g., offloaded from a user device), etc.

In aspects, there is provided a method for tracking field operation of audio devices and/or maintaining suitable operation thereof throughout their intended lifetime, including periodically collecting feedback signals from a plurality of devices in the field, analyzing the feedback to compare each individual device against a master model set, and updating a device in the field based upon the feedback signal and/or the comparison. In aspects, such feedback signal collection may include collecting loudspeaker feedback (e.g., current, voltage, impedance characteristics, excursion levels, voice coil temperature, microphone feedback, histories thereof, etc.), device level feedback (e.g., acceleration, rotational movement, user settings, histories thereof, etc.), ambient feedback (e.g., temperature, humidity, altitude, local pressure, histories thereof, etc.). One or more of the collected signals may be used in the analysis or in comparison with the master model set, etc.

In aspects, a system in accordance with the present disclosure may include calculating a device characteristic such as impedance, resonant frequency, quality factor, resistance, etc. and monitor how that characteristic changes over time (e.g., as implemented as part of a specific test protocol, as part of a slow extraction algorithm, peak finding algorithm, or the like). In aspects, the system may be configured to periodically compare the measured characteristic with the characteristics of the model class (e.g., the plurality of representative models) to better pick a nearest estimator, which may then be used to (potentially gradually) update an estimator, which may be running all the time in parallel. In aspects, changes in the characteristic, changes in the selected model, etc. may be relayed to a data center (e.g., a cloud based data center, etc.) for feedback, product decision making, consideration of updates, etc.

In aspects, a system in accordance with the present disclosure may include an adjustable compressor configured to clamp the input signal or a signal generated there from, the compressor configured to adjust a degree of clamping based upon the estimated excursion, a system event (e.g., a jolt, a free-fall condition, an impact condition, change in an ambient parameter, etc.), a device input (e.g., acceleration, microphone measured audio output, etc.), an environmental input (e.g., a change in local pressure, etc.).

In aspects, the degree of signal compression may be influenced by an event, such as an impact, or a free fall condition (e.g., in anticipation of an impact). Upon detection of such a condition, the compressor may be configured to clamp the input signal or a signal generated therefrom before sending the clamped signal onwards toward the associated loudspeaker. In aspects, the clamping may be gradually released after to the event (baring an additional related event), so as to slowly bring the loudspeaker back to an optimal state of operation. In aspects, a related system may include functionality for testing the device post event, etc. in order to determine if any properties thereof have changed due to the event itself In aspects, an event may include receiving a free-fall condition from an associated accelerometer, receiving an impact condition (e.g., an impact of greater than 5G, greater than 10G, etc.). During as well as after such events, the system may be configured to clamp the loudspeaker output and gradually relax that compression, so as to suppress an unstable operating mode (e.g., such as a rocking mode, which may be excited during the event). In aspects, such events (e.g., free-fall, impact, etc.) may be relayed via the associated sensor itself, as an interrupt flag, etc. (e.g., as a "free-fall" related system interrupt, etc.).

In aspects, there is provided a method for testing a device to determine the appropriate excursion estimating models for implementation thereupon. The method may include capturing an input/output history during a period of operation (e.g., during a period of heavy usage, during a period of normal usage, during a self-diagnostic test, during music playback, etc.). The captured histories may be compared against master models for the device family to determine the most appropriate model sub-class for the device. In aspects, the test procedure may be used to select and/or enable one or more appropriate excursion models for predicting the excursion of a particular loudspeaker. In aspects, the test procedure may be performed remotely from the device (e.g., offloaded histories may be analyzed in a data center, a cloud service, etc.). In aspects, the procedure may include updating the master models, performing a device upgrade, etc.

In aspects, the master models may be constructed from manufacturing based sample testing, from virtualized testing wherein the tolerances (e.g., from the loudspeaker manufacturer's test data, characterization data, etc.) in one or more speaker parameters (e.g., force factor, compliance, and other Thiele-Small parameters, etc.) may be entered into an associated simulator (e.g., within a system characterization toolkit, etc.). Thus, a master model set may be constructed from a combination of limited real-world tests (e.g., from 10-100 production units, etc.), and a combination of statistical or measured tolerance ratings (e.g., from a loudspeaker manufacturer, from excursion and impedance curves) with the respective T.S. parameters for associated models. Thus, the simulator may be configured to vary one or more of the basic parameters within the tolerance limits and perform one or more (e.g., tens, thousands, etc.) of virtual measurements following the behavior of the real measured production units.

In aspects, the test procedure may include one or more system and/or loudspeaker nonlinearities. For example, and without limitation, in the test procedure, the compressor nonlinearities could be considered (e.g., estimator outputs could be run through the compressor to get more accurate values). So as to provide more accurate sub-class estimates for a particular device in the field, etc.

In aspects, there is provided a cloud service configured to collect input/output histories, and/or configuration data from one or more devices in the field (e.g., post purchase), during a routine update check, etc. In aspects, the cloud service may be configured to generate one or more device characteristics (e.g., impedance curves, speaker parameters, etc.), and compare the obtained information with one or more metrics (e.g., characteristics related to device failures, lifetimes, aging criteria, groups of failure prone devices, etc.) so as to improve estimation models (e.g., sent to the devices as updates, etc.), to categorize a particular device in terms of aging, predicting lifetime, classifying failure types, predicting failure types, classifying user types (e.g., heavy, light users, etc.), combinations thereof, or the like.

In aspects, such information may be used to determine how device characteristics change over time (e.g., how speaker compliance, resonant modes, etc. age with use), and may be used as part of a field update process in order to counteract impending failures (e.g., predict based on the collected data, which devices are likely to fail in the field and alter the estimators or clamping parameters associated therewith in order to circumvent failure, extend device lifetimes, etc.).

FIG. 1 shows a schematic of a nonlinear control system in accordance with the present disclosure. The nonlinear control system includes a controller 10 configured to accept an input signal 1 from an audio source (not explicitly shown) and one or more states 35. The system may include a model and/or observer 30 (referred to herein as model 30 for the sake of discussion), configured to generate the states 35. The controller 10 may generate one or more control signals 15 to drive an associated audio system 20. The control signals 15 may be fed to the model 30 for inclusion into the estimation of the states 35. The audio system 20 may produce one or more feedback signals 25, which may be directed to the model 30 for use in generating the states 35.

In aspects, the controller 10 may be configured to produce a system feedback signal 12 for delivery to one or more related systems such as a power management system (not explicitly shown). In aspects, the system feedback signal 12 may be a prediction of future power usage by the audio system 20. Such a system feedback signal 12 may be used by one or more related systems (e.g., a power management system) to control power distribution, to balance power among other system components, etc.

The controller 10 may include a control strategy based upon one or more of adaptive control, hierarchical control, neural networks, Bayesian probability, backstepping, Lyapunov redesign, H-infinity, deadbeat control, fractional-order control, model predictive control, nonlinear damping, state space control, fuzzy logic, machine learning, evolutionary computation, genetic algorithms, optimal control, model predictive control, linear quadratic control, robust control processes, stochastic control, combinations thereof, and the like. The controller 10 may include a full non-linear control strategy (e.g., a sliding mode, bang-bang, BIBO strategy, etc.), as a linear control strategy, or a combination thereof. In one non-limiting example, the controller 10 may be configured in a fully feed-forward approach (e.g., as an exact input-output linearization controller). Alternatively, additionally or in combination, one or more aspects of the controller 10 may include a feed-back controller (e.g., a nonlinear feedback controller, a linear feedback controller, a PID controller, etc.), a feed-forward controller, combinations thereof, or the like.

A controller 10 in accordance with the present disclosure may include a band selection filter (e.g., a bandpass, low pass filter, one or more digital biquad filters, etc.) configured so as to modify the input signal 1 to produce a modified input signal (e.g., an input signal with limited spectral content, spectral content relevant to the nonlinear control system only, etc.). In one non-limiting example, the controller 10 may include a filter with a crossover positioned at approximately 60 Hz. The nonlinear control may be applied to the spectral content below the cross over while the rest of the signal may be sent elsewhere in the system, enter an equalizer, etc. The signals may be recombined before being directed towards the audio system 20. In a multi-rate example, the signals may be downsampled and upsampled accordingly, based on their spectral content and the harmonic content added by the nonlinear controller 10 during operation. Such a configuration may be advantageous for reducing the computational load on the control system during real-time operation.

The model 30 may include an observer and/or a state estimator. A state estimator (e.g., an exact linearization model, a feed forward model, one or more biquad filters, etc.) may be configured to estimate the states 35 for input to the controller 10. The state estimator may include a state space model in combination with an exact input-output linearization algorithm in order to achieve this function, among other approaches. One or more aspects of the model 30 may be based upon a physical model (e.g., a lumped parameter model, etc.). Alternatively, additionally, or in combination, one or more aspects of the model 30 may be based upon a general architecture (e.g., a black box model, a neural network, a fuzzy model, a Bayesian network, etc.). The model 30 may include one or more parametrically defined aspects that may be configured, calibrated, and/or adapted to better accommodate the specific requirements of the given application.

One or more model selection processes in accordance with the present disclosure may be used to configure, enable, and/or select one or more state estimator models and/or control system models for estimating the states 35, the system feedback signal 12, and/or the control signal 15. In aspects, the observer 30 may be configured to generate a state 35 or metric against which to compare a predicted value (e.g., an excursion prediction, an impedance prediction, a loudspeaker characteristic, etc.) so as to select a model, adapt a model, etc. for purposes of control and/or speaker protection.

The feedback signals 25 may be obtained from one or more aspects of the audio system 20. Some non-limiting examples of feedback signals 25 include one or more temperature measurements, impedance, drive current, drive voltage, drive power, one or more kinematic measurements (e.g., membrane or coil displacement, velocity, acceleration, air flow, etc.), sound pressure level measurement, local microphone feedback, ambient condition feedback (e.g., temperature, pressure, humidity, etc.), kinetic measurements (e.g., force at a mount, impact measurement, etc.), B-field measurement, combinations thereof, and the like.

The states 35 may be generally determined as input to the controller 10. In one non-limiting example, the states 35 may be transformed so as to reduce computational requirements and/or simplify calculation of one or more aspects of the system. In aspects, the states 35 may be used to configure, enable, and/or select one or more estimators within the controller 10.

The control signals 15 may be delivered to one or more aspects of the audio system 20 (e.g., to a driver included therein, to a loudspeaker included therein, etc.).

The model 30 may include an observer (e.g., a nonlinear observer, a sliding mode observer, a Kalman filter, an adaptive filter, a least means square adaptive filter, an augmented recursive least square filter, an extended Kalman filter, ensemble Kalman filter, high order extended Kalman filters, a dynamic Bayesian network, etc.). In one non-limiting example, the model 30 may be an unscented Kalman filter (UKF). The unscented Kalman filter may be configured to accept the feedback signal 25, the input signal 1, and/or the control signal 15. The unscented Kalman filter (UKF) 30 includes a deterministic sampling technique known as the unscented transform to pick a minimal set of sample points (e.g., sigma points) around the mean nonlinear function. The sigma points may be propagated through the non-linear functions, from which the mean and covariance of the estimates are recovered. The resulting filter may more accurately capture the true mean and covariance of the overall system being modeled. In addition, UKF do not require explicit calculation of Jacobians, which for complex functions may be challenging, especially on a resource limited device.

The UKF algorithm includes weight matrices that depend on the design variables α, β and κ. The variable a may be configured between between 0 and 1, β may be set equal to 2 (e.g., if the noise profile is roughly Gaussian), and κ is a scaling factor that may generally be set equal to zero or generally 3−n, where n is the number of states. Generally speaking, κ should be nonnegative to ensure the covariance matrix to be positive semi-definite. For purposes of discussion, λ is introduced and defined as:

$$\lambda=a^2(n+\kappa)-n \quad \text{Equation 1}$$

and the calculations of the weights are:

$$W_m^0=\lambda/(n+\lambda)$$

$$W_c^0=\lambda/(n+\lambda)+1-\alpha^2+\beta$$

$$W_m^i=1/(2(n+\lambda)),\ i=1, 2, \ldots, 2n$$

$$W_c^i=1/(2(n+\lambda)),\ i=1, 2, \ldots, 2n \quad \text{Equation 2}$$

which are assembled into:

$$W_m=[W_m^0\ W_m^1 \ldots W_m^{2n}]^T$$

$$W_c=[W_c^0\ W_c^1 \ldots W_c^{2n}]^T \quad \text{Equation 3}$$

The prediction step may be defined by a sigma-point vector:

$$X_{k-1}=[[m_{k-1} \ldots m_{k-1}]+\sqrt{n+\lambda}[\sqrt{P_{k-1}}-\sqrt{P_{k-1}}] \quad \text{Equation 4}$$

based on the prior mean, $m_{k-1}$, and covariance, $P_{k-1}$. The vector can be divided into single sigma points $W_{k-1}^j$ for j=1, 2, . . . , 2n+1. The points are then propagated through the non-linear function:

$$\hat{X}_k^j=f(\hat{X}_{k-1}^j,u_{k-1}) \quad \text{Equation 5}$$

By assembling all $\hat{X}_k^j$ as $$\hat{X}_k=[\hat{X}_k^1 \ldots \hat{X}_k^{2n+1}] \quad \text{Equation 6}$$

with the resulting mean and covariance predicted by:

$$\overline{m}_k=\hat{X}_kW_m$$

$$\overline{P}_k=\hat{X}_kW_c\hat{X}_k^T+Q \quad \text{Equation 7}$$

where the covariance of the process noise is denoted Q. The updated sigma points are given by:

$$\overline{X}_k=[\overline{m}_k \ldots \overline{m}_k]+\sqrt{n+\lambda}[\sqrt{P_k}-\sqrt{P_k}] \quad \text{Equation 8}$$

The resulting sigma points are then propagated through the measurement function:

$$\overline{Z}_k^j=h(\overline{X}_k^j) \quad \text{Equation 9}$$

and a corresponding Kalman filter gain is calculated:

$$S_k=\overline{Z}_kW_c\overline{Z}_k^T+R$$

$$C_k=\overline{X}_kW_c\overline{Z}_k^T,$$

$$K_k=C_kS_k^{-1} \quad \text{Equation 10}$$

The matrix R is the covariance matrix for the measurement noise. Finally, the estimated mean and covariance are updated according to:

$$P_k=\overline{P}_k-K_kS_kK_k^T$$

$$m_k+\overline{m}_k+K_k(Z_k-\overline{u}_k)$$

$$\overline{u}_k=Z_kW_m \quad \text{Equation 11}$$

In one non-limiting example, the unscented Kalman filter may be augmented (e.g., to form an augmented unscented Kalman filter [AUKF]). The AUKF includes an augmented state vector for the process and measurement noise calculation thus including non-symmetric sigma points. The AUKF may be advantageous for capturing odd-moment information during each filtering recursion.

Figure 2:
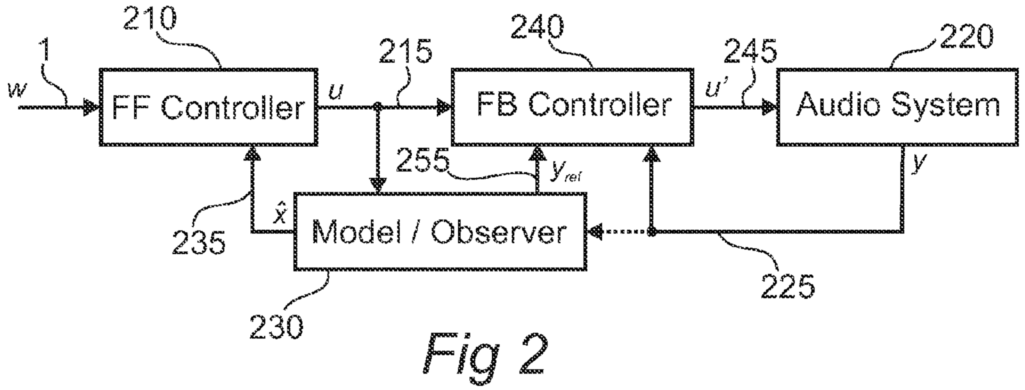
FIG. 2 shows a schematic of a nonlinear control system in accordance with the present disclosure.

FIG. 2 shows a schematic of aspects of a nonlinear control system in accordance with the present disclosure. The control system includes a feed-forward controller 210 configured to accept an audio input 1 and one or more states 235, and to produce one or more control signals 215. The control system also includes a feed-back controller 240 configured to accept one or more of the control signals 215, one or more feedback signals 225, and one or more reference signals 255 to produce an updated control signal 245. The control system may also include a model 230 in accordance with the present disclosure configured to accept one or more control inputs 215 and optionally one or more feedback signals 225, and to produce the states 235 and one or more reference signals 255. The model 230 may include a state estimator and/or an observer, configured to generate the states 235 and/or the reference signals 255. The reference signals 255 may be generated so as to provide a prediction of one or more of the intended feedback signals 225 for use in the feedback controller 240. The updated control signal 245 may be used to drive one or more components of an associated audio system 220 in accordance with the present disclosure. The audio system 220 may be configured to provide one or more feedback signals 225 for use by one or more aspects of the control system.

In aspects, the feed-forward controller 210 may be configured as a nonlinear exact input-output linearization controller while the feed-back controller 240 may be a state space controller (e.g., a P, PI, PD, PID controller, etc.). The feed-forward controller 210 may effectively linearize the system nonlinearities, thus providing a linear control signal 215 for input to the feedback controller 240. In aspects, a parametric system model may be derived, pertaining to the specific implementation of the nonlinear control system. The feed-forward controller may be directly derived from the parametric model so as to cancel the nonlinear aspects thereof in the overall signal pathway.

For purposes of discussion, a non-limiting example of a suitable feed forward control law is given in Equation 12:

$$u = \Big\{ Mv + \frac{x_2}{C_{ms}(x_1)}\Big(1 - \frac{x_1}{C_{ms}(x_1)} \cdot \frac{dC_{ms}(x_1)}{dx_1}\Big) + \frac{R_{ms}}{M}\Big(\frac{-x_1}{C_{ms}(x_1)} - R_{ms}x_2 + \Big(Bl(x_1) + \frac{1}{2} \cdot \frac{dL_e(x_1)}{dx_1}x_3\Big)x_3 + \frac{1}{2} \cdot \frac{dL_2(x_1)}{dx_1}\Big)x_4^2\Big) - x_2x_3\frac{dBl(x_1)}{dx_1} - \frac{1}{2}x_2x_3^2\frac{d^2L_e(x_1)}{dx_1^2} - \frac{1}{2}x_2x_4^2\frac{d^2L_2(x_1)}{dx_1^2}\Big(-\frac{x_4}{L_2(x_1)} \cdot \frac{dL_2(x_1)}{dx_1}\Big(R_2(x_1)x_3 - \Big(R_2(x_1) - x_2\frac{dL_2(x_1)}{dx_1}\Big)x_4\Big)\Big\} \cdot \left(\frac{L_e(x_1)}{Bl(x_1) + x_3\frac{dL_e(x_1)}{dx_1}}\right) + Bl(x_1)x_2 + x_2x_3\frac{dL_e(x_1)}{dx_1} + R_ex_3 + R_2x_3 - R_2x_4 \qquad \text{Equation 12}$$

Figure 5A:
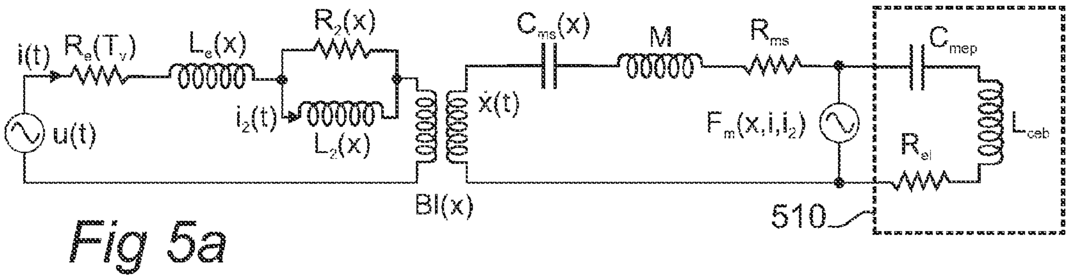
FIGS. 5*a-b* show non-limiting examples of nonlinear models representing one or more aspects of an audio system in accordance with the present disclosure.

Equation 12 demonstrates a parametrically defined control law based upon the loudspeaker model shown in FIG. 5*a*. The states 235 are represented in the equation as $x_1, \ldots, x_4$. The control law is of lower order than the states, thus a transformation may be used to accommodate any zero dynamics associated with this condition.

The states may be provided by a state estimator, included in the model 230. The state estimator algorithm would be a counterpart to equation 12.

In aspects, the states may also be provided by an observer in accordance with the present disclosure. Continuing with the specific example herein, a Kalman filter based observer may be derived by applying equations 1-11 to this specific example. In the case of an augmented unscented Kalman filter (AUKF), an augmented state vector may be included, such as shown below in equation 13:

$$x_a = [x^T W^T V^T]^T \qquad \text{Equation 13}$$

where x is the state vector, W is a vector containing the noise variables, and V is a vector containing the measurement noise variables.

The unscented Kalman filter (UKF) is founded on the intuition that it is easier to approximate a probability distribution than it is to approximate an arbitrary nonlinear function or transformation. The unscented Kalman filter (UKF) is a way of estimating the state variables of a nonlinear system by calculating the mean. It belongs to a bigger class of filters called Sigma-Point Kalman filters which make use of statistical linearization techniques. It uses the unscented transform which is a method for statistically calculating a stochastic variable which goes through a nonlinear transformation. The non-augmented UKF, which assumes additive noise, uses the unscented transformation to make a Gaussian approximation to the nonlinear problem given as $$x_k = f(x_{k-1}, k-1) + q_{k-1}$$

$$y_k = h(x_k, k) + r_k \qquad \text{Equation 14}$$

where $x_k$ is the state vector, $y_k$ is the measurement vector, $q_{k-1}$ is the process noise and $r_k$ is measurement noise defined as:

$$x_k \in \mathbb{R}^n$$

$$y_k \in \mathbb{R}^m$$

$$q_{k-1} \sim N(0, Q_{k-1})$$

$$r_k \sim N(0, R_k) \qquad \text{Equation 15}$$

Similar to the Kalman filter, the UKF consists of two steps, prediction and update. Unlike the Kalman filter though, the UKF makes use of so called sigma points, which are used to better capture the distribution of x. The mean values of that distribution will here be indicated as m. The sigma points X are then propagated through the nonlinear function f and the moments of the transformed variable estimated.

For the non-augmented UKF a set of 2n+1 of sigma points is used, where n is the order of the states. Before going through the prediction and update steps the associated weight matrices $W_m$ and $W_c$ need to be defined. This is done as follows:

$$W_m^{(0)} = \lambda/(n+\lambda)$$

$$W_c^{(0)} = \lambda/(n+\lambda) + (1-\alpha^2+\beta)$$

$$W_m^{(i)} = 1/\{2(n+\lambda)\},\ i=1, \ldots, 2n$$

$$W_c^{(i)} = 1/\{2(n+\lambda)\},\ i=1, \ldots, 2n$$

$$W_m^{(0)} \ldots W_{m(i)} \text{ and } W_c^{(0)} \ldots W_c^{(i)} \qquad \text{Equation 16}$$

where W are column vectors for the weight matrices.

The scaling parameter λ is defined as:

$$\lambda = \alpha^2(n+\kappa) - n \qquad \text{Equation 17}$$

where α, β and κ are positive constants which can be used to tune the UKF by modifying the associated weighting matrices. The prediction and update steps can now be computed as follows:

Prediction: The prediction step computes the predicted state mean $m_k^-$ and the predicted co-variance $P_k^-$ by calculating the sigma points $X_{k-1}$.

$$X_{k-1} = [m_{k-1} \ldots m_{k-1}] + \sqrt{c}[0\sqrt{P_{k-1}} - \sqrt{P_{k-1}}]$$

$$\hat{X}_k = f(X_{k-1}, k-1)$$

$$m_k^- = X_k W_m$$

$$P_k^- = \hat{X}_k W_c [\hat{X}_k]^T + Q_{k-1} \qquad \text{Equation 18}$$

Update: The update step computes the predicted mean $\mu_k$, measurement covariance $S_k$ and the measurement and state cross-covariance $C_k$:

$$X_k^- = [m_k^- \ldots m_k^-] + \sqrt{c}[0\sqrt{P_k^-} - \sqrt{P_k^-}]$$

$$\hat{Y}_k^- = f(X_k^-, k)$$

$$\mu_k^- = Y_k^- W_m$$

$$S_k = Y_k^- W_c [Y_k^-]^T + R_k$$

$$C_k = X_k^- W_c [Y_k^-]^T \qquad \text{Equation 19}$$

The filter gain $K_k$, the updated state mean $m_k$ and the covariance $P_k$ are computed according to:

$$K_k=C_kS_k^{-1}$$

$$m_k=m_k^{-}+K_k[y_k-\mu_k]$$

$$P_k=P_k^{-}-K_kS_kK_k^{T} \qquad \text{Equation 20}$$

Initial values for the mean m and the covariance P need to be chosen for the first run. Afterwards, the algorithm can simply be run iteratively.

The feed-back controller 240 may be configured in accordance with the present disclosure. In aspects, the feed-back controller 240 may be configured to modify the control signal 215 in order to minimize the error between the reference signal 255 and the feedback signal 225. One such non-limiting example of a suitable feed-back controller 240 may be a PID controller. The PID controller may be configured and/or optimized by a known scheme (e.g., brute-force iteration while measuring speaker THD, or the like).

In aspects, the feedback signal may be a current signal and the reference signal may be a current signal as approximated by the feed forward controller, state estimator, or an equivalent observer.

FIG. 3*a-e* show aspects of components of a nonlinear control system in accordance with the present disclosure.

Figure 3A:
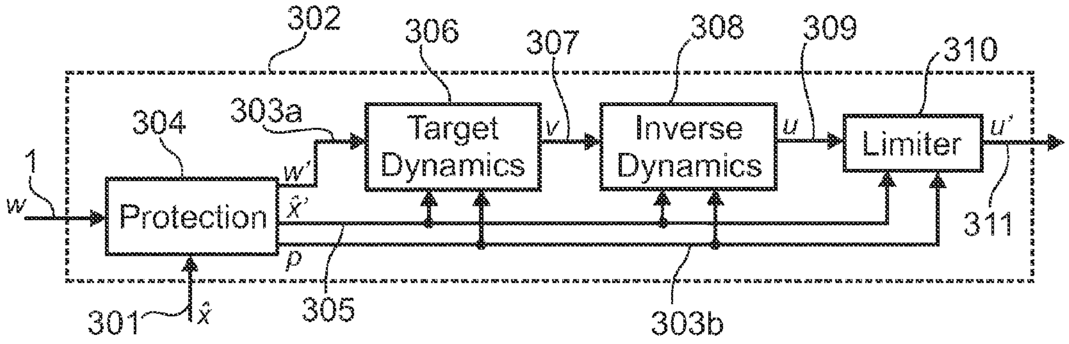

FIG. 3*a* shows aspects of a feed-forward controller 302 in accordance with the present disclosure. The feed-forward controller 302 may be configured to accept an input signal 1 and a state vector 301 and generate one or more control signals 311. In a basic configuration, the feed-forward controller 302 may include a target dynamics block 306 configured to accept the input signal 1 or a signal derived therefrom (e.g., a modified input signal 303*a*), and a state vector 301 or signal derived therefrom (e.g., a modified state vector 305), and optionally a flag 303*b* (e.g., a signal generated by one or more components of the control system), and generate a targeted output signal 307. The target dynamics block 306 may be configured so as to provide a desired transformation for the input signal 1 (e.g., an equalizer function, a compressor function, a linear inverse dynamic function, additional added harmonics, etc.).

The controller 302 may include an inverse dynamics block 308 configured to compensate for one or more nonlinear aspects of the audio system (e.g., one or more nonlinearities associated with the loudspeaker, the driver, the enclosure, etc.). The inverse dynamics block 308 may be configured to accept the targeted output signal 307, a state vector 301 or signal derived therefrom (e.g., a modified state vector 305), and optionally a flag 303*b* (e.g., a signal generated by one or more components of the control system), and generate one or more initial control signals 309. The inverse dynamics block 308 may be configured based on a black or grey box model, or equivalently from a parametric model (such as the lumped parameter model outlined herein). Thus, the system may include a pure "black-box" modeling approach (e.g., a model with no physical basis, but rather a pure input-to-output behavior mapping that can then be compensated for). In some instances, a physically targeted model may reduce the computational load on the nonlinear control system.

The controller 302 (e.g., a non-limiting implementation of a controller 10, a feed-forward controller 210, etc.) may include a protection block 304, configured to accept one or more input signals 1 and one or more states 301 and optionally produce one or more modified input signals 303*a*, modified states 305, and/or a flag 303*b*. The protection block 304 may be configured to compare one or more aspects of the input signal 1, the state vector 301 or one or more signals generated therefrom (e.g., an input power signal, a state power signal, a thermal state, cone excursion, a thermal dynamic, a thermal approach vector, etc.). The protection block 304 may compare such information against a performance limitation criteria (e.g., a thermal model, an excursion limitation, a power consumption limitation of the associated device [e.g., a configurable criteria], etc.) to determine how close the operating condition of the audio system is to a limit, the rate at which the operating state is approaching a limit (e.g., a thermal limit), etc.

Such functionality may be advantageous for generating a look-ahead trajectory for smoothly transitioning system gain, performance aspects, etc. so as to remain within the limitation criteria as well as reduce the probability of introducing audio artifacts based when applying limits to the system.

The protection block 304 may generate such information in terms of a flag 303*b* (e.g., a warning flag, a problem flag, etc.), the flag 303*b* configured so as to indicate a level of severity to one or more aspects of the control system, to assist with parametrically limiting the output of one or more aspect of the control system, etc. Alternatively, additionally, or in combination, the protection block 304 may directly augment the input signal 1, the states 301, so as to generate a modified input signal 303*a* or a modified state vector 305, so as to provide the protection aspect without addition computational complexity to other aspects of the control system.

The controller 302 may include a compressor and/or a limiter 310 configured to accept the initial control signal 309, one or more states 301 or signals generated therefrom (e.g., a modified state vector 305), or the flag 303*b*. The limiter 310 may be configured to limit the initial control signal 309 based on one or more aspects of the states 305, the initial control signal 309, the flag 303*b*, combinations thereof, and the like. The limiter 310 may be configured to generate a limited control signal 311 for use by one or more components in the control system. In aspects, the limiter 310 may be a compressor, with a limit configured based upon a predetermined criteria and/or the flag 303*b*. In aspects, the flag 303*b* may be provided by or derived from an external processor (e.g., a system power manager, etc.), so as to provide a constraint upon which the limiter 310 may function.

FIG. 3*b* shows a non-limiting example of an audio system 20 (e.g., 220, etc.) in accordance with the present disclosure. The audio system 20 may include one or more transducers 318 (e.g., loudspeakers, actuator, etc.). The term transducer 318 is meant to include, without limitation, a component or device such as a loudspeaker suitable for producing sound (e.g., an audio signal 321). A transducer 318 may be based on one of many different technologies such as electromagnetic, thermoacoustic, electrostatic, magnetostrictive, ribbon, audio arrays, electroactive materials, and the like. Transducers 318 based on different technologies may require alternative driver characteristics, matching or filtering circuits but such aspects are not meant to alter the scope of this disclosure.

The audio system 20 may include a transducer module 332, which may further include a transducer 318 and a circuit 316. The circuit 316 may provide additional functionality (e.g., power amplification, energy conversion, filtering, energy storage, etc.) to enable a driver 314 external to the transducer module 332 to drive the transducer 318. Some non-limiting examples of the circuit 316 (e.g., a passive filter circuit, an amplifier, a de-multiplexer, a switch array, a serial communication circuit, a parallel communication circuit, a FIFO communication circuit, a charge accumulator circuit, etc.) are described throughout the present disclosure.

The circuit 316 may be configured with one or more sensory functions, configured so as to produce a loudspeaker feedback 319. The loudspeaker feedback 319 may include a current signal, a voltage signal, an excursion signal, a kinetic signal, a cone reflection signal (e.g., an optical signal directed at the cone of the loudspeaker), a pressure sensor, a magnetic signal sensor (e.g., a field strength measurement, a field vector, etc.), combinations thereof, and the like. The loudspeaker feedback signal 319 may be configured for use by one or more components in the control system.

The driver(s) 314 may be half bridge, full bridge configurations, and may accept one or more PWM signals to drive either the corresponding high and low side drivers. The driver(s) 314 may include a class D amplifier, a balanced class D amplifier, a class K amplifier, or the like. The driver(s) 314 may include a feedback circuit for determining a current flow, voltage, etc. delivered to the transducer(s) during use. The amplifier may include a feedback loop, optionally configured to reduce one or more nonlinearities in one or more transducers 318 and/or the electrical components in the system.

The driver 314 may include one or more sensory circuits to generate a driver feedback signal 317. The driver feedback signal 317 may include a power signal, a current signal, an impedance measurement (e.g., a spectral measurement, a low frequency measurement, etc.), a voltage signal, a charge, a field strength measurement, an aspect of a drive signal 315, or the like.

In aspects, the driver 314 may be configured to monitor one or more aspects of the impedance of an associated loudspeaker 318. The impedance may be measured so as to establish a substantially DC impedance (e.g., the loudspeaker impedance as measured in subsonic spectrum) measurement of the loudspeaker, which may be at least partially indicative of a characteristic temperature of the loudspeaker coil. The impedance may be measured in combination with a current sensing resistor, in combination with a measurement of the voltage applied to the loudspeaker.

In aspects, pertaining to a driver 314 implementation with a class-D amplifier, the loudspeaker impedance may be calculated from the output current of the class-D amplifier. The current may be pulsed along with the ON-OFF cycles associated with the amplifier. Thus, a relevant current signal may be obtained by low pass filtering the output current. The filter may be configured so as to obtain one or more spectral components of the current signal. In one non-limiting example, the impedance spectrum may be assessed in order to determine the frequency of the first resonant mode of the loudspeaker, and/or the impedance at the peak of the first resonant frequency. As the impedance or associated frequency of the first resonant peak may change in association with the excursion of the coil and/or the temperature of the coil. A comparison of the impedance measured at the resonant peak with that of in the sub-sonic spectrum may be employed to extract substantially independent measurements of the excursion and the coil temperature during use.

The impedance of the loudspeaker may be measured at the driver 314, for use in matching one or more control parameters, or model parameters to the physical system of the immediate example (e.g., the impedance may be used during optimization of one or more aspects of the model 30).

In aspects, at least a portion of the observer may be configured so as to capture and/or track the first resonant peak of the loudspeaker. The observer may include one or more algorithms (e.g., a frequency tracking algorithm based on an unscented Kalman filter, AUKF, etc.) configured to extract the first resonant peak from one or more aspects of the control signal 15 and/or the feedback signal 25. Additionally, alternatively, or in combination, the algorithm may be configured to calculate a loudspeaker impedance parameter at the fundamental resonant peak. Such an algorithm may be advantageous for performing such frequency extraction and/or impedance measurement in real-time amongst a general audio stream (e.g., during streaming of music, voice, etc.). With such information available, one or more controllers in the nonlinear control system may be configured to compensate for the resonant peak during operation. Such action may be advantageous to dramatically increase drive capability of the associated loudspeaker without the need to impart mechanically damped solutions to the problem (e.g., by directly compensating, a high efficiency solution may be attained).

The audio system 20 may include one or more microphones 324, 326 configured to monitor one or more aspects of the audio signal 321 during use. One or more of the microphones may be hardwired to the system 323 (e.g., a microphone located on the associated consumer electronics device). Such a microphone 324 may be advantageous for capturing one or more aspects of the sound propagation in the vicinity of the loudspeaker, associated with the loudspeaker enclosure, the device body, etc.

In aspects, the audio system 20 may include or be coupled to a wirelessly connected microphone 326 (e.g., connected via a wireless link 325, 328, 330, 327), which may be connected to an associated consumer electronics device, in the vicinity of the control system, on a manufacturing configuration (as part of a manufacturing-based calibration system, etc.). The wirelessly connected microphone 326 may be advantageous for capturing one or more aspects of sound propagation in the environment around the loudspeaker, with directional aspects of sound propagation from the loudspeaker, etc.

In aspects, the audio system 20 may include a loudspeaker 318. In another non-limiting example, the audio system 20 may include a driver 314 and a loudspeaker 318.

The audio system 20 may include one or more device sensors 322 which may be configured to capture one or more ambient and/or kinematic aspects of the usage environment, orientation with respect to a user (e.g., handheld, held to the head, etc.) and provide such sensor feedback 329 to one or more components of the system. Some non-limiting examples of suitable device sensors 322 include ambient temperature sensors, pressure sensors, humidity sensors, magnetometers, proximity sensors, etc. In aspects, the ambient temperature may be measured by a temperature sensor (e.g., a device sensor 322). Sensory feedback 329 from, for example, ambient temperature may be employed by one or more components in the control system as part of a protection algorithm, as input to one or more aspects of a thermal model, etc.

The audio system 20 may include a feedback coordinator 320 configured to accept signals from one or more components of the audio system 20 (e.g., driver 314, transducer module 332, circuit 316, transducer 318, microphones 324, 326, device sensors 322) and generate one or more feedback signals 25. The feedback coordinator 320 may include one or more signal conditioning algorithms, sensor fusion algorithms, algorithms for generating one or metrics from one or more sensor signals, extracting one or more spectral components from the signals, etc.

FIG. 3*c* shows a model 30*a* in accordance with the present disclosure. The model 30*a* includes a state estimator 336 in accordance with the present disclosure and optionally an output estimator 334. The state estimator 336 may be configured to accept one or more control signals 15 and generate one or more state vectors 35. The output estimator 334 may accept one or more states 35 and generate one or more reference signals 302. The reference signals 302 may be produced for purposes of comparison by one or more controllers in the control system, for feedback to a protection system, etc. The output estimator 334 may include a transfer function, a nonlinear transfer function, a state based estimator, etc. In aspects, the model 30*a* may be processed in a block based manner (e.g., simultaneously calculating output samples from groups of input samples), suitable for implementation in a callback based service (e.g., on a smartphone operating system, etc.). Such a system may be advantageous to predict future states of the loudspeakers without the need for intense sample-to-sample computational efforts.

FIG. 3*d* shows a model 30*b* in accordance with the present disclosure. The model 30*b* includes an observer 340 in accordance with the present disclosure and optionally an output estimator 338. The observer 340 may be configured to accept one or more control signals 215, and one or more feedback signals 225, and generate one or more state vectors 235. The output estimator 338 may accept one or more states 235 and generate one or more reference signals 255. The reference signals 255 may be produced for purposes of comparison by one or more controllers in the control system, for feedback to a protection system, etc. The output estimator 338 may include a transfer function, a nonlinear transfer function, a state based estimator, etc.

In aspects, the observer 340 may include an augmented unscented Kalman filter for extracting the states from the control signals 215 and the feedback signals 225.

FIG. 3*e* shows aspects of a feedback controller 342 in accordance with the present disclosure. The feedback controller 342 includes a control block 344 (e.g., a nonlinear control law, a PID controller, etc.) in accordance with the present disclosure, and optionally a signal conditioner 346. The feedback controller 305 may be configured to accept one or more feedback signals 225 and compare the feedback signals 225 or signals generated therefrom (e.g., a conditioned feedback signal 345) with one or more reference signals 255 (e.g., as generated by one or more components in the control system). The compared signal is provided to the control block 344 where suitable gain is added to the signal to force the feedback signal 225 towards the reference signal 255. The resulting control signal 347 may be added to the initial control signal 215 (e.g., as produced by one or more control components of the control system) to produce a modified control signal 245 in accordance with the present disclosure.

Figure 4:
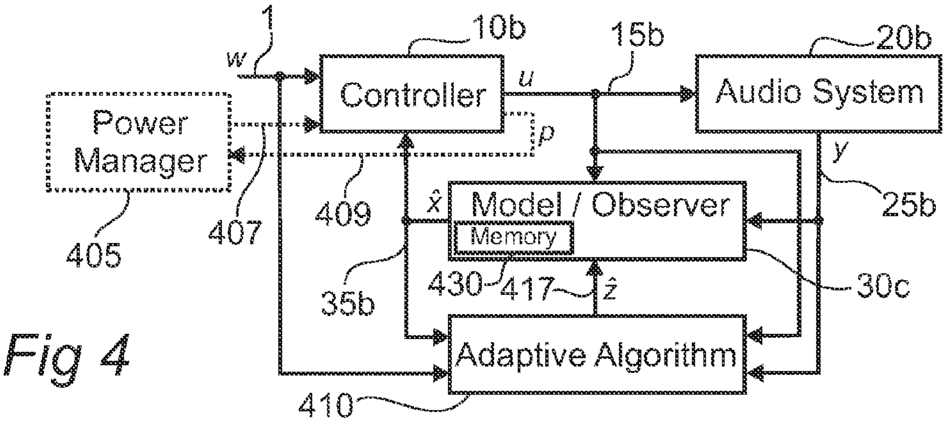
FIG. 4 shows a schematic of an adaptive nonlinear control system in accordance with the present disclosure.

FIG. 4 shows a schematic of aspects of an adaptive nonlinear control system in accordance with the present disclosure. The adaptive nonlinear control system includes a controller 10*b* according to the present disclosure configured to accept one or more signals 1 and one or more states 35*b* or signals generated therefrom. The adaptive nonlinear control system includes a model 30*c* in accordance with the present disclosure. The model 30*c* may be configured to accept one or control signals 15*b*, one or more feedback signals 25*b*, and/or one or more adapted parameters 417. The model 30*c* may include a model and/or observer including one or more weighting parameters, parametric parameters, coefficients, or the like. The parameters may be stored locally in a memory block 430, or otherwise integrated into the structure of the model 30*c*. The parameters may be at least partially dependent upon the adapted parameters 417. The adaptive nonlinear control system includes an adaptive block 410 configured to accept one or more feedback signals 25*b*, one or more control signals 15*b*, one or more input signals 1, one or more states 35*b*, each in accordance with the present disclosure, and generate one or more of the adapted parameters 417.

The adaptive block 410 may be configured to alter the adapted parameters 417 during predetermined tests, during casual operation of the nonlinear control system, at predetermined times during media streaming, as one or more components of the operating system change, as operating conditions change, as one or more key operational aspects (e.g., operating temperature) changes, etc. The adaptive block 410 may include one or more aspects configured to assess the "goodness of fit" of the current model 30*c*. Upon determination that the fit is insufficient, the adaptive block 410 may perform one or more operations to correct the model 30*c* accordingly (e.g., adjust a model parameter, select a model and/or parameters or coefficients from a model class, enable one or more models, load one or more models, etc.).

The adaptive block 410 may include one or more adaptive and/or learning algorithms. In aspects, the adaptive algorithm may include an augmented unscented Kalman filter. In aspects, a least squares optimization algorithm may be implemented to iteratively update the adapted parameters 417 between tests, as operating conditions change, as one or more key operational aspects (e.g., operating temperature) changes, etc. Other, non-limiting examples of optimization techniques and/or learning algorithms include non-linear least squares, L2 norm, averaged one-dependence estimators (AODE), Kalman filters, unscented Kalman filters, Markov models, back propagation artificial neural networks, Bayesian networks, basis functions, support vector machines, k-nearest neighbors algorithms, case-based reasoning, decision trees, Gaussian process regression, information fuzzy networks, regression analysis, self-organizing maps, logistic regression, time series models such as auto regression models, moving average models, autoregressive integrated moving average models, classification and regression trees, multivariate adaptive regression splines, and the like.

In aspects, the adaptive nonlinear control system may include or be coupled to a power management system 405. The power management system 405 may be configured to deliver a power constraint 407 to the controller 10*b*, representative of a power level within which the controller 10*b* must operate during use. In aspects, the model 30*c* and/or controller 10*b* may be configured to generate one or more power predictions 409 for comparison with the power constraint 407, for use in throttling the controller 10*b* in aspects where near-term power requirements may exceed available resource levels. In aspects, the power prediction 409 may be delivered to the power manager 405 during use, where the power manager is configured to adjust system level power commitments based at least in part on the power prediction 409.

Figure 5B:
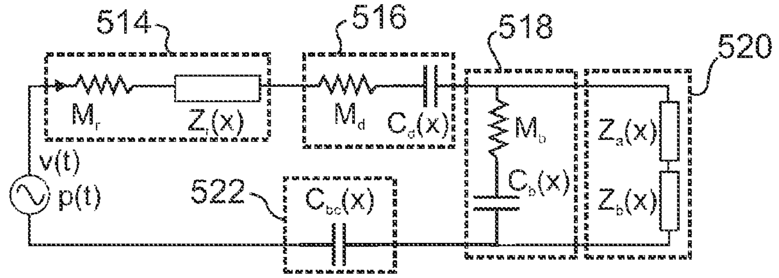

FIGS. 5*a-b* show nonlinear models to analyze one or more aspects of an audio system in accordance with the present disclosure. For purposes of discussion, lumped parameter models are discussed herein, in order to highlight one or more aspects or relationships therebetween. For purposes of discussion, the non-limiting example shown in FIG. 5*a* represents a transducer based upon a moving coil loudspeaker and an associated enclosure and driver. Various aspects of the model are discussed herein.

In the small signal model shown in FIG. 5*a*, the enclosure dynamics 510 are represented by a RLC circuit, $R_{el}$, $C_{mep}$, and $L_{ceb}$. In aspects, the enclosure dynamics 510 may change from part to part during production (e.g. due to part-to-part variation in component placement, enclosure seal quality, etc.), and are highly dependent on enclosure leakage, free space within the enclosure (e.g. significant if the enclosure is shared with the overall CED, etc.), shape of the enclosure, etc. The loudspeaker model shown in FIG. 5*a* includes spatially dependent parametrically defined lumped parameter aspects of physically identifiable components within the system. Relevant nonlinearities are introduced via spatially dependent parameters in the lumped parameter equations. Thermal dependence may be added to accommodate for changing compliances, offsets, magnetic properties, etc. The model as shown extends upon the theoretically accepted small displacement model proposed by Thiele and Small. The model shown in FIG. 5*a* describes the eddy currents that occur at higher frequencies, with greater accuracy than models proposed by Thiele and Small.

The terminal voltage may be given by u(t), driver current by i(t) and coil displacement by x(t). The parameters Re, Bl(x), Cms(x), and Le(x) are dependent upon the coil displacement as well as the voice coil temperature. The impedances represented by R2(x) and L2(x) may also be non-linear and of similar character to Le(x) but are generally influenced by different spectral aspects of the system (generally demonstrate significant nonlinearities in the higher frequency spectrum). In some simplifications, the functions R2 and L2 may be considered constant. The functions Bl(x), Cms(x) and Le(x) may be determined by a range of methods for the loudspeaker associated with a particular application. In general, the nonlinearities may be represented by temperature dependent polynomials, targeted functional representations or the like. For purposes of discussion, the functions Bl(x), Cms(x) and Le(x) were fitted using a known experimental method at room temperature.

For purposes of discussion, each of the functions were fitted to experimental data using polynomial functions. More realistic function fits may be implemented in order to maintain goodness of fit outside of the physically relevant range. Such extended goodness of fit may improve observer stability, adaptive algorithm stability, etc. in that such systems may temporarily extend into unrealistic conditions during the optimization and/or tracking process.

Many of the parameters may be temperature dependent. Some examples that are known to be affected by the voice coil temperature when working in the large signal domain are considered to be Re, Bl(x), Cms(x) and Le(x).

The proposed equations may be put together into a general state-space form given by equation 21:

Equation 21

$$\dot{x} = \begin{bmatrix} 0 & 1 & 0 & 0 \\ \frac{-1}{MC_{ms}(x_1)} & \frac{-R_{ms}}{M} & \frac{Bl(x_1) + \frac{1}{2}\frac{dL_e(x_1)}{dx_1}x_3}{M} & \frac{\frac{1}{2}\frac{dL_2(x_1)}{dx_1}x_4}{M} \\ 0 & \frac{-Bl(x_1) - \frac{dL_e(x_1)}{dx_1}x_3}{L_e(x_1)} & \frac{-R_e(T_v) - R_2(x_1)}{L_e(x_1)} & \frac{R_2(x_1)}{L_e(x_3)} \\ 0 & 0 & \frac{R_2(x_1)}{L_2(x_1)} & \frac{-R_2(x_1) - \frac{dL_2(x_1)}{dx_1}x_2}{L_2(x_1)} \end{bmatrix} x + \begin{bmatrix} 0 \\ 0 \\ \frac{1}{L_e(x_1)} \\ 0 \end{bmatrix} u$$

The force factor Bl(x) may be represented with a maximum value when the coil displacement is near the resting value (zero). Alternative fitting functions may be employed to ensure all force factor values maintain are realistic.

The suspension compliance Cms(x) varies with temperature and may be subject to a range of nonlinear hysteretic effects as discussed herein.

The suspension impedance will increase when the cone leaves the equilibrium position, hence Cms(x) may be reduced outside the equilibrium. Thus the compliance and the force factor may share many of the same characteristics. In one non-limiting example, a suspension compliance function using Gaussian sums may be fitted to the experimental data for use in the nonlinear control system.

The voice coil inductance Le(x), may have significant displacement dependency but does not generally share characteristics with the force factor and the suspension compliance. Generally speaking, the inductance will increase when the voice coil moves inwards and decrease when it moves outwards. This may be due to the magnetic field created by the current passing through the voice-coil. This function may further experience one or more hysteretic aspects discussed herein. In one non-limiting example, the voice coil inductance may be fitted to experimental data using a series of Gaussian sums.

In aspects, the loudspeaker characteristics may be at least partially identified by monitoring the impedance thereof during a series of test procedures. Depending on the spectrum and amplitude of the input control signals, it may be possible to analyze the speaker over a range of different frequencies.

In some instances, it may be advantageous to determine the effect of the driver(s) on performance of the system. Depending on the driver architecture, the driver may not be capable of delivering a DC current for example to the loudspeaker. Thus an associated nonlinear model may include an amplifier model, modeled as a high-pass filter. Nonlinear aspects may be added in order to improve the accuracy of the model.

FIG. 5*b* shows a lumped parameter model for a microelectromechanical (MEMs) based transducer. The MEMs transducer may be part of a transducer array. The MEMs transducer functions based on electrostatic forces between closely placed electrodes (attached to a related diaphragm and backplate) in the structure of the transducer (e.g., generally across a narrow air gap). The MEMs transducer may be complicated by various nonlinear phenomena including "pull-in" nonlinearities (and potential instabilities therein), nonlinear flow dynamics, and nonlinear damping characteristics. A model based on these phenomena may be included in a nonlinear control system associated with the performance enhancement of such devices.

The model shown in FIG. 5*b* highlights some features such as the acoustic radiation effects 514, the diaphragm dynamics 516 (e.g., including the nonlinearities associated with the gap capacitance), the backplate dynamics 518, airflow dynamics 520 through the air gap, and the acoustic properties of the back chamber 522. In this example, some of the equations may include significant humidity dependence along with spatial and temperature based dependence.

Such MEMs transducers may be designed as components in micropump systems, thus a control system as described herein may be applied to precision improvement and linearization of such associated micropumps.

Figure 6:
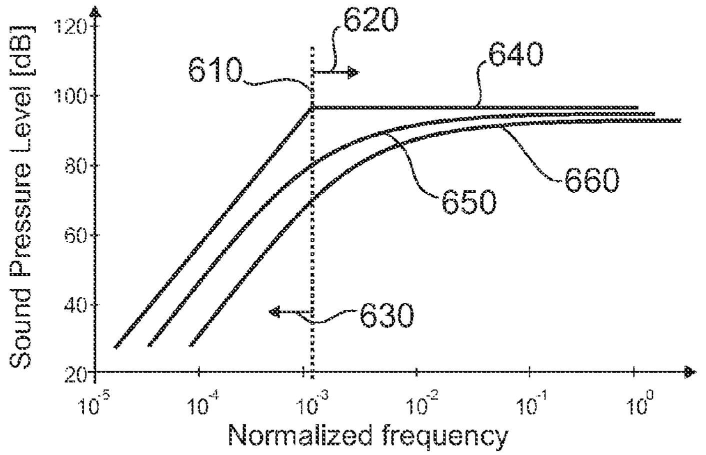
FIG. 6 shows a graphical description of a protection algorithm for use in a nonlinear control system in accordance with the present disclosure.

FIG. 6 shows a graphical description of a protection algorithm for use in a nonlinear control system in accordance with the present disclosure. The graph shows a protection envelop 640 as a function of frequency. The envelope 640 may be designated to protect the audio system from different types of damage depending upon the frequency content of the associated control signals. Dividing line 610 generally indicates a transition between a high frequency domain dominated by thermal failure characteristics (designated by the arrow 620) and a low frequency domain whereby the loudspeaker performance may be more likely dominated by excursion limitations (indicated by arrow 630). As the states are monitored or estimated within the nonlinear control system, a combination of the excursion, input spectrum, temperature, and/or power related aspects may be used to determine the operating point within the allowable space. A series of functions may be defined (e.g., represented graphically here by 650 and 660), whereby unconstrained operation below 660 may be prescribed, and smoothly limited performance may be enforced (e.g., by a compressor and/or protection block) as the operating points begin to approach the operating limits 640.

In aspects, the system may include a look-ahead algorithm to predict movement of the operating point within such a domain, which may be based upon a related thermal model, and/or via analysis of the streaming media signal. Such look-ahead algorithms may be used to smoothly limit performance of the control system while avoiding performance glitches and pops, which may occur during rapid changes in controller gain, etc.

FIGS. 7*a-d* show aspects of multi-rate nonlinear control systems in accordance with the present disclosure.

Figure 7A:
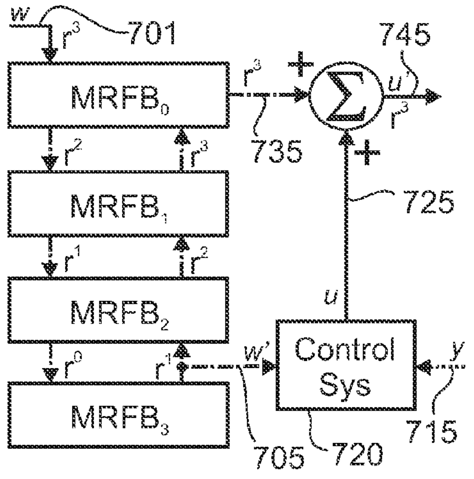
FIGS. 7*a-d* show aspects of non-limiting examples of multi-rate nonlinear control systems in accordance with the present disclosure.

FIG. 7*a* shows aspects of a multi-rate filter system including a nonlinear control system in accordance with the present disclosure. The multi-rate filter system includes a plurality of multi-rate filter blocks $MRFB_0$ to $MRFB_3$ each in accordance with the present disclosure. The multi-rate filter block $MRFB_0$ is connected to an input channel 701, configured so as to accept an input signal w, and is connected to an output channel, configured so as to output a filtered signal 735. Each multi-rate filter block includes an upsampler, a downsampler, and optionally a processing filter. The downsampler and upsampler in each multi-rate filter block $MRFB_i$ are configured with sampling ratios equal to "r". Such sampling ratios are only for purposes of illustration. The sampling ratios may be configured to any values and need not be equal to each other.

The maximum frequency associated with each signal within the multi-rate filter system may be indicated as a power of r (e.g., $r^n$). Thus, the frequency spectrum associated with each multi-rate filters are logarithmically spaced across the entire signal spectrum. Such limitation is shown only for illustrative purposes. The sampling ratios may be configured to any unique values and need not be equal to each other.

The multi-rate filter system includes a nonlinear control system 720 in accordance with the present disclosure. The nonlinear control system 720 may be connected to the bandcombiner output 705 of the multi-rate filter block $MRFB_3$. In the example shown, the bandcombiner output may be oversampled (i.e in this case to a value corresponding to the upper band limit of $r^1$). Thus there may be sufficient spectral headroom in the bandcombiner output 705 to accommodate at least a portion of the distortion introduced by the nonlinear control system 720. The nonlinear control system 720 may be configured to produce one or more control signals 725, which may be combined with the output of the multi-rate filter system (e.g., with the filtered output signal 735) to form a modified control signal 745 for delivery to one or more blocks within the system. In this non-limiting example, the sample rates of the summer inputs (the filtered output signal 735 and the control signal 725) are equivalent.

The nonlinear control system 720 may include a bass enhancement function in accordance with the present disclosure, which may be included in a target dynamics block 306 in accordance with the present disclosure. The nonlinear control system 720 may also be equivalent to a nonlinear filter in accordance with the present disclosure.

Figure 7B:
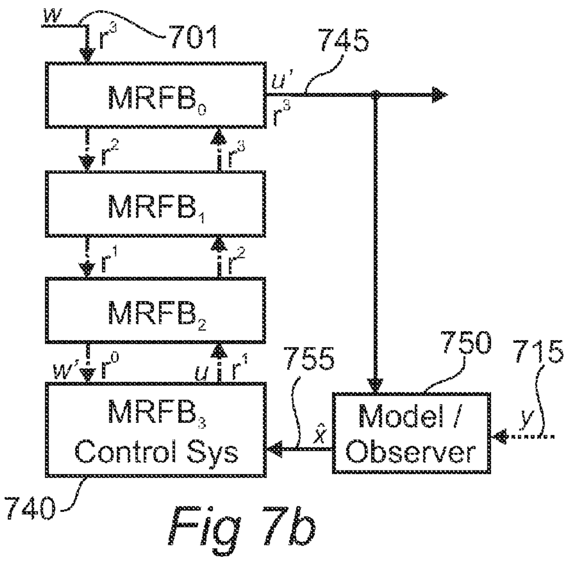

FIG. 7*b* shows aspects of a multi-rate filter system including a nonlinear control system in accordance with the present disclosure. The multi-rate filter system includes a plurality of multi-rate filter blocks $MRFB_0$ to $MRFB_3$ each in accordance with the present disclosure. The multi-rate filter block $MRFB_0$ may be connected to an input channel 701, configured so as to accept an input signal w, and may be connected to an output channel, configured so as to output one or more control signals 745. Each multi-rate filter block includes an upsampler, a downsampler, and optionally a processing filter. The downsampler and upsampler in each multi-rate filter block $MRFB_i$ are configured with sampling ratios equal to "r". Such a limitation is only for illustration purposes. The sampling ratios may be configured to any values and need not be equal to each other.

The maximum frequency associated with each signal within the multi-rate filter system may be indicated as a power of r (e.g., $r^n$). Thus the frequency spectrum associated with each multi-rate filters are logarithmically spaced across the entire signal spectrum. Such limitation is shown only for illustrative purposes. The sampling ratios may be configured to any unique values and need not be equal to each other.

The multi-rate filter system includes a nonlinear control system 740 in accordance with the present disclosure. The nonlinear control system 740 may be directly integrated into the processing filters of the associated multi-rate filter block (in this case, the multi-rate filter block $MRFB_3$). The sampling rate of the associated filter block may be configured to capture sufficient harmonic content generated by the control system, so as to ensure that imaging and aliasing are substantially minimized. Thus, there may be sufficient spectral headroom in the signal delivered to $MRFB_3$ to accommodate at least a portion of the distortion introduced by the nonlinear control system 740. The nonlinear control system 740 may be configured to accept one or more states 755 from an associated model 750 in accordance with the present disclosure. The model 750 may include an observer and thus be configured to accept one or more feedback signals 715 and one or more control signals 745 for use in determining the states 755. Alternatively, additionally, or in combination, the model 30 may include a feed forward state estimator to calculate the states 755 (thus not necessarily requiring an associated feedback signal 715). The observer in the model 750 may be configured to operate at a significantly higher sample rate than the associated control system 740. This may be advantageous for capturing one or more key aspects of the system dynamics (e.g., a relevant resonant frequency, a sub-harmonic generator, etc.). Such an elevated sampling rate may also improve the stability of the observer algorithm.

The nonlinear control system 740 may include a bass enhancement function in accordance with the present disclosure, which may be included in a target dynamics block 306 in accordance with the present disclosure. The nonlinear control system 740 may also be equivalent to a nonlinear filter in accordance with the present disclosure.

Figure 7C:
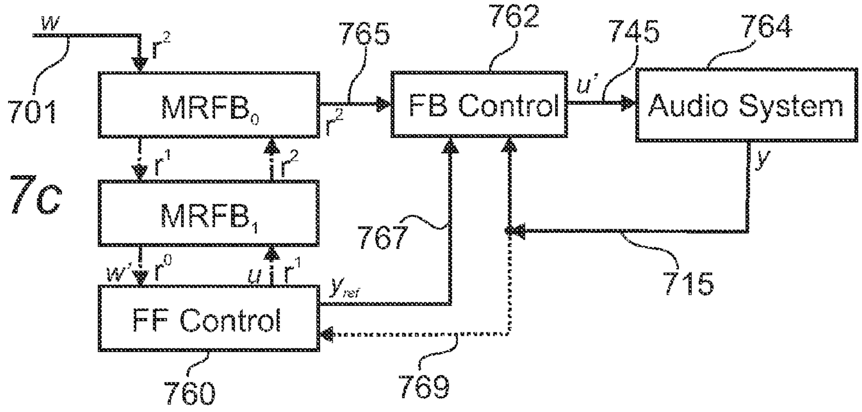

FIG. 7*c* shows aspects of a multi-rate filter system including a nonlinear control system in accordance with the present disclosure. The multi-rate filter system includes a plurality of multi-rate filter blocks $MRFB_0$ to $MRFB_2$ each in accordance with the present disclosure. The multi-rate filter block $MRFB_0$ may be connected to an input channel 701, configured so as to accept an input signal w, and may be connected to an output channel, configured so as to output one or more intermediate control signals 765. Each multi-rate filter block includes an upsampler, a downsampler, and optionally a processing filter. The downsampler and upsampler in each multi-rate filter block $MRFB_i$ are configured with sampling ratios equal to "r". Such a limitation is only for purposes of illustration. The sampling ratios may be configured to any values and need not be equal to each other.

The multi-rate filter system includes a feed forward controller 760, a feedback controller 762 and an audio system 764, each in accordance with the present disclosure. The feed forward controller 760 may be integrated into the processing filters of the associated multi-rate filter block (in this case, the multi-rate filter block $MRFB_3$) and thus may include associated filters and an upsampler. The sampling rate of the associated filter block may be configured to capture sufficient harmonic content generated by the control system, so as to ensure that imaging and aliasing are substantially minimized. Thus, there may be sufficient spectral headroom in the signal delivered to the feed forward controller 760 to accommodate at least a portion of the distortion introduced thereby. The feed forward controller 760 may be configured to produce one or more reference signals 767 and potentially to receive on or more feedback signals 769 (e.g., for protection purposes, to feed an observer, for comparison or adaptation purposes, etc.). The feedback controller 762 may be configured to accept one or more intermediate control signals 765, one or more reference signals 767, and one or more feedback signals 715 to produce one or more control signals 745. The audio system 764 may accept the control signals 762 and generate one or more feedback signals 715. This configuration may be advantageous as the feed forward controller may be calculated at a more computationally efficient sample rate while the feedback controller 762 may have an increased gain bandwidth product in order to more quickly address mismatches between the reference signals 767 and the feedback signals 715.

Figure 7D:
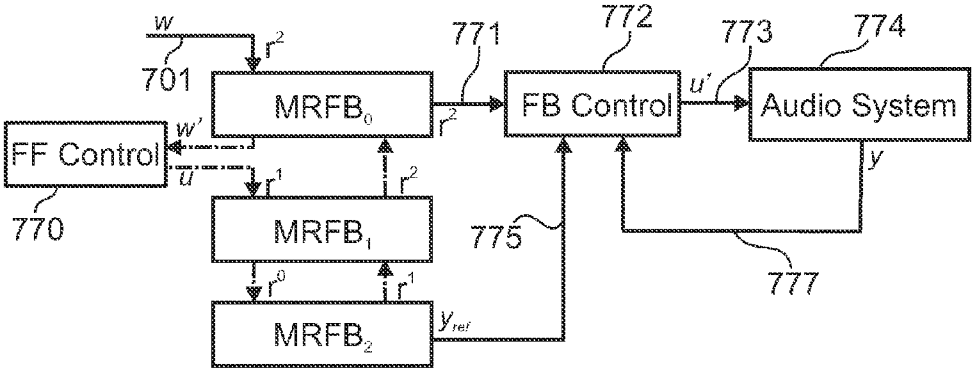

FIG. 7*d* shows aspects of a multi-rate filter system including a nonlinear control system in accordance with the present disclosure. The multi-rate filter system includes a plurality of multi-rate filter blocks $MRFB_0$ to $MRFB_2$ each in accordance with the present disclosure. The multi-rate filter block $MRFB_0$ may be connected to an input channel 701, configured so as to accept an input signal w, and may be connected to an output channel, configured so as to output one or more intermediate control signals 771. Each multi-rate filter block includes an upsampler, a downsampler, and optionally a processing filter. The downsampler and upsampler in each multi-rate filter block $MRFB_i$ are configured with sampling ratios equal to "r". Such a limitation is only for purposes of illustration. The sampling ratios may be configured to any values and need not be equal to each other.

The multi-rate filter system includes a feed forward controller 770, a feedback controller 772 and an audio system 774, each in accordance with the present disclosure. The feed forward controller 770 may be inserted between one or more multi-rate filter banks in the multi-rate filter cascade. In this example, the feed forward controller 770 may be inserted between the output of $MRFB_0$ and $MRFB_1$. As seen in FIG. 7*d*, the processing filter in one of the multi-rate filter banks (in this case $MRFB_2$) may be configured to provide one or more reference signals 775 for delivery to the feedback controller 772. The reference signals 775 may alternatively be provided directly by the feed forward controller 770. The feedback controller 772 may be configured to accept one or more intermediate control signals 771, one or more reference signals 775, and one or more feedback signals 777 to produce one or more control signals 773. The audio system 774 may accept the control signals 762 and generate one or more feedback signals 777. This configuration may be advantageous as the feed forward controller may be calculated at a more computationally efficient sample rate and the associated delay may be conveniently added into the multi-rate filter bank while the feedback controller 772 may be configured to operate with an increased gain bandwidth product in order to more responsively correct mismatches between the reference signals 775 and the feedback signals 777.

In aspects, the feed forward controller 770 may include a bass enhancement function in accordance with the present disclosure, which may be included in a target dynamics block 306 in accordance with the present disclosure. The feed forward control system 770 may also be equivalent to a nonlinear filter in accordance with the present disclosure.

The structures shown may be advantageous for effectively coupling highly nonlinear functions into the cascade structure of the multi-rate filter system while retaining the computational advantages of the multi-rate configuration.

In aspects, the multi-rate filter block cascade may be tapped at any bandcombiner output. Such taps may be used to construct wider band signals from the individual band signal of the multi-rate filter cascade.

In aspects, the sample rates of at least one downsampler and/or upsampler in the multi-rate filter system may be adaptively configurable. At least one downsampler and/or upsampler sample rate may be configured so as to coincide with an acoustic feature (e.g., an acoustic resonance, a bass band transition, a jitter, etc.) of an associated consumer electronics device into which the multi-rate filter system is included.

Figure 8:
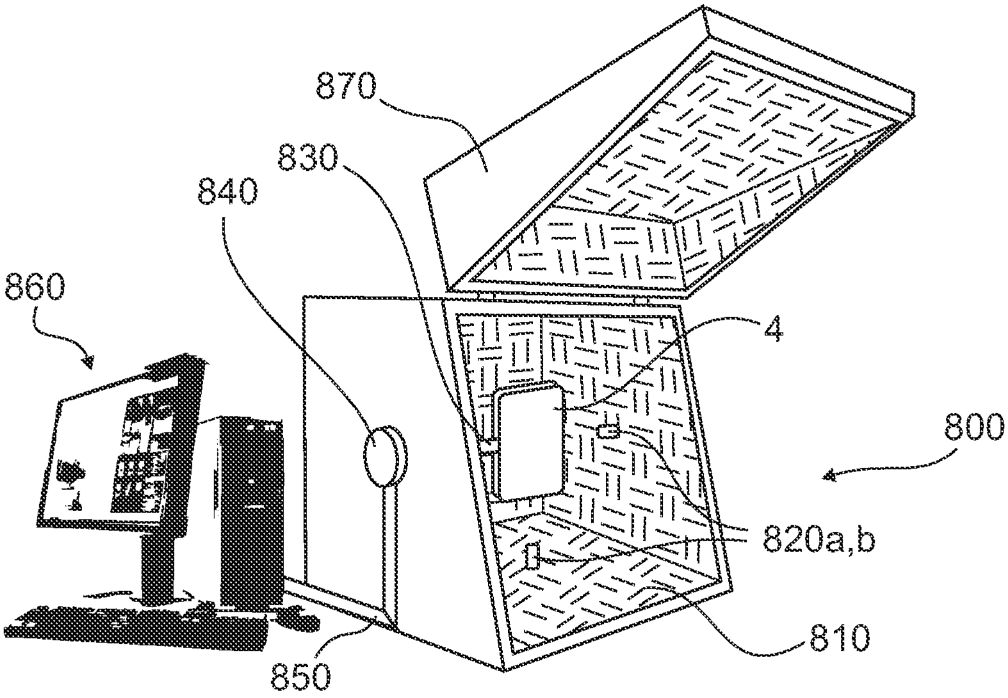
FIG. 8 shows a manufacturing unit for configuring a nonlinear control system on a consumer electronics device in accordance with the present disclosure.

FIG. 8 shows a manufacturing unit for configuring a nonlinear control system on a consumer electronics device in accordance with the present disclosure. The manufacturing unit includes a tuning rig 800 for testing, validating, programming, and/or updating a nonlinear control system within a consumer electronics device (CED) 4 in accordance with the present disclosure. The tuning rig 800 may include an acoustic test chamber 810 (e.g., an anechoic chamber, semi-anechoic chamber, etc.) or alternatively a chamber with an improved acoustic quality (e.g., reduced echo, reduced influence from external sound sources, etc. compared to a manufacturing environment) in which to place a CED for testing. The tuning rig 800 may include and/or interface with an adaptive algorithm in accordance with the present disclosure to perform the tuning and/or optimization process.

The tuning rig 800 may include one or more microphones 820*a,b* spaced within the acoustic test chamber 810 so as to operably obtain acoustic signals emitted from the CED 4 during a testing and optimization procedure. The tuning rig 800 may also include one or more characterization sensors, such as a laser displacement system (e.g., to assess cone movement during testing), a CCD camera (e.g., to assess component alignment, etc.), one or more thermal imaging cameras (e.g., to assess local temperature or heating patterns during testing, etc.), or the like. The tuning rig 800 may also include a boom 830 for supporting the CED 4. The boom 830 may also include a connector for communicating with the CED 4 during a testing and optimization procedure (e.g., so as to send audio data streams to the CED 4 for testing, to program control parameters to the nonlinear control system, etc.). The boom 830 may be connected to a mounting arm 840 on the wall of the acoustic test chamber 810. The mounting arm 840 may include a rotary mechanism for rotating the CED 4 about the boom axis during a testing and optimization procedure. The mounting arm 840 may be electrically interconnected with a workstation 860 such as via cabling 850.

The workstation 860 is shown in the form of a computer workstation. Alternatively or in combination, the workstation 860 may include, or be, a customized hardware system. The hardware configuration of the workstation 860 may include a data collection front end, a hardware analysis block (e.g., part of an adaptive algorithm 410), and a programmer. Such a configuration may be advantageous for rapid, autonomous optimization one or more aspects of the associated nonlinear control system on the CED during manufacturing. The workstation 860 may include at least a portion of an adaptive algorithm 410 in accordance with the present disclosure.

The workstation 860 may have support for user input and/or output, for example to observe the programming processes, to observe the differences between batch programming results, for controlling the testing process, visualizing the design specification, etc. Alternatively or in combination, the workstation 860 may communicate audio test data and/or programming results to a cloud based data center. The cloud based data center may accept audio test data, compare such data with prior programming histories and/or the master design record/specification, and generate audio programming information to be sent to the CED. The cloud based data center may include an adaptive algorithm 410, a learning algorithm, etc. in accordance with the present disclosure.

The workstation 860 may communicate relevant audio streaming and program data with the CED wirelessly.

In aspects, the tuning rig 800 may be provided in a retail store or repair center to optimize the audio performance of a CED including a nonlinear control system in accordance with the present disclosure. In one non-limiting example of a fee for service implementation, a tuning rig 800 may be used in a retail store in order to optimize the audio performance of a customer's CED, perhaps after selection of a new case or accessory for their CED, at the time of purchase, during a service session, etc. Such systems may provide the discerning consumer with the option to upgrade the audio performance of their device and allow a retail center to offer a unique experience-enhancing service for their customers.

Figure 9:
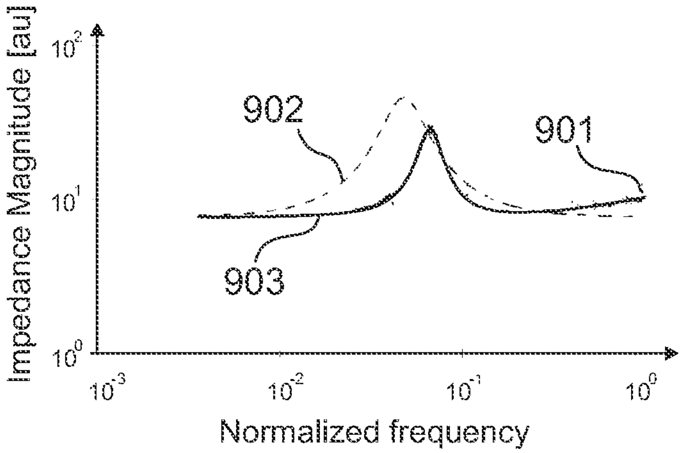
FIG. 9 shows the output of a method for fitting aspects of a nonlinear model in accordance with the present disclosure.

FIG. 9 shows the output of a method for fitting aspects of a nonlinear model in accordance with the present disclosure. The graph demonstrates an experimentally obtained signal impedance spectral response 901 obtained via a method in accordance with the present disclosure or any other known method, e.g., by mapping current and voltage measurements of any stimuli signal in different frequency regions over time by applying a moving band-pass filter or the like (shown as the dotted signal on the graph). In aspects, the nonlinear state estimator associated with the loudspeaker under test may be parametrically configured with an initial guess, this resulted in an initial approximate impedance spectrum 902. The nonlinear state estimator or nonlinear model is then optimized based upon the measured spectral response 901. The optimized spectral response 903 is shown in the figure. As can be seen, the impedance spectrum of the loudspeaker was a useful input for optimizing the associated nonlinear model aspects of the nonlinear control system.

Based upon this approach, a method for optimizing a nonlinear model includes extracting the impedance spectrum of the loudspeaker during operation (e.g., during a test, during playback of a media stream, etc.). The impedance data may be used as a target to optimize one or more parameters of the associated nonlinear model. The resulting model parameters may be uploaded to the model after completion, or adjusted directly on the model during the optimization process.

In some cases, insufficient spectral content may be available in the general media stream. In these cases, audio watermarks may be added to the media stream to discreetly increase the spectral content and thus achieve the desired optimization (e.g., white noise, near white noise, noise shaped watermarks, etc. may be added).

Figure 10A:
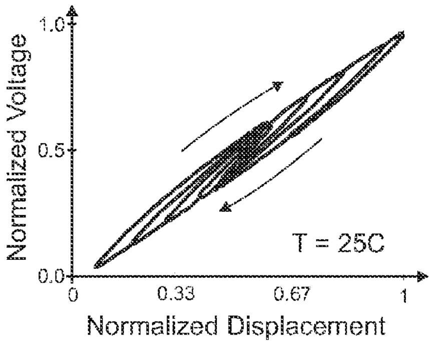
FIGS. 10*a-b* show aspects of nonlinear hysteresis models in accordance with the present disclosure.
Figure 10B:
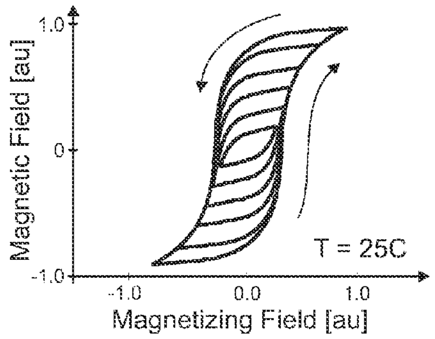

FIGS. 10*a-b* show aspects of nonlinear hysteresis models in accordance with the present disclosure. Large signal operation of transducers in accordance with the present disclosure may exhibit more complicated nonlinearities than considered previously. FIG. 10*a* shows aspects of internal hysteresis loops associated with movement of a piezoelectric transducer during operation. FIG. 10*b* shows an example of hysteresis loops associated with magnetization of a magnetic field during operation. Such hysteretic effects may be temperature and aging dependent, as well as humidity dependent. Such effects are often related to inefficiency, complex distortion, etc. To compensate for such effects, the nonlinear system may include one or more higher order nonlinear hysteresis models. Some non-limiting examples of such models include Preisach models, Lipshin models, Bouc-Wen models, neural networks, fuzzy logic models, and the like. The models may be configured with sufficient complexity so as to capture the necessary dynamics without over-complicating the computational aspects of the nonlinear control system. Such models may include thermal dependencies, rate dependencies (as opposed to being rate independent), etc.

In aspects, a nonlinear control system in accordance with the present disclosure may include a modified Bouc-Wen hysteresis model configured to compensate for the viscoelastic behavior of the suspension of the transducer included in the associated CED.

In aspects, a near time invariant Preisach model may be included into the loudspeaker model to capture loop hysteresis and nonlinearities in one or more nonlinear compensation blocks. The model may include temperature variation aspects thereof to further improve the model reliability and range of application.

Figure 11A:
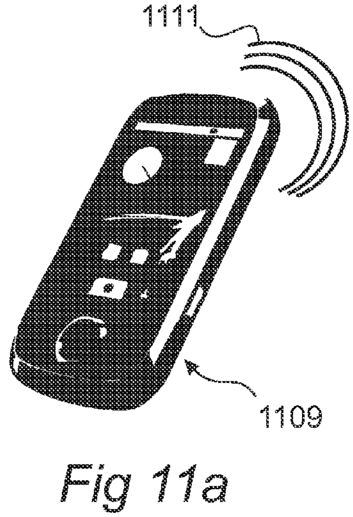
FIGS. 11*a-b* show a consumer electronics device and an integrated loudspeaker for use with a nonlinear control system in accordance with the present disclosure.
Figure 11B:
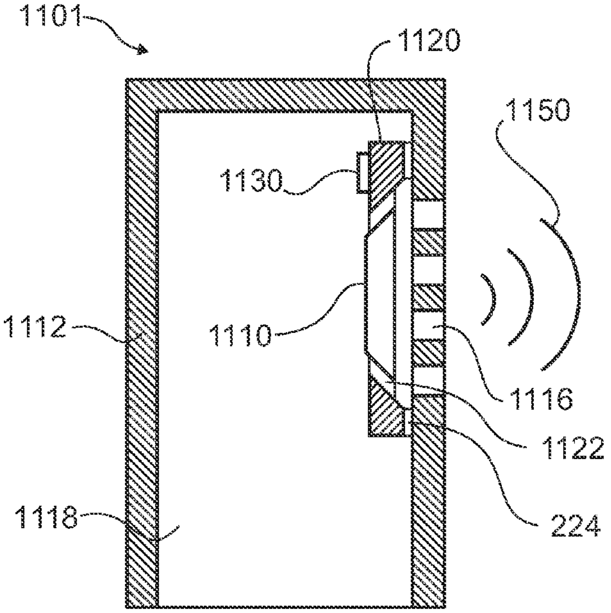

FIGS. 11*a*-*b* show a consumer electronics device 1109 and an integrated loudspeaker for use with a nonlinear control system in accordance with the present disclosure. FIG. 11*a* shows a consumer electronic device 1109 including a nonlinear control system in accordance with the present disclosure. The consumer electronic device 1109 (e.g., a smartphone) may be configured to produce an audio output signal 1111. The CED 1109 may include an integrated loudspeaker assembly 1110 and/or a nonlinear control system, each in accordance with the present disclosure. The CED 1109 may be tested to determine an associated acoustic signature during the design process, the manufacturing process, the validation process, or the like, and the audio performance thereof adjusted through programming of the nonlinear control system included therein.

FIG. 11*b* shows an integrated loudspeaker assembly in a consumer electronic device (CED) 1101, 1109 in accordance with the present disclosure. The CED 1101, 1109 includes a casing 1112 and a plurality of perforations 1116 (or equivalent thereof) in the casing 1112, for providing fluid communication between the inside of the CED 1101 and a surrounding environment. The loudspeaker assembly includes a speaker unit 1110 and mounting support 1120. The speaker unit 1110 may be attached to the mounting support 1120 with a flexible support 1122. The mounting support 1120 may be attachable to the casing using a mounting adhesive 1124 or equivalent means of attachment (e.g., welding, glue bonding, screws, rivets, mechanical interconnections, etc.). The speaker unit 1110 may be configured to operably produce an audio output signal 1150.

The casing 1112 defines an enclosure 1118 into which additional device components (e.g., electrical components, mechanical components, assemblies, integrated loudspeaker assembly, etc.) may be placed.

In aspects, the integrated loudspeaker assembly may be placed adjacent to the perforations 1116 such that the speaker unit 1110 separates the perforations 1116 from the rest of the enclosure 1118 of the CED 1101, 1109 (e.g., effectively forming an air-tight seal between the perforations 1116 and the rest of the enclosure 1118).

In aspects, the integrated loudspeaker assembly may be provided without a well-defined back volume. Thus the back volume for the speaker unit 1110 may be at least partially shared with the rest of the enclosure 1118 of the CED 1101, 1109. Thus the back volume for the speaker unit 1110 may not be defined until the integrated loudspeaker assembly has been fully integrated into the final CED 1101, 1109 (e.g., along with all the other components that makeup the CED 1101, 1109). Such a configuration may be advantageous for increasing the available back volume for the speaker unit 1110, thus extending the overall bass range capabilities of the CED 1110. The speaker unit 1110 may further include a circuit 1130, the circuit 1130 including at least a portion of a nonlinear control system in accordance with the present disclosure.

The circuit 1130 may be an ASIC or the like. Such a configuration may be advantageous for providing a fully compensated speaker unit 1110, optionally optimized to limit part to part variance, provide substantially maximal performance, etc. yet provide substantially no change in the assembly process for a device manufacturer, optimize for assembly mismatches, and/or compensate for connector impedance variance, and the like. Such a configuration may be advantageous to overcome contact resistance related issues experienced during loudspeaker assembly processes.

The speaker unit 1110 may include a voice coil, a spider, a cone, a dust cap, a frame, and/or one or more pole pieces as known to one skilled in the art.

The mounting support 1120 may be formed from a thermoplastic, a metal, etc. as known to one skilled in the art.

The integrated loudspeaker assembly may include electrical interconnects, driver, gasket, filters, audio enhancement chipsets (e.g., to form an active speaker), etc.

In aspects, the integrated loudspeaker assembly may include an audio amplifier (e.g., a class AB, class D amplifier, etc.), a crossover (e.g., a digital cross over, an active cross over, a passive crossover, etc.), and/or one or more aspects of a nonlinear control system in accordance with the present disclosure. The nonlinear control system may be configured to compensate for the back volume formed by the speaker unit 1110 and enclosure 1118 of the casing 1112, acoustic resonances of the casing 1112, acoustic contributions of the components and interconnection of components placed into the CED 1101, 1109, and the like.

Generally speaking, an observer in accordance with the present disclosure may be configured to operate under conditions of limited feedback. In such circumstances, the observer may be augmented with a suitable feed forward state estimator to assist with assessment of states with limited feedback.

An observer or non-linear model in accordance with the present disclosure may also be used to enhance robustness of a feedback system (e.g., used in parallel with a feedback controller) by providing additional virtual sensors. In some instances, it may be the case where a measured state may be too far off from the prediction made by the observer or model to be realistic and therefore being rejected as a faulty measurement. In the case of detection of a faulty measurement, the observer or model generated state estimation may be used instead of the direct measurement until valid measurements are produced again.

The nonlinear control system may be configured with real-time impedance based feedback, which may be over a slower time period, to provide adaptive correction and/or update of parameters in the control system, e.g., to compensate for model variations due to aging, thermal changes or the like.

The nonlinear control system may include one or more stochastic models. The stochastic models may be configured to integrate a stochastic control method into the nonlinear control process. The nonlinear control system may be configured so as to shape the noise as measured in the system. Such noise shaping may be advantageous to adjust the noise floor to a higher frequency band for more computationally efficient removal during operation (e.g., via a simple low pass filter).

In aspects, the nonlinear control system may include a gain limiting feature, configured so as to prevent the control signal from deviating too far from the equivalent unregulated signal, so as to ensure stability thereof, limit THD, etc. This gain limiting aspect may be applied differently to different frequencies (e.g., allow more deviation at lower frequencies and less or even zero deviation at higher frequencies).

The state vector may be configured so as to include exact matched physical states such as membrane acceleration (a). In such a configuration, the accuracy of the position (x) and velocity (v) related states may be somewhat relaxed while maintaining a high precision match for the acceleration (a). Thus, DC drift of the membrane may be removed from the control output, preventing hard limiting of the membrane during operation.

A nonlinear control system in accordance with the present disclosure may include a simple analytical and/or black-box model of the amplifier behavior associated with one or more drivers. Such a model may be advantageous for removing artifacts from the control signal that may result in driver instability. One non-limiting example is to model an AC amplifier as a high-pass filter with its corresponding cut-off frequency and filter slope.

In aspects, the nonlinear control system may include one or more "on-line" optimization algorithms. The optimization algorithm may be configured to continuously update one or more model parameters, which may occur during general media streaming. Such a configuration may be advantageous for reducing the effects of model faults over time while the system is in operation. In a laboratory and/or production setting, the optimization algorithm may afford additional state feedback from an associated kinematic sensor (e.g., laser displacement measurements of the cone movement) to more accurately fine tune the associated nonlinear model aspects of the system (e.g., feed-forward model parameters, observer parameters such as covariance matrices, PID parameters and the like). This approach may be advantageous to apply to the tuning rig 800 during manufacture of one or more CEDs including a nonlinear control system in accordance with the present disclosure. The system may be optimized while measuring as many states as practical. The associated multi-parameter optimization scheme may be configured to optimize to a minimum for the THD within the requested frequency range (e.g., for fundamentals up to 200 Hz).

The optimally configured model (e.g., configured during production), may be augmented with a parametrically adjustable model (e.g., a post-production adaptive control system). During the lifetime of the associated device, the parametrically adjustable model may be adaptively updated around the optimally configured model to maintain ideal operational characteristics. This configuration may be advantageous for improving the optimization results during the lifetime of the device, adaptively mapping the model parameters while knowing all states (e.g., by laser, accelerometers, a sensor in accordance with the present disclosure, etc.) or alternatively by measuring the THD with a microphone and optimize with that as a minimizing target and/or to simply implement the impedance curve mapping according to any associated method in accordance with the present disclosure.

The optimally configured and parametrically adjustable approach may be suitable for removing various aspects of the model that can cause instability or bimodal response with a "black-box" representation thereof (e.g., where the input-to-output characteristics are somewhat blindly mapped).

An optimally configured and parametrically adjustable approach may be advantageous as it may provide a means for matching an entire product line with a single adaptable model, or for matching different types of speakers more easily as the need for a perfect model is relaxed. The configuration may be amendable to implementation with an API, laboratory and/or manufacturing toolkit. The system may also be used to characterize optimally configurable (and complex) models for different speaker types (e.g., electroactive polymers, piezo-electric, electrostrictive and other types of electro-acoustic transducers [where a simple model may not be a valid description of the system]) while employing a black box model for adaptive correction in the field (e.g., via implementation of one or more automatic control and/or adaptation processes described herein).

In aspects, a model class may be suitable for implementation of embodiments of the present disclosure. The model class may be derived for a class of devices and implemented in a simplified form so as to efficiently run on a processor, as part of an OS service, etc. In aspects, a subclass of the model class may be loaded onto a respective device, optionally with a plurality of such models running in parallel during operation to predict future states of the device (e.g., predict excursion, etc.). Such models may be used as part of a speaker protection algorithm, as part of a control model, etc. in accordance with the present disclosure.

In aspects, a feed-forward controller in accordance with the present disclosure may be assisted by a PID controller, which may be included in an associated feedback controller (to compensate for variations in the feed forward model output). Such a configuration may be less computationally intensive than alternative approaches while providing a simplified implementation. Although reference is made to PID, other forms of control may be used, as disclosed herein.

One or more aspects of the nonlinear control system in accordance with the present disclosure may be implemented digitally. In aspects, the nonlinear control system may be implemented in an entirely digital fashion.

In aspects, one or more model parameters may be optimized in a lab setting, where full state feedback may be available. In such an example, a method may include determining a small-signal measurement of equivalent Thiele-Small parameters (linear), making a rough guess to the nonlinear parameter shapes, measuring a large-signal stimuli to determine one or more large signal characteristics, adjust the model parameters until the output states of the model substantially match the measured states. Such a method may be implemented using a trusted region optimization method, or the like. The process may also be implemented iteratively with a plurality of measurements or with a range of stimuli.

In aspects, the method may include setting one or more model parameters (e.g., configuring a covariance matrix) of the controllers target dynamics and/or inverting dynamics aspects by any known technique. In aspects, the setting may be achieved by a brute-force approach including testing all possible regulator parameters within reasonable intervals to find the settings for minimum THD. The minimum TI-ID can then be measured on the real system and simulated by the model and used to correct for changes experienced by the device in the field. This approach may also be done iteratively while measuring the actual THD in each measurement iteration.

In aspects, the method may include configuring the PID-parameters. Such configuring may be achieved by, for example, a "brute-force" approach, whereby all possible values within reasonable limits are tested while measuring the THD of the speaker and searching for a minimum. In this case, it may be preferable to measure the THD as opposed to simulating it.

Such a method may include measuring the impedance in accordance with the present disclosure. If real-time impedance measurements demonstrate a parameter mismatch severely (e.g., via severe changes in temperature or ageing), the system may automatically use the new impedance curve to map the nonlinear model to the new system in real-time. Thus a technique for continuously and dynamically adapting model parameters may be provided during system operation. Small model variations may be compensated for by a linear feedback system (e.g., a PID controller).

Such an approach may be performed in real-time. When a reliable impedance curve may be obtained during measurement, the parameter adaptation (e.g by trusted region optimization) may be performed. As temperature or aging may occur relatively slowly compared with the system dynamics, such an adaptation approach may run occasionally, whenever the processor is "free" and does not suffer from real-time requirements on a sample rate basis.

The nonlinear control system including an observer (e.g., an EKF, UKF, AUKF, or the like), may include an adaptive algorithm for adjusting one or more model parameters "on-line". The observer may then be optimized or trained to adapt to updated model parameters while operating in the field.

In accordance with the present disclosure, the controller may be divided into "Target Dynamics" (corresponding to the target behavior, e.g., a linear behavior) and "Inverse Dynamics" (which is basically aiming to cancel out all dynamics of the un-controlled system, including non-linearities) aspects. In this case, the target dynamics portion may include one or more nonlinear effects, such as psychoacoustic non-linearities, a compressor, or any other "target" behavior. Thus the controller may merge the nonlinear compensation aspects with the enhanced audio performance aspects.

A nonlinear control system may be configured to work on primarily a low frequency spectrum (e.g., less than 1000 Hz, less than 500 Hz, less than 200 Hz, less than 80 Hz, less than 60 Hz, etc.). In one non-limiting example, the nonlinear control system may be configured to operate on a modified input signal. In this case, the input signal may be divided within the woofer band with another crossover (e.g., at 80 Hz). The modified input signal delivered to the nonlinear control system may be focused only on the band below the crossover. Additional aspects are discussed throughout the present disclosure.

A nonlinear control system in accordance with the present disclosure may be embedded in an application specific integrated circuit (ASIC) or be provided as a hardware descriptive language block (e.g., VHDL, Verilog, etc.) for integration into a system on chip (SoC), an application specific integrated circuit (ASIC), a field programmable gate array (FPGA), or a digital signal processor (DSP) integrated circuit.

Alternatively, additionally, or in combination, one or more aspects of the nonlinear control system may be soft-coded into a processor, flash, EEPROM, memory location, or the like. Such a configuration may be used to implement the nonlinear control system at least partially in software, as a routine on a DSP, a processor, and ASIC, etc.

Figure 12A:
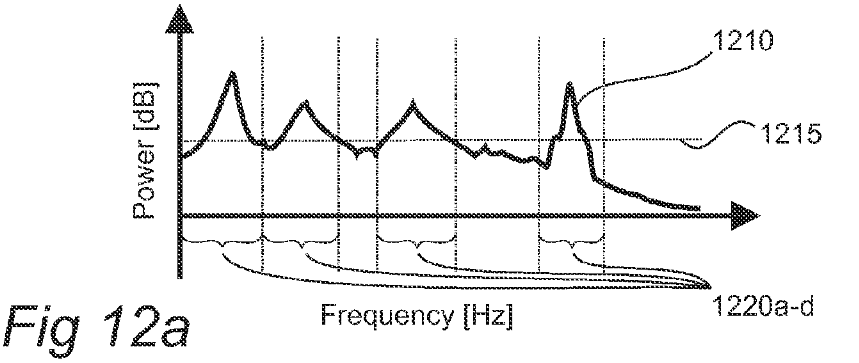
FIGS. 12*a-b* show spectral representations of the power delivered to and impedance of a loudspeaker over a period of time in accordance with the present disclosure.
Figure 12B:
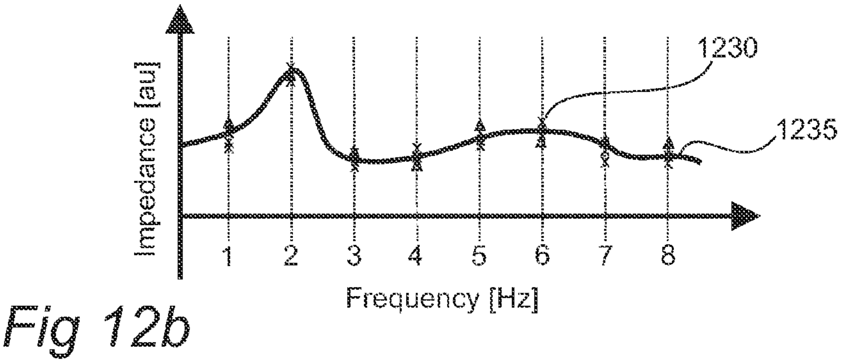

FIGS. 12*a*-*b* show spectral representations of the power 1210 and impedance 1235 of a loudspeaker in accordance with the present disclosure. The spectra are associated with a method for calculating a spectrum of one or more aspects (e.g., impedance, power, voltage, current, etc.) of a loudspeaker in accordance with the present disclosure during operation with a natural sound source (e.g., with a music stream, a conversation, etc.). FIG. 12*a* shows a power spectrum 1210 generated from a natural audio stream as averaged over a time period during use (e.g., as averaged over a 100 ms period, a 250 ms period, etc.). Overlaid onto the power spectrum is shown a threshold 1215, which may be organized based on a predetermined threshold (e.g., a power level, a voltage, a current, an excursion, etc.), a frequency dependent threshold, etc.

The threshold 1215 may be used to determine which regions of the spectrum 1210 may contain (for the timeframe in question) a significant level of information, suitable for further analysis. In FIG. 12*a*, multiple spectral bands 1220*a*-*d* are shown with information presenting at levels above the local threshold 1215. In aspects, the analysis may include updating a model, adaptation of a parameter set, construction of a property table, etc.

FIG. 12*b* shows a spectral representation 1235 of an impedance model for a loudspeaker in accordance with the present disclosure. The model may be an adaptive model, a parametric model, generated from one or more spectral band averaged parameters, etc. In the non-limiting example shown in FIG. 12*b*, the spectrum may be split into multiple bands (e.g., 2 bands, 8 bands, 16 bands, 64 bands, etc.). Within each band, a property value 1230 (e.g., impedance, excursion, etc.) is measured during use. A finite number of property values 1230 within each band may be stored for input to a model (e.g., an adaptive model, a curve fit, etc.) for use in predicting the overall property spectrum 1235 of the loudspeaker at any time during use thereof. Such information may be generated and/or updated as necessary to predict one or more states of the loudspeaker, as feedback into a control system in accordance with the present disclosure, etc.

In aspects, a method for generating a property spectrum for a loudspeaker may include playing an audio stream with the loudspeaker under test, measuring current and voltage associated with the loudspeaker (e.g., via use of a series resistor, etc.), generating one or more spectra from the measured signals (e.g., generation of a bass band spectrum, a mid-band spectrum, etc.), analyzing one or more of the spectra to determine frequency bands of interest therein (e.g., frequency bands including a significant signal level in relation to a threshold value/function), and calculating property spectral bands in the frequency bands of interest. The method may include combining the property spectral bands with previously measured bands, updating a model with one or more of the property spectral bands, updating an adaptive model for a property spectrum using one or more of the property spectral bands, etc.

In aspects, the measured signals may include current through and voltage across a loudspeaker input (e.g., voice coil, electrodes, etc.). The property may include impedance of the associated loudspeaker, etc. The generation of the spectra may be completed using an FFT, a multi-band filter and one or more averaging filters, etc.

Figure 13:
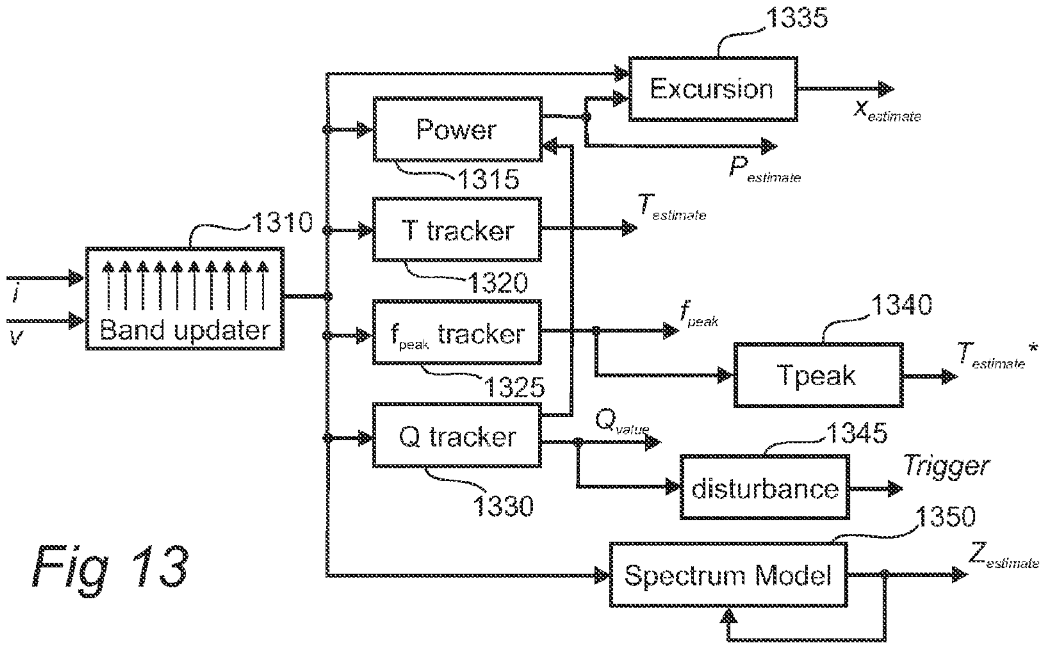
FIG. 13 shows aspects of a system for generating variables from signals measured from a loudspeaker in accordance with the present disclosure.

FIG. 13 shows aspects of a system for generating variables from signals measured from a loudspeaker in accordance with the present disclosure. The system may be configured to accept one or more feedback signals (e.g., current, voltage, an excursion value, etc.), and to deliver one or more of the feedback signals to a band updater 1310. The band updater 1310 may be configured to generate one or more multi-band references relating to the feedback signals (e.g., a multi-band vector, a spectrum, etc.). One or more of the references may be made available to one or more aspects of a system in accordance with the present disclosure, as a feedback element to a nonlinear control system in accordance with the present disclosure, or the like. The system may include one or more property extraction blocks (e.g., functional blocks, a power tracking block 1315, a temperature tracking block 1320, a characteristic tracking block, a resonant frequency tracking block 1325, an acoustic quality tracking block 1330, etc.), configured to analyze the updated spectrum, and to generate one or more associated parameters therefrom. Some non-limiting examples of property extraction blocks include a power tracking block 1315, a temperature tracking block 1320, a resonant peak tracking block 1325, an acoustic quality tracking block 1330, combinations thereof, and the like.

In aspects, during operation, the update process may be configured at a rate suitable for operation within a service on an operating system (e.g., as a background service on a smartphone operating system), etc. Such an adaptive process may be advantageous for minimizing hardware requirements of the system, providing a flexible working environment, etc.

In aspects, a power tracking block 1315 may be configured to track a power metric, from one or more of the multi-band references (e.g., spectra), obtained from the band updater 1310 during use. The power tracker 1315 may also accept one or more parameters (e.g., resonant peak, an acoustic quality, a temperature, an excursion spectral model, an output from an associated block 1330, etc.) as part of the analysis process. In aspects, the power tracker 1315 may be configured to partially calculate an excursion value for an associated loudspeaker in accordance with the present disclosure. In aspects, a representative power value may be calculated by integrating the combined spectrum of a current and voltage signal for an associated loudspeaker over a spectral band of interest. The integration may include combination with an additional excursion model 1335, configured to relate the input power at one or more wavelengths to a corresponding excursion value.

In aspects, the power tracker 1315 may provide a prediction of near term upcoming power requirement for the speaker (e.g., $P_{estimate}$). Such information may be provided to a power management service elsewhere in the system in order to plan for resource management, soft transition speaker output, avoid brownout conditions, or the like.

In aspects, one or more parameter tracking block(s) and/or modeling block(s), may accept one or more of a temperature value, a thermal value, etc. In aspects, an associated modeling block may include a temperature dependent model for calculating an excursion parameter during use. In aspects, the system may include a peak temperature tracker 1340 configured to estimate the near-term upcoming peak temperature on a speaker element given the input history of one or more inputs (e.g., as predicted by one or more feedback parameters in the system), which may be in combination with an ambient temperature reading, etc.

In aspects, the system may include a disturbance tracker 1345, configured so as to determine if a degree of damage and/or change has occurred with the system (e.g., such a change in acoustic quality Q, etc.) during use. Such information may be suitable for incorporation into a lifetime predicting algorithm, or the like.

The band updater may include an FFT, an adaptive model, or the like configured to generate the updated reference from one or more of the feedback signals.

The system may be configured to deliver one or more references, feedback signals, parameters, etc. to one or more aspects of a control system in accordance with the present disclosure.

In aspects, the system may include a spectrum model 1350 configured to extract updated band information from the band updater 1310 and to generate a continuous spectral model therefrom (e.g., such as a second order model, etc.). Such a model may be used by one or more system processes, controllers, or the like in order to improve speaker performance, and/or provide aspects of a speaker protection function.

Figure 14:
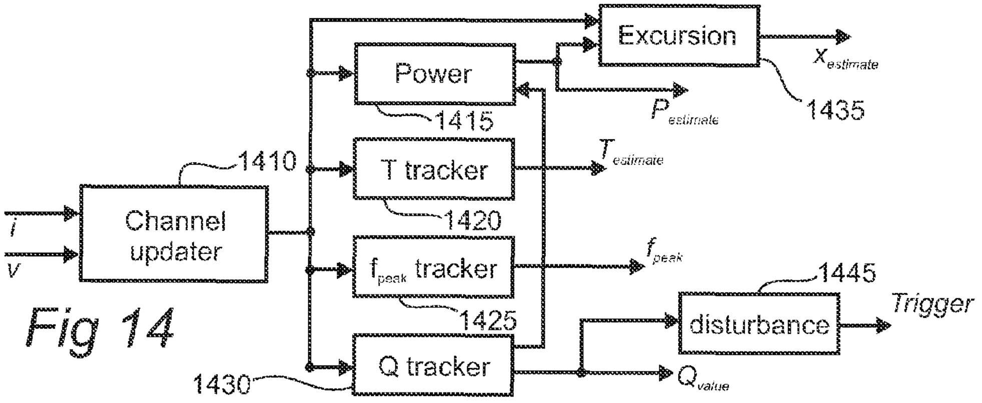
FIG. 14 shows aspects of an optionally multi-rate system for generating variables from signals measured from a loudspeaker in accordance with the present disclosure.

FIG. 14 shows an optionally multi-rate system for generating variables from signals measured from a loudspeaker in accordance with the present disclosure. The system may include a multi-rate subsystem for splitting one or more of the feedback signals into one or more frequency bands for analysis. In aspects, each band may be treated separately in order to extract suitable band information during use.

The channel updater 1410 may be configured to generate one or more multi-channel references relating to the feedback signals (e.g., a multi-band vector, a spectrum, etc.). One or more of the references may be made available to one or more aspects of a system in accordance with the present disclosure, as a feedback element to a nonlinear control system in accordance with the present disclosure, or the like. The system may include one or more property extraction blocks (e.g., functional blocks, a power tracking block 1415, a temperature tracking block 1420, a characteristic tracking block, a resonant frequency tracking block 1425, an acoustic quality tracking block 1430, an excursion tracking block 1435, a disturbance tracking block 1445, etc.), configured to analyze the updated spectrum, and to generate one or more associated parameters therefrom.

Figure 15:
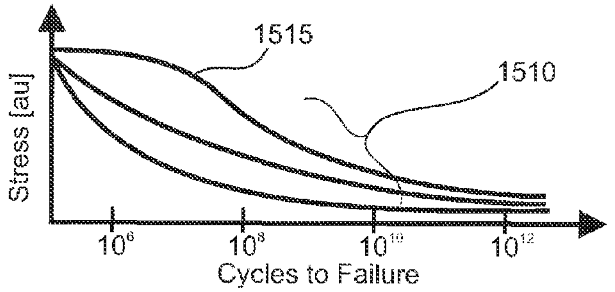
FIG. 15 shows a semi-logarithmic graph outlining some non-limiting examples of relationships between stress state and cycles to failure for a loudspeaker in accordance with the present disclosure.

FIG. 15 shows a semi-logarithmic graph outlining some non-limiting examples of relationships between stress state and cycles to failure for a loudspeaker in accordance with the present disclosure. The graph shows logarithmic cycles to failure against a magnitude of stress for a range of non-limiting example speakers 1510: a low cost speaker, mid-range speaker, and a high performance speaker 1515.

In aspects, a relationship between cycles to failure and stress may be incorporated into one or more aspects of a speaker protection system in accordance with the present disclosure. The remaining lifetime may be estimated using such information as part of a lifetime prognosticating subsystem as part of the speaker protection system. In aspects, a value relating to the combination of stress and application time may be generated during use of the speaker. The value may be configured in combination with such a stress-cycle relationship to generate an estimate of the remaining lifetime of the speaker in the field.

In aspects, a usage profile for a loudspeaker in accordance with the present disclosure, may be generated by integrating a stress parameter (e.g., an excursion augmented power level, a thermal parameter, a combination thereof, etc.) with a duration (e.g., time under stress), so as to generate a metric which designates a quantifiable level to which the loudspeaker has been operated under stress during usage thereof. Such a metric may then be used to predict remaining lifetime of the loudspeaker. In aspects, the maximal stress levels that may be applied to the loudspeaker in use may be augmented in real-time while in service based on the usage profile to date (e.g., the maximal allowed stress may be reduced based on the amount and severity of usage of the loudspeaker to date).

Figure 16A:
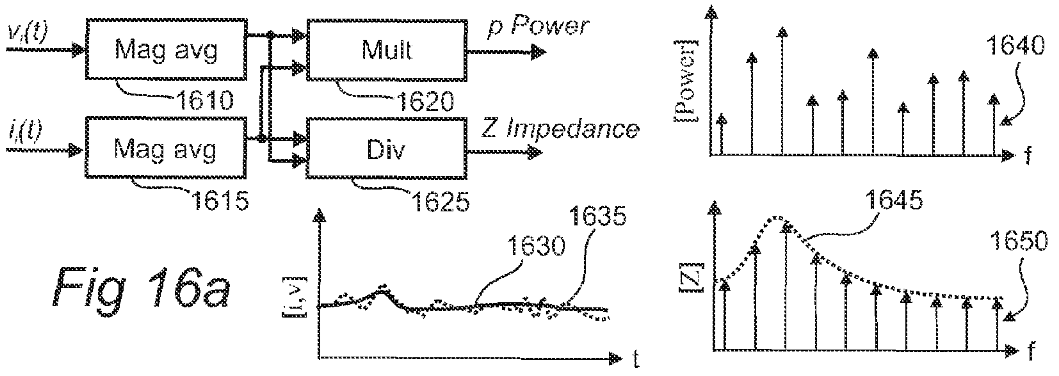
FIGS. 16*a-c* show aspects of systems for extracting parameters from one or more signals measured in a system in accordance with the present disclosure.
Figure 16B:
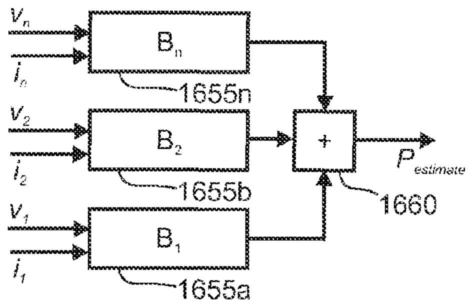
Figure 16C:
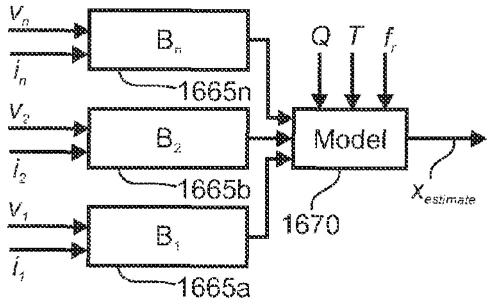

FIGS. 16*a-c* show aspects of systems for extracting parameters from one or more signals measured in a system in accordance with the present disclosure. FIG. 16*a* shows aspects of a system to extract one or more spectral aspects of a property (e.g., impedance, Q, $f_r$, etc.), and/or a state (e.g., excursion, velocity, acceleration, current, voltage, power, etc.) during operation thereof. The system may be configured to receive one or more signals (e.g., voltage, current, excursion, etc.) or signals generated therefrom (e.g., band limited portions thereof, etc.). The system may include band averaging blocks 1610, 1615, configured to generate an average magnitude within a frequency band of an associated input. The system may be configured to perform one or more operations 1620, 1625 (e.g., arithmetic operation, multiplication, division, conversion, filter, etc.) on the average magnitudes to generate one or more discrete frequency band estimates therefrom. The frequency band estimates may be a computationally simplified representation of a frequency spectrum for the parameter, for use by one or more aspects of an associated protection system, control system, model generation algorithm, etc.

Some aspects of temporal data 1630, 1635 along with associated band-limited spectra 1640, 1650, and a fitted impedance model 1645 (e.g., a linear model, a biquad filter based model, etc.), are shown to clarify the parameter extraction process.

FIG. 16*b* shows aspects of a system to extract and/or predict one or more spectral aspects of a property (e.g., impedance, Z), or a state (e.g., excursion x, power p, etc.) from one or more inputs during operation thereof. In aspects, the system may be configured to calculate a total power or energy estimate from one or more feedback signals (e.g., voltage, current, excursion, etc.) or signals generated therefrom (e.g., band limited portions thereof, etc.). The system may include band averaging blocks 1655*a-n*, configured to generate an average magnitude within a frequency band of an associated input. The system may be configured to perform one or more operations 1660 (e.g., arithmetic operation, conversion, filter, etc.) on the average magnitudes to generate the associated power and/or energy estimates. Such a configuration may be advantageous for calculating the desired properties in a computationally efficient method, amendable to implementation in a background service on an operating system.

FIG. 16*c* shows aspects of a system to extract one or more aspects of a property (e.g., impedance) or a state (e.g., excursion, power, etc.) during operation thereof. The system may include band averaging blocks 1665*a-n*, configured to generate an average magnitude within a frequency band of an associated input. The system may include one or more excursion models 1670 configured to calculate an excursion parameter $x_{estimate}$ from one or more feedback signals (e.g., voltage, current, excursion, etc.), one or more estimated parameters Q, T, $f_r$ (e.g., one or more model parameters, an acoustic quality, a coil temperature, a resonant frequency, an impedance model, an acoustic model, etc.) or signals generated therefrom (e.g., band limited portions thereof, etc.). In aspects, the excursion model 1670 may be generated from physical relationships between displacement and impedance (e.g., from a parametric model, from a physical model, etc.), from an adaptive model, as part of a test procedure, etc. In aspects, the system may include a plurality of excursion and/or impedance models 1670 or the like configured to operate simultaneously during operation, the output thereof compared against a measured signal or characteristic to determine and/or select the model 1670 that is most representative of the present state of the associated acoustic system.

Figure 17A:
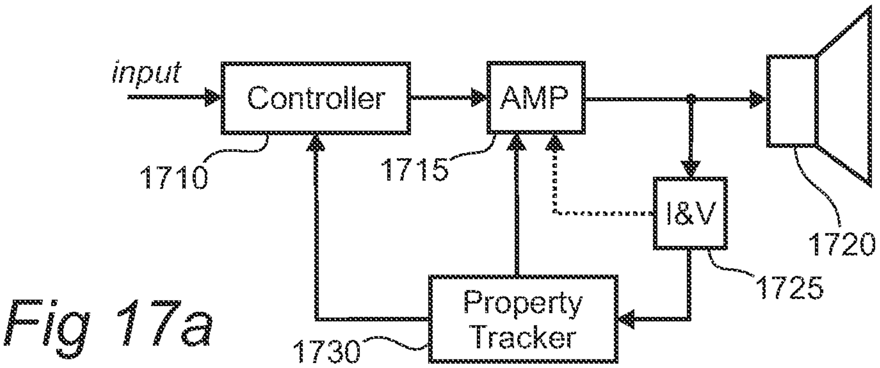
FIGS. 17*a-c* show aspects of a system for controlling a loudspeaker in accordance with the present disclosure.
Figure 17B:
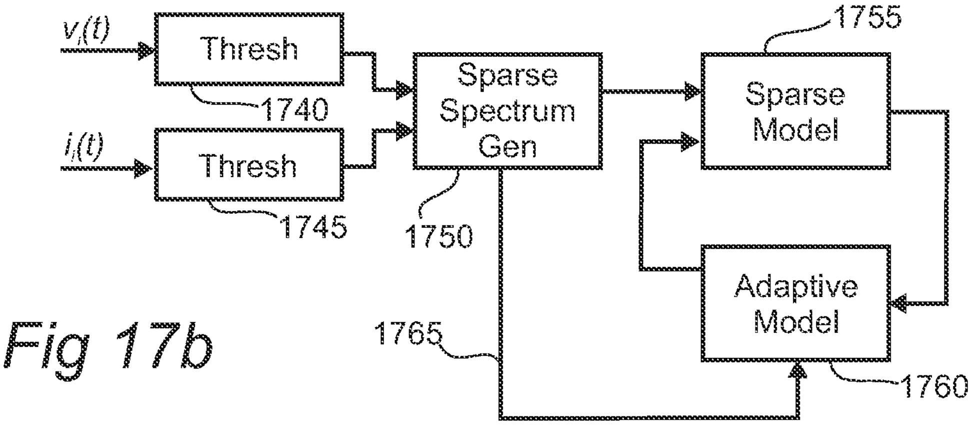
Figure 17C:
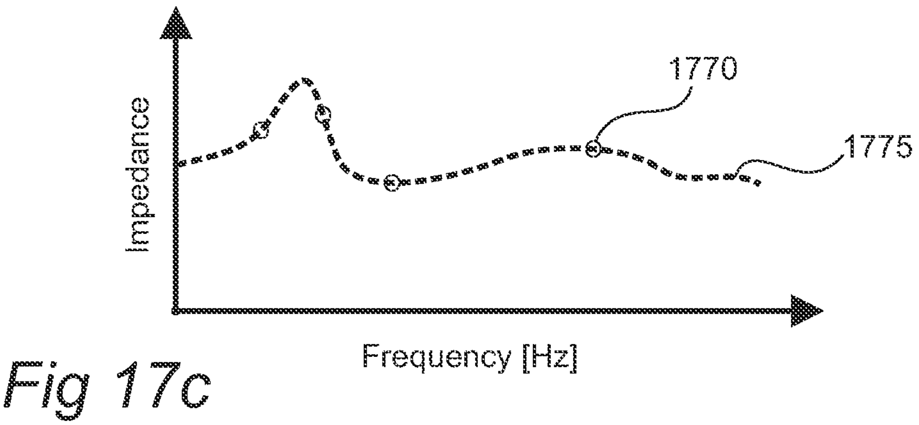

FIGS. 17*a-c* show aspects of a system for controlling a loudspeaker 1720 in accordance with the present disclosure. FIG. 17*a* shows a system for controlling a loudspeaker configured to accept an input audio signal (input), including a controller 1710 in accordance with the present disclosure. The controller 1710 may be configured to accept the input signal and/or one or more feedback signals or signals generated therefrom and to generate one or more control signals for use by one or more aspects of the system. The system may include an amplifier 1715 configured to accept the control signal and one or more feedback signals (e.g., current, voltage, excursion, etc.), or signals generated therefrom (near-term predictions of states, a property, an environmental condition, etc.), and to generate a drive signal to drive an associated loudspeaker 1720. The system may include one or more sensory feedback blocks 1725, configured to measure and optionally convert one or more feedback signals from the loudspeaker or audio system component. The sensory feedback block 1725 shown in FIG. 17*a* may be configured to monitor one or more aspects of the voltage, and/or current provided to the loudspeaker 1720, and to optionally generate one or more feedback signals therefrom (e.g., filtered signals, band limited signals, raw signals, etc.). The system may include a property tracker 1730 in accordance with the present disclosure configured to accept one or more feedback signals or signals generated therefrom, and to calculate a property (e.g., impedance, resonant frequency, cutoff frequency, nonlinear acoustic parameter, etc.) for use by one or more aspects of the system in accordance with the present disclosure. One or more of the properties may be used as part of a control algorithm included in the controller, a protection algorithm included in the controller and/or the amplifier, etc. In aspects, the property tracker 1730 may forward one or more of the feedback signals onto the controller 1710, and/or amplifier 1715 during use.

FIG. 17*b* shows a subsystem in accordance with the present disclosure configured to generate one or more property spectra from one or more feedback signals (current, voltage, $v_i(t)$, $i_i(t)$, etc.), which may be measured during general use of an associated loudspeaker (e.g., without preconceived test signals, etc.). The subsystem may include one or more threshold blocks 1740, 1745, configured to calculate when the feedback signals or a portion thereof have significant content for further analysis. The subsystem may include a sparse spectrum generator 1750 configured to accept the significant content and generate one or more sparse spectra therefrom (e.g., portions of a complete spectrum as available from the significant content of the feedback signals). The subsystem may include a sparse data model 1755 into which sparse spectra may be incorporated as available based on the particular usage case. The subsystem may include one or more models, adaptive models 1760, etc. to accept one or more aspects of the sparse spectra and/or an error signal from one or more of the sparse data models 1755 during use. The adaptive model 1760 may be configured to make a stabilized, full spectral model therefrom. The stabilized full spectral model may be made available to one or more aspects of the system (e.g., a control algorithm, a sound quality enhancement algorithm, an amplifier, etc.) for use in the control and/or protection of the loudspeaker. In aspects, the full spectral model may be added to a model bank in accordance with the present disclosure, as feedback for aging studies, etc.

FIG. 17*c* shows an impedance frequency response at a present time period relating to significant content 1770 (measured over particular bands within the spectrum), and a visual example of a full spectral model 1775 fit thereto, obtained for the particular time period in question. The model 1775 may be updated as available from the significant content 1770 from the present time period as well as significant content obtained during previous time periods.

Figure 18A:
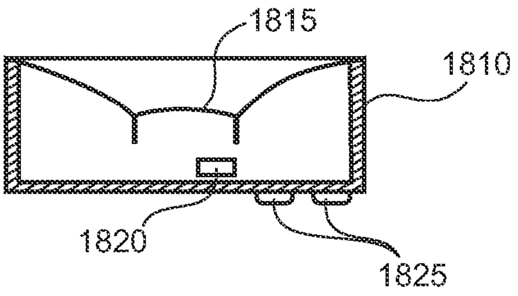
FIGS. 18*a-d* show aspects of an active loudspeaker in accordance with the present disclosure.

FIGS. 18*a-d* show aspects of an active loudspeaker in accordance with the present disclosure. FIG. 18*a* shows aspects of an active loudspeaker including a membrane actuator 1815 (including a voice coil, a suspension, etc.), a housing 1810 (coupled to the membrane actuator), one or more contacts 1825 (coupled to the housing), and an integrated circuit 1820, electrically coupled to the contacts 1825 and the membrane actuator 1815. In aspects, the integrated circuit 1820 may be integrated into the contacts 1825, and/or the housing 1810, etc.

The membrane actuator 1815 may include a voice coil, configured to accept a signal from the integrated circuit 1820 (e.g., a drive signal, a sensory signal, a test signal, etc.) so as to generate a movement therefrom (e.g., an excursion).

The integrated circuit 1825 may include and/or be coupled to one or more sensors (e.g., a capacitive sensor, an optical sensor, a thermopile, a pressure sensor, an infrared sensor, an inductive sensor, etc.). The sensor may be configured to measure one or more aspect of the membrane actuator 1815 (e.g., excursion, velocity, acceleration, force, temperature, temperature gradient, etc.).

Figure 18B:
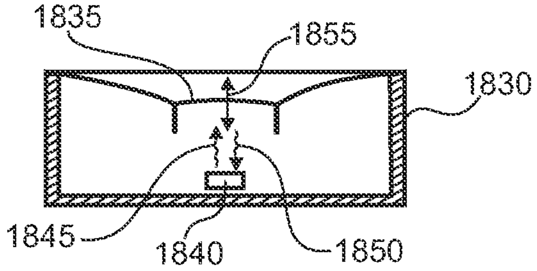

FIG. 18*b* shows aspects of an active loudspeaker in accordance with the present disclosure. The active loudspeaker includes a membrane actuator 1835 configured to move in a direction 1855 substantially perpendicular thereto, a housing 1830 coupled to the membrane actuator 1835 configured so as to form a cavity behind the membrane actuator, and an integrated circuit 1840 (e.g., a system on chip, a system in package, etc.) positioned so as to interface with one or more aspects of the membrane actuator 1835. The integrated circuit 1840 may include an optical source directed 1845 at one or more aspects of the membrane actuator 1835 and an optical detector configured to detect optical radiation 1850 directed thereupon. In aspects, the integrated circuit 1840 may include an optical control circuit and detection circuit configured to deliver test signals to the optical source and to obtain one or more feedback signals from the optical detector during operation. The integrated circuit 1840 may be configured to condition the received radiation 1850 to determine the movement 1855 of the membrane actuator 1835 during use (e.g., velocity, excursion, etc.). Thus the active loudspeaker may include a means for directly measuring excursion of the membrane actuator 1835 during use. Such a measurement may be compared with one or more predictive models and/or property trackers in accordance with the present disclosure to determine the most suitable predictive model, to enhance a control algorithm, etc. for use during control and/or protection of the loudspeaker.

In aspects, the excursion measurement may be compared against previously predicted excursion values for one or more models to ascertain the predictive quality of such models over a period of time (e.g., over a period of use). Such information may be useful in terms of selecting the best model for predicting future excursion, for excluding models which are poor predictors of excursion from analysis, for use in adapting a model so as to improve an excursion prediction, or the like.

Figure 18C:
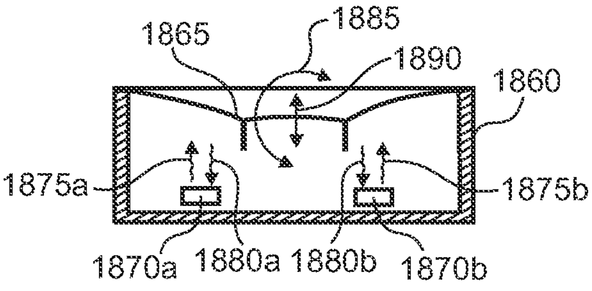

FIG. 18*c* shows aspects of an active loudspeaker including a plurality of optical sources and detectors (herein each shown integrated into an integrated circuit 1870*a,b*). The optical source may be configured to deliver radiation 1875*a,b* towards a membrane actuator 1865 in accordance with the present disclosure, and the optical detector may be configured to receive radiation 1880*a,b* from the direction of the membrane actuator 1865 (e.g., reflected off of the membrane actuator). The active loudspeaker may include a control circuit to modulate a control signal sent to the optical source so as to modulate the delivered radiation. The control circuit may include a demodulation circuit configured to extract the modulated signal from the optical detector 1870*a,b*. Variations in the demodulated signal may be related to one or more aspects of the velocity 1890 of at least a portion of the membrane actuator during use. Such a signal may be used by one or more aspects of an associated system (e.g., one or more aspects of a consumer electronic device, a control system, etc. in accordance with the present disclosure) as part of a loudspeaker control algorithm, linearization algorithm, protection algorithm, monitoring system, combinations thereof, or the like.

In aspects, signals obtained from each of the detectors 1870*a,b* may be compared in order to detect rotational deflection 1885 of the membrane actuator 1865 during use. The presence of a rotational deflection 1885 (e.g., a so-called "wobble" or rocking mode of the loudspeaker), may be provided to one or more subsystem such a protection algorithm, a controller, etc. in order to eliminate and/or minimize the rocking mode. Such a configuration may be advantageous for detecting rocking and higher degree of freedom modes that may be detrimental to overall loudspeaker performance and/or lifetime.

Figure 18D:
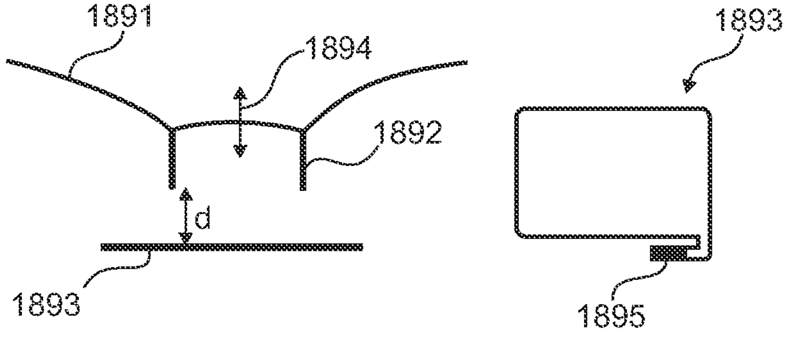

FIG. 18*d* shows aspects of an active loudspeaker in accordance with the present disclosure including an integrated circuit 1895 in accordance with the present disclosure, a membrane actuator 1891 and a pad 1893, capacitively coupled to one or more aspects of the membrane actuator 1891 and the integrated circuit 1895. The pad 1893 may be oriented near a voice coil 1892 (e.g., in the case of a voice coil loudspeaker based membrane actuator 1891), near an electrode (e.g., in the case of an electrostatic and/or electroactive membrane actuator), etc. The capacitive coupling between the pad 1893 and the membrane actuator 1891 may be an indication of the distance d between them during use. The integrated circuit 1895 may be configured to deliver a sensory signal to the pad 1893 (e.g., between the pad 1893 and one or more aspects of the membrane actuator 1891, 1892) so as to measure the capacitance therebetween. The capacitance may be configured so as to relate to the excursion 1894 of the membrane actuator 1891. The integrated circuit 1895 may be configured to generate one or more feedback signals from the capacitance reading. Such a signal may be used by one or more aspects of an associated system (e.g., one or more aspects of a consumer electronic device, a control system, etc. in accordance with the present disclosure) as part of a loudspeaker control algorithm, linearization algorithm, protection algorithm, monitoring system, combinations thereof, or the like.

In aspects, the integrated circuit 1820, 1840, 1870*a,b*, 1895 may be configured to drive the membrane actuator 1815, 1835, 1865, 1891 during use, via a power/input signal provided by an external source, via the contacts 1825. Thus, the active loudspeaker may be transparent to the rest of the system (e.g., treated much like an existing loudspeaker, but with internal compensation, and feedback provided/managed by the integrated circuit 1820, 1840, 1870*a,b*, 1895). In aspects, the integrated circuit 1820, 1840, 1870*a,b*, 1895 may include one or more controllers, property trackers, models, etc. in accordance with the present disclosure for providing control to and/or feedback from the associated membrane actuator 1815, 1835, 1865, 1891.

FIG. 19 shows aspects of a schematic of an active loudspeaker control system 1910 in accordance with the present disclosure. In aspects, one or more components of the active loudspeaker control system 1910 may be included into an integrated circuit in accordance with the present disclosure. FIG. 19 shows a control system 1910 for controlling a loudspeaker 1925 configured to accept an input audio signal (e.g., communicated with an external processor, controller, etc., which may be part of a digital communication signal, via I2S [Integrated Interchip Sound], and the like), and a power signal (e.g., from a power source, a battery, etc.). The control system 1910 may include a communication block 1940 configured to communicate one or more signals (e.g., the audio signal, a configuration signal, a sensory signal, a status signal, a power requirement, a power prediction, a power constraint, etc.) to/from an outside source (e.g., a processor, a communication subsystem, etc.). The communication block 1940 may be configured to communicate one or more of the signals with one or more aspects of the control system 1910. The control system 1910 may include a controller 1920 in accordance with the present disclosure. The controller 1920 may be configured to accept the input signal and/or one or more feedback signals or signals generated therefrom and to generate one or more control signals for use by one or more aspects of the system 1910. The system 1910 may include an amplifier (in this case, integrated into the controller) configured to accept the control signal and one or more feedback signals or signals generated therefrom and to generate a drive signal to drive an associated loudspeaker 1925. The system 1910 may include one or more sensory feedback blocks 1935, configured to measure and optionally convert one or more feedback signals from the loudspeaker 1925, membrane actuator, an embedded sensor, and/or one or more system components. In aspects, a drive signal sensory feedback block 1930 shown in FIG. 19 may be configured to monitor one or more aspects of the voltage and or current provided to the loudspeaker 1925 and to generate one or more feedback signals therefrom (e.g., filtered signals, band limited signals, raw signals, etc.). The system may include a sensory feedback block 1935 in accordance with the present disclosure configured to interface with one or more sensors and to generate one or more feedback signals or signals generated therefrom for use by one or more aspects of the system 1910 (e.g., by the communication block 1940, the controller 1920, for communication to an external system, etc.). One or more of the properties may be used as part of a control algorithm included in the controller 1920, a protection algorithm included in the controller 1920, and/or the amplifier, etc.

FIG. 20 shows aspects of a multi-temperature sensing configuration in accordance with the present disclosure. In aspects, the multi-temperature sensing may be provided by a control system and/or sensory feedback block in accordance with the present disclosure. A first temperature signal 2010 may be calculated from one or more aspects of a membrane actuator, loudspeaker, etc. by measuring one or more electrical properties therefrom (e.g., impedance, substantially DC resistance, etc.), and a second temperature signal 2020 may be calculated from one or more aspects of a membrane actuator, loudspeaker, etc. by measuring one or more physical properties therefrom (e.g., surface temperature, etc.), from within an associated enclosure, as part of an active loudspeaker, etc. In aspects, the physical property may be measured via one or more sensors coupled to the system. In aspects, the surface temperature of one or more aspects of the actuator/loudspeaker may be measured by a thermopile, infrared sensor, etc.

In aspects, the dual temperature sensor may be configured to determine the environmental heat transfer from the actuator/loudspeaker during use, to determine the state of thermal load on the actuator/loudspeaker, determine the thermal gradient between regions of the actuator/loudspeaker, determine when the actuator/loudspeaker may be near to a thermal equilibrium, to generate a differential control signal, etc. In one non-limiting example, a temperature difference between the first signal 2010 and the second signal 2020 in addition with the rate of change of the first or second signal 2010, 2020 may be configured to determine heat transfer in the vicinity of the membrane actuator, determine maximum excursion/heat transfer relationships, calculate heat transfer properties for the actuator, or the like. Such information may be advantageous to determine the maximum thermal operating levels for the loudspeaker, as well as the relationship between thermal changes in the loudspeaker versus input power throughout the lifetime of the loudspeaker (e.g., as such values may change over the lifetime of the loudspeaker).

FIGS. 21*a*-*b* show aspects of methods for updating an adaptive model in accordance with the present disclosure. FIG. 21*a* shows aspects of a method including playing an audio stream 2110 with the loudspeaker under test, measuring one or more sensory signals associated with the loudspeaker 2115 (e.g., via use of a series resistor, a sensor, etc.), generating one or more spectra from the measured signals 2120 (e.g., generation of a bass band spectrum, a mid-band spectrum, etc.), analyzing one or more of the spectra to determine frequency bands of interest therein (e.g., frequency bands including a significant signal level in relation to a threshold value/function), and updating an adaptive model 2125 using one or more of the analyzed spectra.

In aspects, the measured signals may include current through and voltage across a loudspeaker. The property may include impedance of the associated loudspeaker, etc. The generation of the spectra may be completed using an FFT, a multi-band filter and one or more averaging filters, etc.

FIG. 21*b* shows aspects of a decision making method to determine the immediate adaptation rates associated with the update process for an adaptive model in accordance with the present disclosure. The decision making method may include collecting data 2130, updating the model at a first rate 2135, assessing any changes in the model, and if a significant change is determined, perform an accelerated test 2140. Such a configuration may be advantageous for assessing dramatic changes in a loudspeaker or an environment surrounding the loudspeaker (e.g., placement of a finger over a loudspeaker vent, etc.), so as to rapidly respond to those changes, so as to prevent short term damage to the loudspeaker during use. In aspects, the accelerated test 2140 may include adding (e.g., superimposing) a test signal over top of the audio stream so as to guarantee that significant content will be generated in the spectral bands of interest as part of the assessment and adaptation process. In aspects, the accelerated test 2140 may include changing threshold levels, averaging times and the like in the sensor data processing algorithms in order to get less exact but quicker adaptive behavior.

Figure 22:
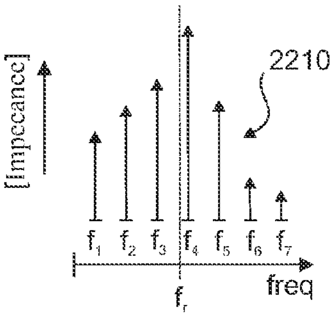
FIG. 22 shows aspects of a method for calculating one or more parameters from spectra in accordance with the present disclosure.

FIG. 22 shows aspects of a method for calculating one or more parameters from spectra in accordance with the present disclosure. The method includes calculating an approximate frequency $f_r$, associated with the peak of an impedance spectrum, excursion spectrum, etc. FIG. 22 shows an associated frequency response as measured at bands ($f_1$-$f_7$) over the frequency spectrum of interest. The individual band measurements are used as a weighted sum to calculate the weighted average of the frequency response. The weighted average may be used to calculate a reference frequency associated with the distribution of the spectrum, which may change with temperature, environment, etc. Such a reference frequency may be advantageous for inferring a change in temperature and/or environment during use of the loudspeaker in the field. In aspects, such a simplified method may be adapted to estimate the acoustic quality Q, and/or the bandwidth of a resonant peak of interest during use. In aspects, the acoustic quality may be estimated from the peak impedance at the resonant peak $f_r$, compared against the DC or near DC impedance in the spectrum (in practice that value may be obtained by measuring the impedance over the mid/high non-resonant frequency region of the spectrum, typically around 3000-5000 Hz for an electromagnetic microspeaker).

Figure 23A:
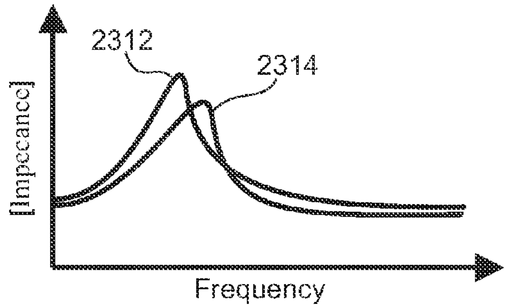
FIGS. 23*a-g* show aspects of techniques and relationships for deriving one or more speaker parameters and/or predicting the remaining lifetime of a loudspeaker in accordance with the present disclosure.

FIGS. 23*a*-*g* show aspects of techniques and relationships for deriving one or more speaker parameters and/or predicting the remaining lifetime of a loudspeaker in accordance with the present disclosure. FIG. 23*a* shows aspects of an impedance spectrum for a loudspeaker as measured at low temperature 2314 and at high temperature 2312 during use. In aspects, an active loudspeaker in accordance with the present disclosure may include a thermal sensor (e.g., a non-contact thermal sensor) to determine the temperature profile of a membrane actuator, voice coil, magnet, etc. during use. Such information may be combined with impedance readings to better select, enable use of, and/or adapt a model for use in one or more aspects of the system (e.g., a controller, a property tracker, etc.).

Figure 23B:
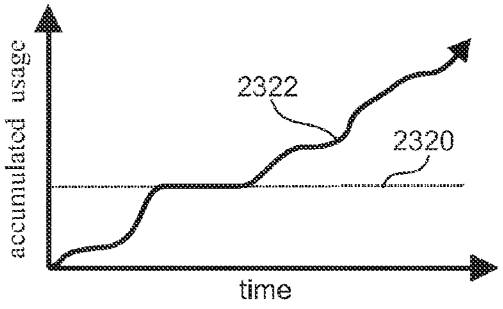

FIG. 23*b* shows aspects of an accumulated usage model, configured to estimate the weighted usage value 2322 to date, and/or remaining lifetime for a loudspeaker unit during use. The model may include a "stress" variable combined with a temporal component (e.g., so as to derive a stress—time factor relating to usage of the loudspeaker). The stress—time factor may then be integrated (e.g., leaky integrated) over time in order to form the accumulated weighted usage value 2322. In aspects, the resulting information may be used to determine periods of inactivity 2320 as well as periods of excessive use, or the like.

Figure 23C:
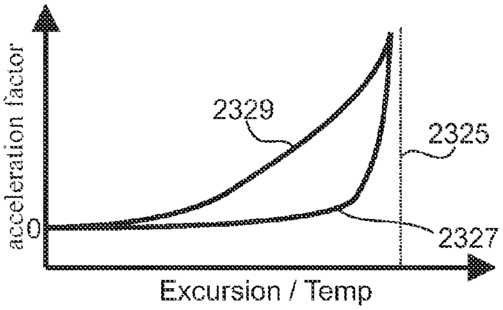

FIG. 23*c* shows aspects of a model for stress variables (e.g., age accelerating factors) for a loudspeaker. The Figure shows a thermal acceleration factor 2327 and an excursion acceleration factor 2329, which both monotonically increase towards a critical level 2325 beyond which damage may be immanent. Such values may be advantageous for calculating a weighted average of usage for an associated loudspeaker during use.

Figure 23D:
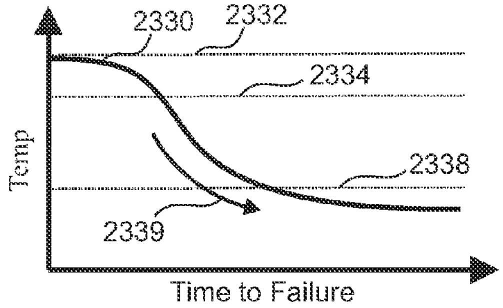

FIG. 23*d* shows aspects of an alternative thermal lifetime curve for a loudspeaker, outlining the relationship between cycles to failure and the operating temperature during use. The curve 2330 may be a master curve generated for a population of loudspeakers during a manufacturing process, field testing study, etc. In aspects, the curve may be compared against the running average temperature to date associated with the loudspeaker to estimate the remaining lifetime thereof. Some aspects of the peak allowable operating temperature 2332, the maximum temperature during transient operation 2334, and the average running temperature 2338 are highlighted for reference.

Figure 23E:
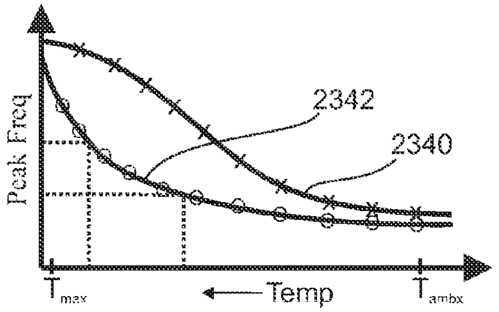

FIG. 23*e* shows aspects of a graphical relationship used to interrelate impedance 2340, 2342 measured at different excursion levels, related to temperature for a loudspeaker in accordance with the present disclosure. From an estimate of either two of the values, such an LUT may be used to estimate the $3^{rd}$ value of the triad.

Figure 23F:
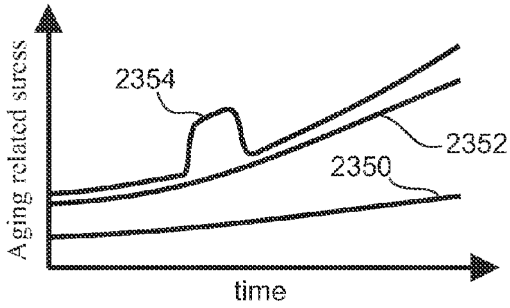

FIG. 23*f* shows aspects of age-related stress on a loudspeaker. FIG. 23*f* demonstrates a range of stress/time trajectories for "normal" operation of a loudspeaker in a family under a low temperature 2350 and a high temperature 2352 operating condition. FIG. 23*f* also illustrates a stress curve measured estimated for a particular sample device 2354 including an over stress event (e.g., a period of over excursion, physical impact, or increased temperature) that lead to a recoverable aging prediction for the system.

Figure 23G:
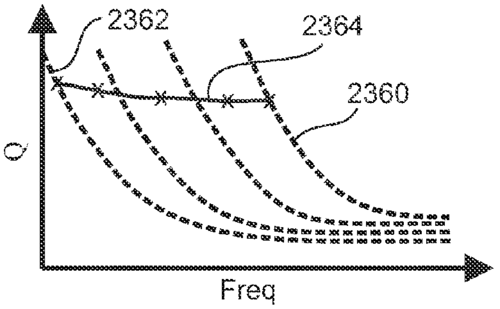

FIG. 23*g* shows aspects of an aging curve 2364 superimposed on a graphical representation of a frequency/acoustic quality model for a loudspeaker obtained at different operating temperatures 2360, 2362. In aspects, the trajectory of the aging curve, as measured in the space associated with the loudspeaker properties and environmental conditions, may be used to determine if a particular loudspeaker may be aging in a predictable manner, or if an event has altered the aging trajectory for the particular loudspeaker.

Figure 24:
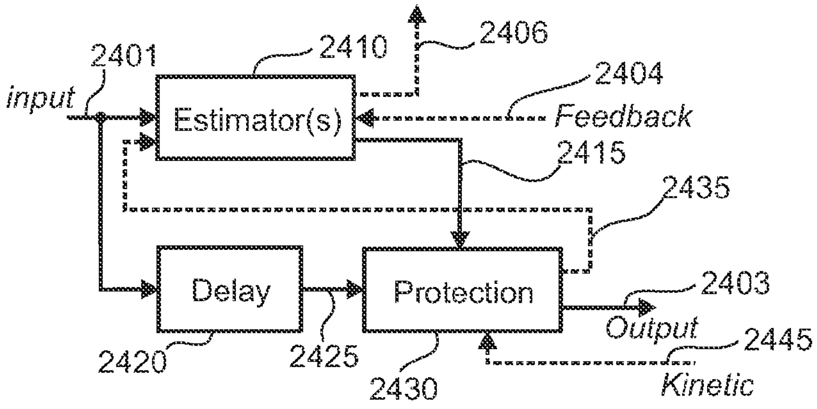
FIG. 24 shows a schematic of aspects of a speaker protection system in accordance with the present disclosure.

FIG. 24 shows a schematic of aspects of a speaker protection system in accordance with the present disclosure. The speaker protection system includes an estimator 2410 in accordance with the present disclosure, configured to accept an input signal 2401 and optionally a feedback signal 2404 and/or a post compressed signal 2435 and to produce an estimation signal 2415. The estimation signal 2415 may be representative of a loudspeaker parameter (e.g., voice coil excursion, a sound pressure level, a chamber pressure, etc.). In aspects, the estimator 2410 may be configured to produce the estimation signal 2415 without any form of feedback (e.g., without the optional feedback signal 2404 or the post compressed signal 2435). In aspects, the estimator (s) 2410 may be implemented in a purely feed forward configuration. Such an implementation may be advantageous for integration into a background service as provided to an operating system, etc.

In aspects, the speaker protection system may include a protection block 2430 configured to accept the input signal 2401 or a signal generated therefrom (e.g., such as a delayed input signal 2425), and the estimation signal 2415, and to produce an output signal 2403 for delivery to a loudspeaker, a driver circuit, or the like. In aspects, the protection block 2430 may be configured to accept a kinetic and/or kinematic feedback signal 2445 (e.g., an accelerometer output, gyrometer output, acceleration based interrupt, etc.) for use in generating the output signal 2403. In aspects, the kinetic and/or kinematic feedback signal 2445 may be an event driven interrupt (e.g., a binary signal relating to an event such as free fall, an impact, a maximum rotation rate, a rapid change in ambient conditions, a rapid change in altitude, etc.). In aspects, the protection block 2430 may be configured to limit the delayed input signal 2425 based upon one or more of the estimation signal 2415, the kinetic and/or kinematic feedback signal 2445, or the like.

In aspects, the post compressed signal 2435 may be compared with the feedback signal 2404, the input signal 2401, the delayed input signal 2425, or the like in order to estimate a loudspeaker parameter, adjust one or more estimation models, etc.

In aspects, the post compressed signal 2435 may be optionally used for feedback to an iterative prediction process. In aspects, such a signal may be connected to a matching compression block, ahead of the delay block 2420. Such a configuration may be advantageous for maintaining the feedback signal 2435 as part of a real-time prediction algorithm (e.g., using delays to keep blocks within the system working on the same time-stamped data).

In aspects, the estimator(s) 2410 may be configured to produce a power prediction 2406 in accordance with the present disclosure. The power prediction 2406 may be produced in parallel with the estimation signal 2415 (e.g., in parallel with an estimate for upcoming excursion, etc.). Such a power prediction 2406 may be advantageous for overcoming brownout concerns, compared with a power limit, etc. as part of a compression process, etc.

Figure 25A:
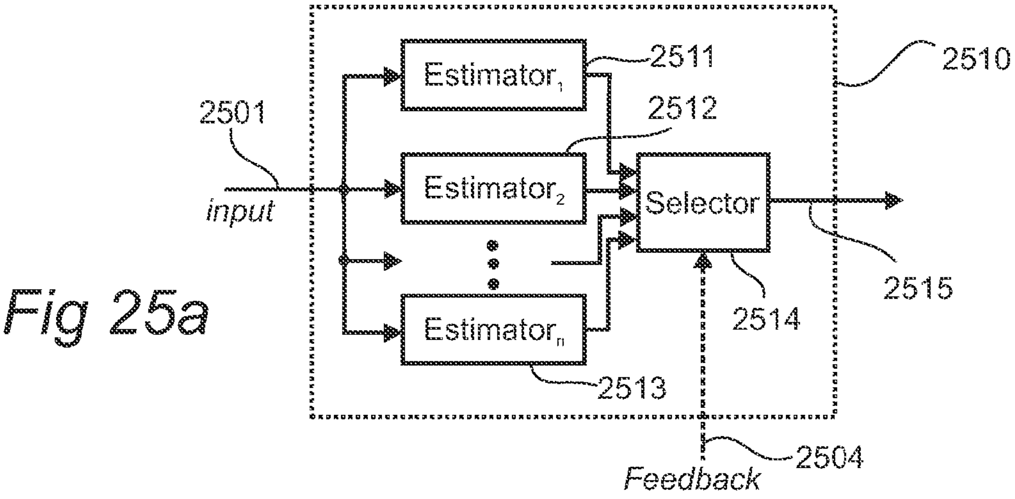
FIGS. 25*a-e* show aspects of excursion estimators each in accordance with the present disclosure.

FIGS. 25*a-e* show aspects of excursion estimators each in accordance with the present disclosure. FIG. 25*a* shows aspects of an estimator 2510 in accordance with the present disclosure, configured so as to accept an input signal 2501 and to generate an estimation signal 2515. The estimator 2510 includes one or more estimating models 2511, 2512, 2513, each configured to generate an estimate from the input signal 2501. In aspects, the estimating models 2511, 2512, 2513 may be linear small signal models configured to generate an estimate/prediction of a loudspeaker state (e.g., such as excursion, acceleration, power consumption, etc.) without significant computational requirements. In aspects, one or more of the estimating models 2511, 2512, 2513 may be derived from a model class described herein. In aspects, one or more of the estimating models 2511, 2512, 2513 may be configured so as to estimate the loudspeaker state as characterized during manufacturing testing of a family of devices (e.g., from sampled data taken from manufacturing lot data, from virtual test data, etc.). In aspects, one or more of the estimating models 2511, 2512, 2513 may be an adaptive model in accordance with the present disclosure.

In aspects, the estimator 2510 may include a selector 2514 configured to accept one or more outputs from the estimating models 2511, 2512, 2513 and to generate the estimation signal 2515 therefrom. In aspects, the selector 2514 may be configured to select the worst case output from the estimating models 2511, 2512, 2513 for use in the estimation signal 2515 (e.g., selecting output from one or more of the models to represent the estimation signal 2515). In aspects, the selector 2514 may be configured so as to output a function of the estimating model 2511, 2512, 2513 outputs (e.g., a linear combination, a weighted sum, a sum of absolute values thereof, etc.). In aspects, the selector 2514 may be configured to enable one or more models 2511, 2512, 2513 deemed to be most appropriate based upon a selection criteria (e.g., comparison to historical data, comparison with feedback or signals/characteristics obtained therefrom, comparison with device family histories, a higher order interpolation, etc.).

In aspects, the selector 2514 may be configured to accept a feedback signal 2504 (e.g., a measured current, impedance, voltage, excursion, etc.) to compare against one or more model outputs 2511, 2512, 2513 and/or co-processed characteristics (e.g., model processed current, impedance, voltage, excursion, power, etc. calculated in a model pair with each of the models 2511, 2512, 2513, etc.) so as to validate the selection process, to initiate a test, as feedback to a model adaptation process, or the like.

In aspects, the selector 2514 may be configured to enable or disable operation of one or more of the models 2511, 2512, 2513 (and optionally storing, for further testing, co-processed characteristics, such as, without limitation, model processed current) as part of the selection process. Such a configuration may be advantageous for reducing computational power while maintaining a high quality of protection for the associated loudspeaker.

Figure 25B:
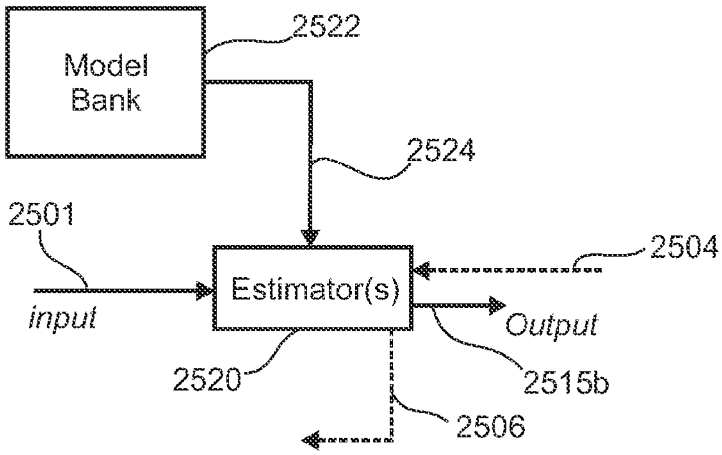

FIG. 25*b* shows aspects of an estimator 2520 in accordance with the present disclosure. The estimator 2520 is configured to accept an input signal 2501 or a signal generated therefrom and to produce an estimating signal 2515*b*. The estimator 2520 may be configured to accept one or more parameters 2524 (e.g., model parameters, filter coefficients, etc.), which may be loaded into the estimator from a model bank 2522. The model bank 2522 may include a plurality of models (e.g., parametric model parameters, filter coefficients, etc.) representative of the device in question. The loading process may be initiated by a test performed in accordance with the present disclosure. In aspects, such a test may be performed on the device (e.g., in combination with one or more forms of feedback). Alternatively, additionally, or in combination one or more aspects of the test may be performed remotely from the device (e.g., on a server, in a data center, in the cloud, at a test kiosk, etc.). In aspects, the model from the model bank may be selected via a feedback based comparison with one or more model characteristics and a characteristic of the device measured (e.g., derived from feedback) during operation in accordance with the present disclosure.

In aspects, the estimator 2520 may be configured to produce a power prediction 2506 in accordance with the present disclosure.

In aspects, the estimator 2520 may be configured to accept a feedback signal 2504 (e.g., a measured current, impedance, voltage, excursion, etc.) to compare against one or more estimated signals internal to the estimator 2520, and/or co-processed characteristics (e.g., model processed current, impedance, voltage, excursion, power, etc.) so as to validate the estimated output 2515*b*, to initiate a test, as feedback to a model adaptation process, or the like.

Figure 25C:
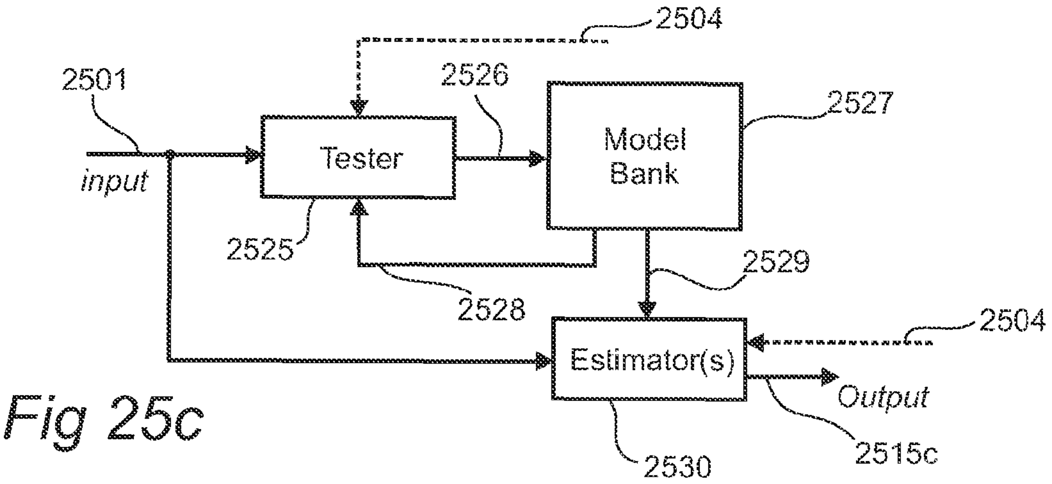

FIG. 25*c* shows aspects of an estimator 2530 in accordance with the present disclosure. The estimator 2530 may be configured to accept an input signal 2501 or a signal generated therefrom and to produce an estimating signal 2515*c*. The estimator 2530 may be configured to accept one or more parameters 2529 (e.g., model parameters, filter coefficients, etc.), which may be loaded into the estimator from a model bank 2527. The model bank 2527 may include a plurality of models (e.g., parametric model parameters, filter coefficients, etc.) representative of the device in question and optionally one or more model characteristics (e.g., impedance parameters, resonant frequency, acoustic quality, frequency response plots, etc.), which may be used to determine which model most closely fits a test measurement without requiring significant computational load.

The system may include a testing function 2525, configured to accept one or more feedback signals 2504, optionally in real-time, and/or optionally an input signal 2501 or a signal generated therefrom, in order to derive one or more measured characteristics, and compare them with one or more model characteristics 2528 to determine the nearest fitting model (or group of models). In aspects, the testing function 2525 may generate a selection signal 2526, an enable vector, a weighting function, etc. which may be used to select, enable, weight, update, and/or to generate a model from the model bank 2527 for loading into the estimator 2530, for enabling use thereof, or for use in conjunction with the estimator 2530. In aspects, the model characteristics may be compared to corresponding characteristics associated with the models included in the model bank 2527, so as to facilitate selection of the model(s) most closely representing the characteristic in question. Such model(s), model parameters, etc. may be loaded, activated, or the like in order to interact with the estimator 2530 processes.

In aspects, the estimator 2530 may run in parallel with any testing function 2525, etc. The loading/weighting process 2529 may be configured to include a transitional period whereby the updated model and/or weighting changes are slowly introduced so as to minimize the chance of audible transitions, over excursion events, etc. during the estimator update.

In aspects, the estimator 2530 may be configured as an observer in accordance with the present disclosure. In aspects, the observer may include an EKF, UKF configuration as described herein.

Figure 25D:
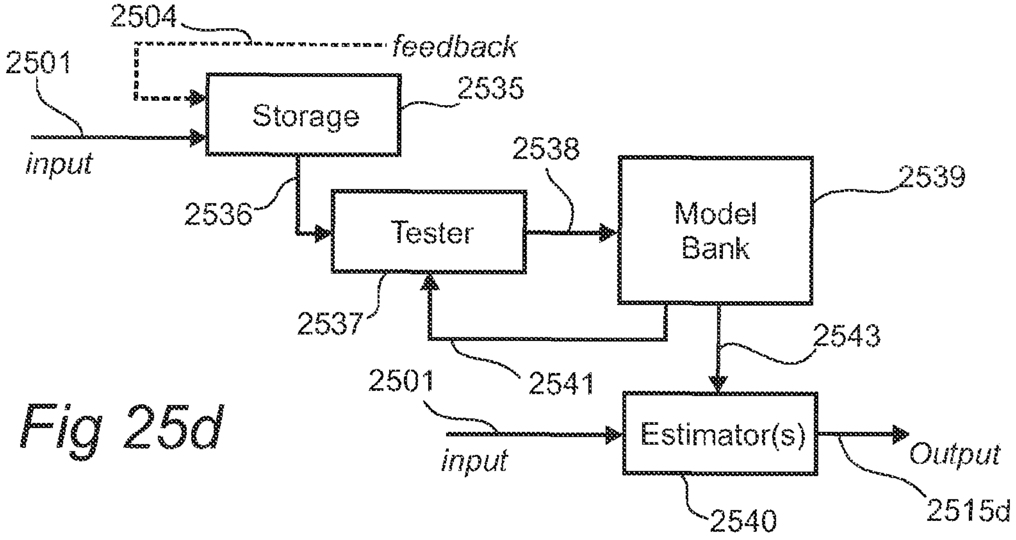

FIG. 25*d* shows aspects of an estimator 2540 in accordance with the present disclosure. The estimator 2540 may be configured to accept an input signal 2501 or a signal generated therefrom and to produce an estimating signal 2515*d*. The estimator 2540 may be configured to accept one or more parameters 2543 (e.g., model parameters, filter coefficients, weighting functions, etc.), which may be loaded into the estimator from a model bank 2539. The model bank 2539 may include a plurality of models (e.g., parametric model parameters, filter coefficients, etc.) representative of the device in question and optionally one or more model characteristics (e.g., impedance parameters, resonant frequency, acoustic quality, frequency response plots, etc.), which may be used to determine which model most closely fits a test measurement without requiring significant computational load.

In FIG. 25*d*, the input signal 2501 and/or feedback signals 2504 may be loaded into storage 2535, so as to form a signal history (e.g., a FIFO signal history, a retained test outcome, etc.). The signal history 2536 may be employed within a testing block 2537 so as to perform a test over a substantial dataset, average test results over a dataset, etc. In aspects, the testing block 2537 may be configured to accept or interact with one or more characteristics 2541 obtained and/or stored along with the models in the model bank 2539. In aspects, the signal history 2536 may be offloaded from a device (e.g., offloaded from a phone to a datacenter), where one or more tests may be performed and an updated model may be downloaded to the device (e.g., from a datacenter to a phone). Such an implementation may be advantageous for leveraging the computational resources of a datacenter, and/or signal histories and test results from a plurality of related devices (e.g., potentially from an entire device population), in assessing an estimator 2540 update, without relying heavily on device resources. In aspects, the testing block 2537 may be configured to calculate one or more parameters or characteristics 2538 (e.g., a measured characteristic) for comparison against one or more models in the model bank 2539. A resulting model, filter coefficients, weighting function, etc. may then be loaded into the estimator 2540, based upon this comparison as part of an updating or adaptation process thereupon.

Figure 25E:
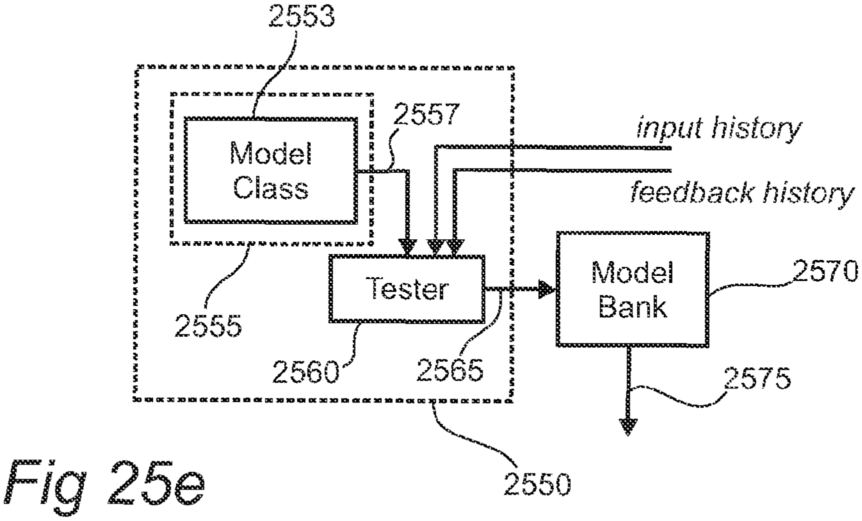

FIG. 25*e* shows aspects of a testing and loading a function, coefficients, weights, etc. into an estimator in accordance with the present disclosure. The testing function 2560 may be configured to accept an input history, a feedback signal history, etc., and one or more characteristics, coefficients, and/or features 2557 from one or more models in a model class 2553, and to calculate one or more characteristics for comparison against a class of models 2553. The testing function 2560 may determine a suitable model, weights, etc. for estimating one or more loudspeaker states for an individual device, group of devices, etc. and may load a model, a sub-class of models, etc. onto the device, or group of devices, each including an estimator in accordance with the present disclosure. In aspects, such a testing function 2560 may output a group of models, features, characteristics, weighting functions, etc. for uploading 2565 into a model bank 2570 (e.g., located on a device, in a cloud, attached to a user profile, etc.). In aspects, the estimator may be configured to accept one or more parameters 2575 (e.g., model parameters, filter coefficients, etc.), which may be loaded into the estimator from the model bank 2570. The model bank 2570 may include a plurality of models (e.g., parametric model parameters, filter coefficients, etc.) representative of the device in question and optionally one or more model characteristics (e.g., impedance parameters, resonant frequency, acoustic quality, frequency response plots, biquad filter coefficients, weighting functions, etc.), which may be used to determine which model most closely fits a test measurement without requiring significant computational load.

In aspects, the estimator may run in parallel with any testing function 2560, etc. The loading process 2565 may be configured to include a transitional period whereby the updated model and/or weights are slowly introduced so as to minimize the chance of audible transitions, over excursion events, etc. during the estimator update.

In aspects, one or more components of the testing and/or updating procedure may be offloaded from the device 2550, 2555. In aspects, the testing and/or updating procedures may be performed in a data center, on a server, a cloud service, etc. In aspects, the testing procedure may be virtualized in accordance with the present disclosure (e.g., enhanced through additional statistical modeling, tolerance variation testing, cross population testing, testing within product manufacturing group IDs, etc.).

The loading process may be initiated by a test in accordance with the present disclosure. In aspects, such a test may be performed on the device (e.g., in combination with one or more forms of feedback).

In aspects, the testing procedure may be part of a quality control system in accordance with the present disclosure. The quality control system may be configured to periodically collect signal histories from devices in the field (e.g., post sales) and generate one or more characteristics therefrom. Some non-limiting examples of such characteristics include loudspeaker impedance, acoustic quality, resonant frequencies, impedance on resonance, thermal-impedance relationships, compliance, property trends, usage history, event logs, environmental history, kinetic history (e.g., movement/impact history of the device), etc. Such information may be used to update lifetime models specific to a particular device (e.g., due to a combination of usage scenario, measured properties, environmental history, etc.).

In aspects, such models may be used to predict lifetime of a particular device. In particular, such models may be used to update the estimator and/or protection features of a particular device in order to extend the service lifetime thereof. Such changes may include increasing the clamping effects on a loudspeaker associated with a particular device, so as to extend the lifetime thereof, uploading a compressor model thereto, altering an event functional characteristic, updating an estimator, etc.

In aspects, such a quality control system may be valuable in updating families of device, reducing returns, improving customer satisfaction, catching potential problems before they arise, debugging field related failures, assisting with next generation device design, etc.

Figure 26A:
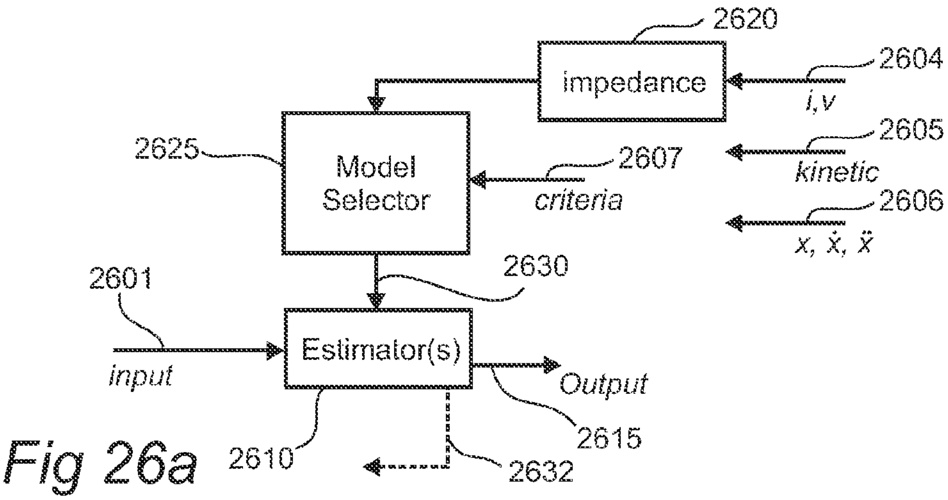
FIGS. 26*a-c* show aspects of a speaker protection system in accordance with the present disclosure.
Figure 26B:
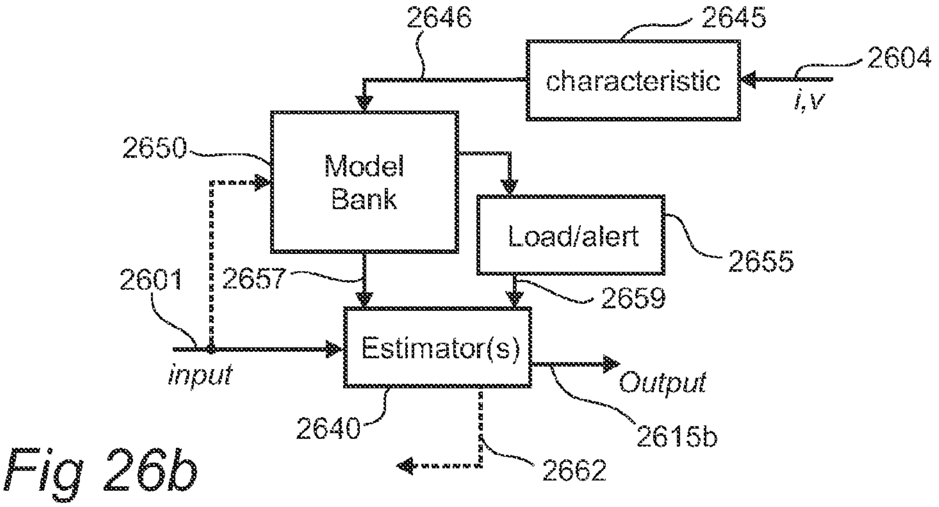
Figure 26C:
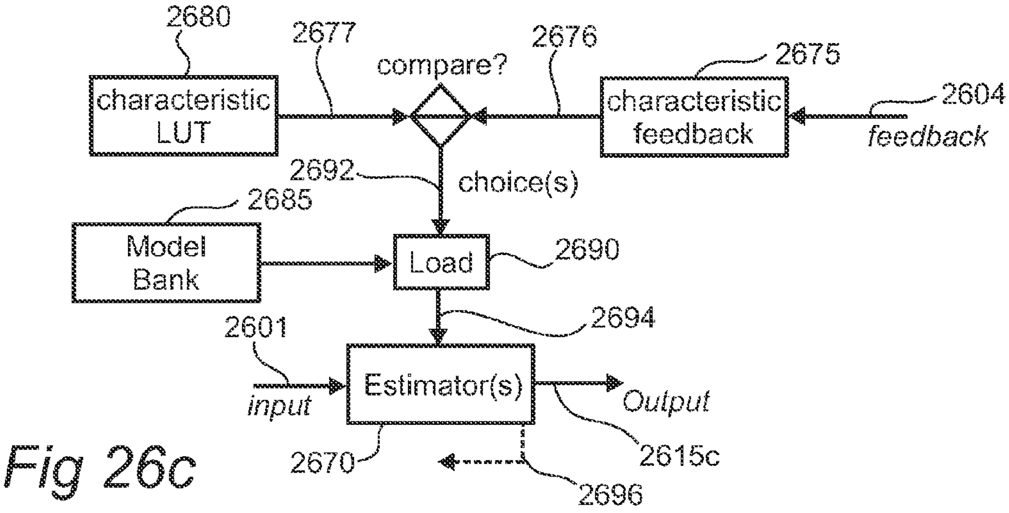

FIGS. 26*a-c* show aspects of a speaker protection system in accordance with the present disclosure. FIG. 26*a* shows aspects of a feedback block 2620 (e.g., which may be included within a testing block in accordance with the present disclosure, etc.). The feedback block 2620 may be configured to accept one or more feedback parameters for use in an associated estimator 2610, protection block, testing function, etc. Some non-limiting examples of feedback signals include current, voltage 2604, transducer movement 2606 (e.g., measured excursion, estimated from a light-based sensor, a capacitive sensor, velocity, acceleration thereof, etc.), a kinetic and/or kinematic feedback signal 2605 (e.g., an impact signal, one or more movement variables associated with the host CED, etc.), an orientation signal, an altitude, an environmental signal, a humidity signal, etc. Such feedback may be used alone or in combination to generate a characteristic for comparing precision of fit for a group of models (e.g., an impedance measurement, a near DC resistance measurement, a temperature estimate, an impedance parameter, a resonant frequency, quality factor, bandwidth, etc.). Such characteristics may be used within a model selector 2625 to weight, load, and/or adapt 2630 one or more estimation models so as to best fit the present loudspeaker configuration in question. An associated estimator 2610 in accordance with the present disclosure may run in parallel with the feedback and model selection process, configured to accept an input 2601 and produce an output 2615 associated with the present, future, or block of state values associated with the loudspeaker in question. In aspects, the estimator 2610 may be configured to provide a power estimate/predictor 2632 in accordance with the present disclosure.

In aspects, the group of models may generate estimates of the feedback signals from the input signals 2601, and the model selector 2625 may compare the estimates against the feedback signals 2604 for purposes of selecting the associated model to run within the estimator 2610. In aspects, a current measurement may be used as the feedback signal 2604, the group of models may be a group of current-estimating models, each configured to generate a feed-forward estimate of loudspeaker current within a characteristic frequency band from the input signal 2601. The estimated currents may be compared with the measured current to determine which model in the group is most accurate over any given time period. The model selector 2625 may select the excursion model associated with the most accurate current-estimating model for use in the estimator 2610 as part of the speaker protection system. In aspects, the model selector 2625 may be configured to generate a weighting function or interpolation function across multiple models, for use within the estimator 2610 (e.g., so as to best fit an excursion estimate from a plurality of parallel running excursion models).

In aspects, the estimator 2610 may include a plurality of feed forward models, each predicting an output signal 2615 associated with the input 2601. In aspects, the model selector may be configured to compare estimator 2610 values, compare feedback predictions 2620 against the feed forward models, etc. in order to weight, select, enable, and/or modify the models so as to provide a sufficiently representative output signal 2615 while preserving computational power, relaxing real-time feedback requirements, and minimizing hardware requirements for the system.

In aspects, the model selector 2625 may be configured to accept one or more performance limitation criteria (e.g., a thermal model, an excursion limitation, a power consumption limitation of the associated device [e.g., a configurable criteria], a power constraint delivered from a power manager, etc.) for use in the selection process, determining a model fit, etc.

FIG. 26*b* shows aspects of a speaker protection system in accordance with the present disclosure. The speaker protection system includes a characteristic extraction block 2645, configured to derive one or more measured characteristics 2647 from one or more feedback signals 2604 each in accordance with the present disclosure. The extraction process may be periodic (e.g., updated every few seconds, minutes, days, etc.), or slowly varying function updated from a continuous stream of data. In aspects, the extraction process may be performed in an OS setting with unreliable latency (e.g., a non-RT OS setting).

In aspects, the characteristic extraction block 2645 may include a collection of bandpass or notch filters, each filter may be configured so as to assess a signal 2604 over a limited bandwidth. Output from the collection of filters may be representative of the frequency content of feedback signal, or of generated signals (e.g., an impedance signal). In aspects, the output from the collection of filters may be configured so as to determine a frequency associated with a resonant peak in the impedance spectrum of the impedance signal. Such a determination may be made by comparing the low pass filtered absolute values (or squares) of the outputs from the collection of filters. Such a configuration may be suitable for extracting a characteristic (e.g., a characteristic frequency of the impedance of the device), in pseudo real-time without significant computational resources.

In aspects, the characteristic may be used as part of a look up procedure, comparison, weighting algorithm, etc. in order to select, enable, update, and/or calculate model or filter coefficients, parameters, or the like to be loaded 2657, 2659 into an estimator 2640 in accordance with the present disclosure. An associated estimator 2640 in accordance with the present disclosure may run in parallel with the feedback and model selection process, configured to accept an input 2601 and produce an output 2615*b* associated with the present, future, or block of state values associated with the loudspeaker in question. In aspects, the estimator 2640 may be configured to provide a power estimate/predictor 2662 in accordance with the present disclosure.

In aspects, the group of models included in the model bank 2650 may be configured to generate estimates of the feedback signals and/or characteristics from the input signals 2601, and a comparison between the estimates and the feedback be used to select which associated state estimating models may be loaded and/or configured to run within the estimator 2640.

In aspects, a current and voltage measurements may be used as the feedback signal 2604, the group of models may be a group of current-estimating models, each configured to generate a feed-forward estimate of loudspeaker current within a characteristic frequency band from the input signal 2601 and each associated with an excursion model, which can be loaded and/or enabled to run within the estimator. The estimated currents may be compared with the measured current to determine which model in the group is most accurate over any given time period. The excursion model associated with the best fit current-model may be loaded 2657, 2659 into the estimator 2640 as part of the speaker protection system. A load/alert block 2655 may be configured to overview the transition process, weight the incoming and outgoing models in order to smooth the model transition, etc.

FIG. 26*c* shows aspects of a speaker protection system in accordance with the present disclosure. The speaker protection system includes a look up table based comparison between a measured characteristic 2676 and characteristics 2677 associated with a model bank 2685 in accordance with the present disclosure. In aspects, the characteristics 2677 may be stored in a characteristic LUT 2680 associated with the models in the model bank 2685. The LUT 2680 may be used to determine which model to load 2690 in to an associated estimator 2670 in accordance with the present disclosure. An associated estimator 2670 in accordance with the present disclosure may run in parallel with the feedback and model selection process, configured to accept an input 2601 and produce an output 2615*c* associated with the present, future, or block of state values associated with the loudspeaker in question. In aspects, the estimator 2640 may be configured to provide a power estimate/predictor 2696 in accordance with the present disclosure. The measured characteristic(s) 2676 may be generated via a characteristic extraction block 2675, and one or more feedback signals 2604 each in accordance with the present disclosure.

Figure 27A:
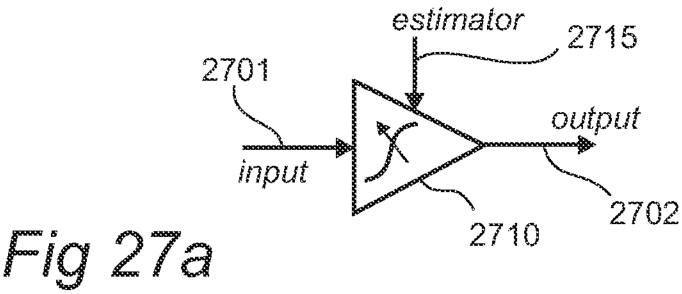
FIGS. 27*a-c* show aspects of a speaker protection system in accordance with the present disclosure.
Figure 27B:
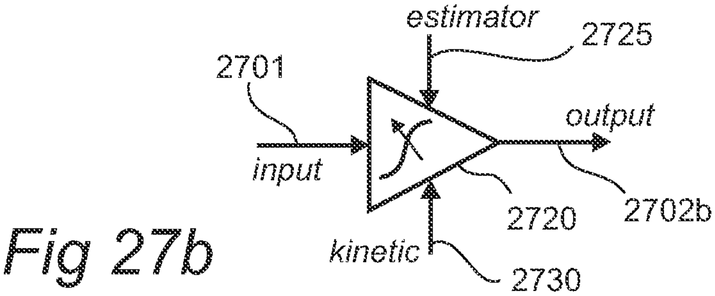
Figure 27C:
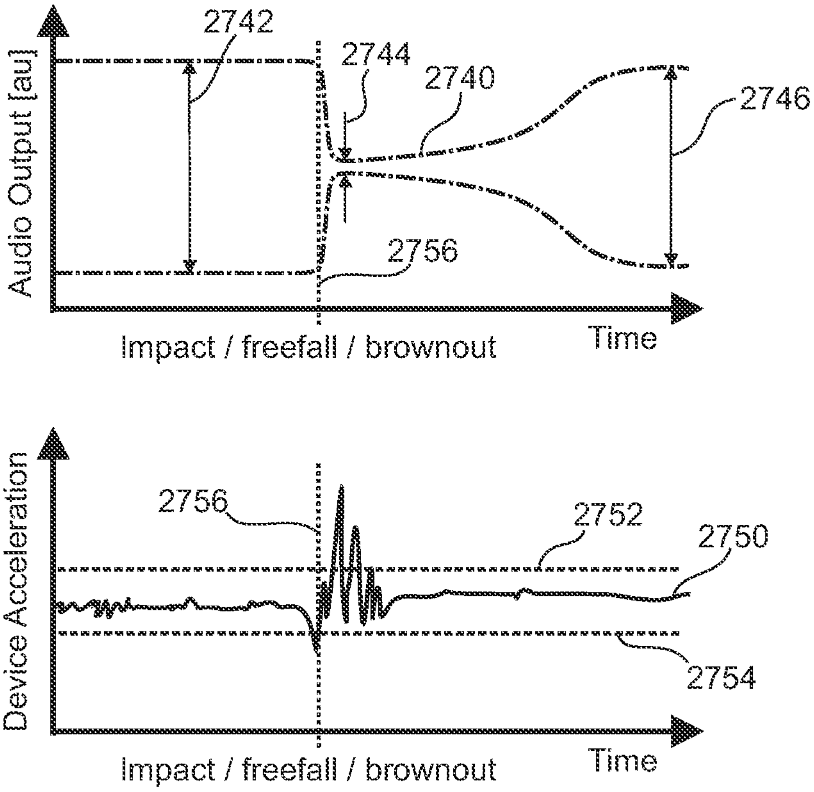

FIGS. 27*a-c* show aspects of a speaker protection system in accordance with the present disclosure. FIG. 27*a* shows aspects of a compressor function 2710 included in a protection block in accordance with the present disclosure. The compressor function 2710 may be configured to accept a signal 2701 (e.g., an input signal or a signal generated therefrom) and an estimating signal 2715. In aspects, one or more functional relationships within the compressor function (e.g., such as gain, rails, compression falloff, etc.), may be dependent upon the estimating signal 2715. In aspects, the gain may be set to a predetermined value for estimating signals 2715 of less than a threshold value. When the estimating signal increases beyond the threshold value, the gain may be decreased so as to clamp the output 2702 of the compressor function in a single or multi-band compressor/limiter structure.

FIG. 27*b* shows aspects of a compressor function 2720 included in a protection block in accordance with the present disclosure. The compressor function 2720 may be configured to accept a signal 2701 (e.g., an input signal or a signal generated therefrom), an estimating signal 2725, a kinetic and/or kinematic feedback signal 2730, and/or an additional form of feedback (e.g., usage history, environmental feedback signal, etc.) each in accordance with the present disclosure. One or more functional relationships within the compressor function 2720 (e.g., such as gain, limits, fall off, knees, etc.), may be dependent upon one or more of the estimating signal 2725, the feedback signals 2730, etc. In aspects, the kinetic feedback signal 2730 may include an event driven interrupt (e.g., a binary signal relating to an event such as free fall, an impact, a maximum rotation rate, a rapid change in ambient conditions, a rapid change in altitude, etc.) suitable for transitioning one or more properties of the compressor function 2720 so as to limit the output 2702*b* therefrom, during and/or for a period following such an event. Such an implementation may be advantageous for limiting development of spurious modes (e.g., rocking modes, etc.) that may occur in an associated loudspeaker during a combination of a kinetic event and large excursion.

FIG. 27*c* shows aspects of a time history of a kinematic feedback signal 2750 and a compressor output of an audio stream 2740 (envelop shown for clarity). The kinematic feedback signal 2570 indicates an impact event at time $t_0$ 2756. Upon receipt of the signal, the compressor function rapidly clamps the audio output thereof (e.g., reduces the envelope from a normal operating amplitude 2742, to a safe operating amplitude 2744) and slowly recovers the gain back to a preconfigured value 2746. Such a configuration may be advantageous in helping a loudspeaker to survive an impact event, preventing a loudspeaker from entering into a rocking mode during and/or immediately after an impact event, etc.

In aspects, the system may include a multi-band compressor structure with slow release (so as to minimize the pumping effect on the sound). An excursion estimating function and/or limiter may be focused on an excursion prone band (e.g., up to 1 kHz, 2 kHz, 4 kHz, etc.). Such a configuration may be advantageous for allowing the multi-band structure to work more aggressively while the excursion limiter less so and with less aggressively changing the audio signature while providing acceptable safety limits.

In aspects, the excursion limiter in the protection block may be configured with a very short release-time (e.g., essentially a soft-clipping of the excursion peaks).

Figure 28A:
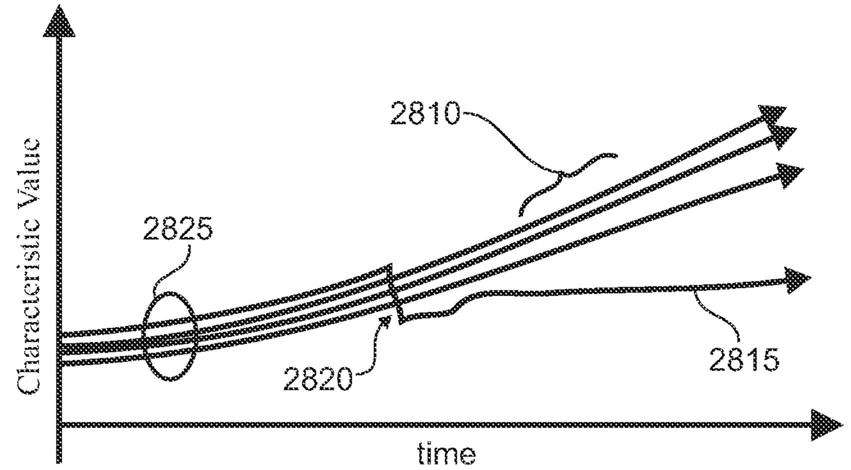
FIGS. 28*a-b* show aspects a model selection process in accordance with the present disclosure.
Figure 28B:
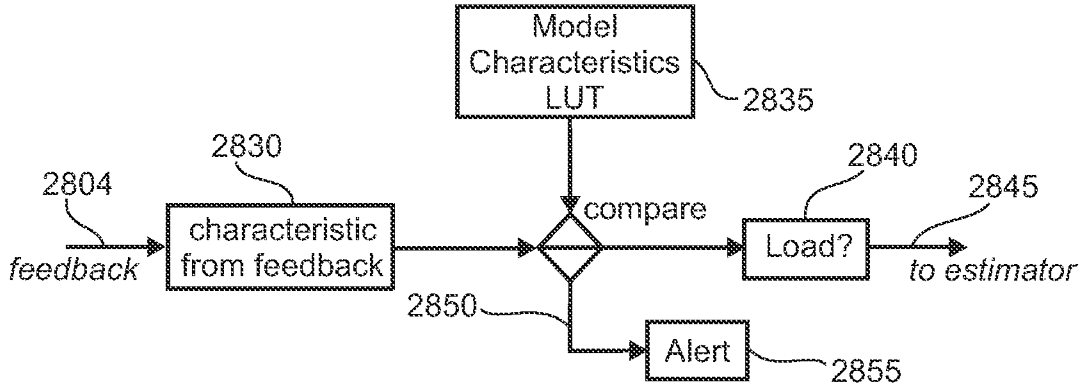

FIGS. 28*a-b* show aspects a model selection process in accordance with the present disclosure. FIG. 28*a* shows a time series of a measured characteristic 2810 (e.g., such as a characteristic frequency, a non-linearity, a distortion parameter, etc.) over a long period of time, for multiple devices. As can be seen in FIG. 28*a*, early in the life of the devices 2825, both characteristics follow similar aging trajectory. At some point in time in the field, one device 2815 experiences an event 2820 (e.g., a device failure event, an impact, etc.) and the characteristic trajectories diverge. One or more test procedures in accordance with the present disclosure may be configured to detect such an event 2820 and report the event to a quality service, issue a device specific update (e.g., reduce loudspeaker output so as to prevent further damage), initiate a repair request, alter an associated speaker protection algorithm, clamp audio output to the speaker to preserve remaining service life, etc.

FIG. 28*b* shows aspects of a model selection process in accordance with the present disclosure. A model bank 2835 including models associated with normal operation, with operation that is known to lead to eventual failure, and/or with models associated with known failure modes are made available for reference to measured characteristics obtained from measured feedback signal(s) 2804. The measured characteristics 2830 may be compared against aspects of the model bank 2835 to determine a suitable model to load 2840 into an estimator in accordance with the present disclosure. The comparison may further be used to determine one or more states of the device (e.g., normal operation, progressing towards failure, failed), etc. Such comparison may be used to signal 2850 an associated alert system 2855 in order to issue a repair statement, identify a recall candidate, indicate a stress event has occurred, initiate changes to a lifetime estimation algorithm, send a message to a user, etc.

In aspects, an estimator, a compressor, or an adaptive control system in accordance with the present disclosure interacting therewith may include a control strategy based upon one or more of adaptive control, hierarchical control, neural networks, Bayesian probability, backstepping, Lyapunov redesign, H-infinity, deadbeat control, fractional-order control, model predictive control, nonlinear damping, state space control, fuzzy logic, machine learning, evolutionary computation, genetic algorithms, optimal control, model predictive control, linear quadratic control, robust control processes, stochastic control, combinations thereof, and the like. In aspects, the estimator, compressor, or adaptive controller may include a full non-linear control strategy (e.g., a sliding mode, bang-bang, BIBO strategy, etc.), as a linear control strategy, or a combination thereof.

In aspects, the estimation and/or compression process may be configured in a fully feed-forward approach (e.g., as an exact input-output linearization controller, a linear filter, a linear phase filter, a minimum-phase filter, a set of bi-quad filters, etc.). Alternatively, additionally or in combination, one or more aspects of the estimator and/or compressor may include a feed-back controller (e.g., a nonlinear feedback controller, a linear feedback controller, a PID controller, etc.), a feed-forward controller, combinations thereof, or the like.

In aspects, one or more of the feedback signals may be obtained from one or more aspects of an associated audio system. Some non-limiting examples of feedback signals include one or more temperature measurements, impedance, drive current, drive voltage, drive power, one or more speaker-related kinematic measurements (e.g., membrane or coil displacement, velocity, acceleration, air flow, etc.), sound pressure level measurement, local microphone feedback, ambient condition feedback (e.g., temperature, pressure, humidity, etc.), kinetic measurements (e.g., force at a mount, impact measurement, etc.), B-field measurement, combinations thereof, and the like.

The states may be generally determined as input to the protection block. In aspects, one or more states may be transformed so as to reduce computational requirements and/or simplify calculation of one or more aspects of the system.

In general, the fundamental mode of the speaker cone (e.g., the fundamental resonant frequency), may be determined by using a chirp signal that starts as a low frequency sine wave and increases the frequency with time until it reaches a desired end frequency. The impedance may be calculated by capturing the driver output current and (optionally) voltage during such testing. An approximate function of the loudspeaker coil impedance may be acquired by linearization around the equilibrium point. The approximation may be valid for small signals relating to small cone excursions. By using that, it may be possible to match a measured impedance curve to it to calculate adequate starting speaker parameters.

In aspects, a control system or loudspeaker protection system in accordance with the present disclosure may be configured to calculate a power delivery value during use thereof. The power delivery value may be an early indicator of an impending thermal spike and/or excursion. In aspects, a control system in accordance with the present disclosure may be configured to accept the power delivery value and to utilize the power delivery value in one or more control algorithms (e.g., as part of a compressor, as part of a distortion correction algorithm etc.), one or more models (e.g., an observer, an excursion prediction algorithm, etc.), and/or one or more speaker protection algorithms (e.g., as a transient load predictor, in combination with one or more temperature measurements, etc.). In aspects, the power delivery value may be used in combination with one or more temperature and/or impedance readings in order to provide an early alert algorithm to avoid damage (thermal, mechanical, etc.) of the loudspeaker during use. In one non-limiting example, a control system in accordance with the present disclosure may be configured to limit the output signal to an associated loudspeaker in accordance to the power delivery value (e.g., the overall power consumption of the speaker, the time averaged power consumption of the loudspeaker, the spectrally modified power consumption of the loudspeaker, etc.).

In aspects, a control system and/or loudspeaker protection system in accordance with the present disclosure, may be configured to forecast a lifetime (e.g., an overall expected lifetime, a remaining lifetime, or the like) for a loudspeaker during use. The lifetime forecast may be configured to accept one or more stress indicators (e.g., temperature, excursion, power consumption, environmental stresses [e.g., ambient temperature, humidity, etc.], accelerations [e.g., drop stresses, etc.], combinations thereof, and the like) during use. In aspects, a forecast may be formed in part by creating and/or accepting one or more timestamps (e.g., an initial startup date, a warranty date, the present date, total on-time to date, he minimum allowable run time of the loudspeaker until expiration of a warranty, etc.) associated with the use of the loudspeaker.

In aspects the forecast may be configured to calculate a stress-time accumulator associated with the history of the usage of the loudspeaker to a present point in time. In one non-limiting example, a stress-time accumulator may be calculated by integrating (e.g., leaky integrating, accumulating, etc.) a stress function over time so as to generate an increasing numerical value. In aspects, the stress function may be dependent on the associated loudspeaker family, and/or may be generated from one or more lifetime tests performed on a given family of loudspeakers (e.g., a function created during one or more lifetime tests thereof, a function created from one or more accelerated lifetime tests during product development/manufacturing/field testing, or the like, one or more field recall assessments [e.g., field based reports on stress-time accumulation to failure from a related product population, etc.]). In aspects, the present stress-time accumulator may be assessed at any time during the usage of the device for use in the lifetime prediction (e.g., as part of a method and/or system to determine the remaining life thereof).

In aspects, the stress-time accumulator may be a measure of the usage severity of the associated loudspeaker over the lifetime thereof. In making a prediction of the remaining lifetime, one or more aspects of the system may compare one or more time stamps with the stress-time accumulator, one or more stress functions, and/or one or more lifetime tests to generate a lifetime ratio of the usage to date versus a maximal usage to failure.

In aspects, the maximal usage to failure may be determined based on one or more speaker family accelerated lifetime tests, field recall data, etc. The maximal usage to failure may include one or more safety factors to ensure that an acceptable percentage of the loudspeaker family would survive until such a level during use (e.g., 96% of all loudspeakers in the family, 99% of the loudspeakers, etc.).

Thus, the ratio may be used to predict remaining lifetime of the loudspeaker, based upon the stress-time accumulator at a present moment in time.

In aspects, the lifetime ratio may be compared with one or more timestamps in order to predict how much time may be left to failure of the associated loudspeaker. In aspects, the ratio may be used as a control and/or protection parameter to limit the maximal stress that a loudspeaker may be put under during future usage, in order to extend the minimal expected lifetime thereof beyond a predetermined point in the future (e.g., until after a warranty expiration, until a predetermined time from purchase, until a predetermined maximal usage, etc.).

By way of non-limiting example, a first customer may heavily use a loudspeaker in accordance with the present disclosure when the loudspeaker is first put into service. Based upon the stress-time accumulator, a speaker protection algorithm in accordance with the present disclosure may limit the maximal stress levels that the first customer can continue to place the loudspeaker under going forward, so as to extend the lifetime thereof to beyond a timestamp in the future. By way of non-limiting example, a second user may intermittently use a loudspeaker in accordance with the present disclosure at high stress levels but only over short periods at a time up until a present time period. Based upon the stress-time accumulator after a given period of time, a forecast may be made to determine that the usage profile for the second customer may result in an adequately long lifetime for the associated loudspeaker, thus a speaker protection algorithm in accordance with the present disclosure, may leave the maximal stress levels at the factory settings.

A forecast in accordance with the present disclosure, may be used in combination with one or more long term lifetime planning algorithms (e.g., so as to manage the lifetime of a component, a loudspeaker, etc.), as part of a service contract dispute (e.g., so as to determine if the usage profile of a customer was within a contractual limit), as part of a diagnostic and/or forensic test (e.g., to determine when/why a loudspeaker failed in service), combinations thereof, and the like.

In aspects, the forecast may be used as part of a usage profile calculation (e.g., so as to characterize the usage profile of a customer). The usage profile may be used to calculate one or more fatigue related damage accumulation, fatigue life calculations, temperature and excursion limits, combinations thereof, and the like. The usage profiles may then be used to limit loudspeaker response, only if the over-use thereof is expected to lead to a diminution of the lifetime thereof within a warranty period, etc.

In aspects, the absolute maximums in addition to the dynamic aspects that look at a ratio of dwell time and power/temperature levels to ensure speaker safety.

In aspects, an additional observer may be configured to predict the excursion of the loudspeaker from a combination of the input signals and feedback signals derived from the loudspeaker and/or sensory feedback blocks in accordance with the present disclosure. Such a configuration may be advantageous for predicting excursion issues before they arise in practice, so as to clamp down on the drive signals before an excursion limit is hit (thereby avoiding damage to the associated loudspeaker).

In aspects, the resonant frequency of a speaker may be mapped to the spectral impedance curve of an associated loudspeaker in accordance with the present disclosure. By design an adaptive filter following the resonant peak based on the impedance curve, said resonant peak of the speaker can be suppressed. The resulting system may be advantageous for protecting a speaker with a behavioral model that is consistent for one or more aspects of frequencies, over changing temperature, aging fatigue etc.

In aspects, methods for recalculating these curves (and the temperature/amplitude dependence thereof in the field) may be advantageous to cover changes to models caused by damage to an associated loudspeaker in the field, changes in climate (e.g., dander buildup on the speakers themselves, changes in local humidity, etc.).

Methods for simultaneous prediction of temperature and excursion during use of a loudspeaker element may be envisaged as depicted throughout the present disclosure. Methods may be envisaged to calculate the changing impedance curve with natural music, other approaches, etc.

In aspects, the system may include an observer configured to combine resistance/impedance measurements with some predictive algorithms based on temperature behavior models so as to look at an input signal in advance (e.g., a delayed version may be sent through to the loudspeaker and an immediate version through the observer), and “see” that it will lead to rapid heating, and/or excursion. Such a configuration may be advantageous for predicting when a thermal and/or excursion stress on the loudspeaker may be sufficiently dangerous, so as to avoid damage to the loudspeaker during use.

In aspects, one or more methods for obtaining excursion from impedance spectra may be coupled with temperature readings as the curves may change with excursion (due to nonlinearities) and temperature (due to temperature related property changes of loudspeaker components).

In aspects, the method may include watching the excursion of the loudspeaker so as to predict imminent failure thereof and rapidly clamping down on the input to the loudspeaker in order to prevent such failure.

In aspects, an algorithm may be provided for predicting temperature and excursion in real-time to protect against immediate failure and to protect against longer term failure due to excessive use of the speaker at significant stresses that are below the immediate failure concerns (yet equally dangerous over the long term).

Thermal aspects may be regulated based on actual temperature limits of the elements involved while excursions may be limited based on a current reading (e.g., an observer is run in parallel with the actual path). In this sense, the actual path may be slightly delayed with respect to the observer. In aspects, if a dangerous excursion is predicted by the observer, the actual path becomes clamped so as to prevent damage to the loudspeaker In aspects, an active loudspeaker in accordance with the present disclosure may include one or more onboard sensors for temperature, humidity, and/or excursion, combinations thereof, or the like. In aspects, excursion may be measured based on magnetic field measurement immediately beside the speaker coil. In aspects, excursion may be measured based on optical sensor placed into a SiP integrated speaker driver. In aspects, the sensory feedback may be made available to one or more aspects of the system (e.g., a nonlinear controller, a controller, a protection circuit, etc.). In aspects, excursion may be estimated based on back cavity pressure measurement (e.g., MEMS pressure sensor integrated into the SiP). In aspects, such sensors may dual as altimeters/barometers for other functions of the phone, which could result in cost savings by coupling with the speaker package instead of as a stand-alone chipset.

In aspects, the integrated circuit may be embedded into the speaker itself, the integrated circuit may be configured so as to measure one or more impedance values during use. Such a configuration may be advantageous for measuring values without having to past through a connector (as would be required with an off-speaker chipset).

In aspects, an active loudspeaker may allow for a reduction in contact resistance fluctuations seen in connector impedance during use, under lifetime considerations, etc. In aspects, the active loudspeaker may include a power control system in order to adapt the power rails if necessary during operation (e.g., so as to increase the overall power that may be provided to the speaker during use, so as to compensate for impedance of a connector between the power supply and the active loudspeaker, etc.).

In aspects, the active loudspeaker may be coupled into a PCB via a snap-in connector. Such a configuration may be advantageous to provide a combination of easy assembly with improved performance (e.g., to overcome contact impedance variation of such connectors amongst a product population). Such a configuration may be advantageous for providing a high performance speaker with a simple non-soldered connectors used for micro-speakers in mobile applications.

An active loudspeaker in accordance with the present disclosure may be configured to communicate with one or more aspects of an associated system through means of a communication bus. Such a configuration may allow for simplified operation (e.g., power plus a digital signal may be provided by a processor), also digital communication may allow for higher levels of system awareness and diagnostics (e.g., by providing two-way communication between speaker and source). Such a configuration may allow for programming of speaker parameters, communication of speaker parameters (either factory programmed, or obtained from internal assessments, etc.), feed-back of sensor readings to the host etc.

In aspects, a system in accordance with the present disclosure may include an audio impending power requirements prediction in accordance with the present disclosure. Such a power prediction may be performed in a similar manner to the excursion prediction (e.g., in parallel with it, on a block by block basis, etc.), the results of which could be made available to a system power manager, compared against a power constraint, or the like. Such a configuration may be advantageous for feeding a power management system with upcoming resource requirements for the loudspeaker.

In aspects, the audio control system may be configured to accept a power constraint from an external power manager (e.g., from somewhere else in the system). The corresponding protection block/compressor, etc. may be railed or limited so as to further constrain operation based upon the power constraint (e.g., to work within the confines of what the system announces that it can provide to the audio system).

In aspects, the power constraint may be coupled with an implied media network application, to automatically throttle audio output when devices enter into "quiet zones" such as theaters, hospitals, or the like. In such applications, the power constraint may be set when a device registers with a local wireless network, joins a network group, obtains a network ID, or the like.

Thus the passage of power predictions and/or power constraints may be used by a system to manage "soft" power transitions, due to events, thus forming a a "responsible" audio system that can manage operation under constrained power as well as report back near future power requirements to a system controller.

In aspects of the present disclosure, the term block computation is meant to include, without limitation, simultaneous computation of a temporal block of samples computed in a manner suitable, for purposes of integrating with a software host, for use within an operating system callback structure, to alleviate the time-sensitive nature of calculations, and/or to relieve the "always on" aspects of a sample-to-sample feedback controlled system. Such a configuration may be amendable to operation in a non-real-time operating system, such as a mobile operating system (e.g., iOS, Android, Windows 8, or the like).

It will be appreciated that additional advantages and modifications will readily occur to those skilled in the art. Therefore, the disclosures presented herein and broader aspects thereof are not limited to the specific details and representative embodiments shown and described herein. Accordingly, many modifications, equivalents, and improvements may be included without departing from the spirit or scope of the general inventive concept as defined by the appended claims and their equivalents.

What is claimed is:

1. A loudspeaker protection system for producing a rendered audio stream from one or more input signals comprising:

an estimator comprising one or more state estimating models, each state estimating model configured to accept one or more of the input signals, and to generate one or more estimated states therefrom;

a loudspeaker protection block configured to accept one or more of the input signals and/or delayed versions thereof, and the estimated states and/or signals generated therefrom, and to produce an output signal from a combination thereof; and a selector coupled to the estimator and the loudspeaker protection block and configured to select a worst case estimated state from the estimated states, and to generate an estimating signal from the worst case estimated state, wherein the loudspeaker protection block is further configured to use the estimating signal in production of the output signal.

2. The loudspeaker protection system in accordance with claim 1, further comprising a feedback block coupled to an associated loudspeaker and the selector, and configured to provide one or more feedback signals from the loudspeaker to the selector, wherein the selector is further configured to use one or more of the feedback signals in generating the estimating signal.

3. The loudspeaker protection system in accordance with claim 1, wherein one or more of the state estimating models is altered based upon the estimating signal.

4. The loudspeaker protection system in accordance with claim 1, further comprising:

a feedback block coupled to an associated loudspeaker and/or driver configured to provide one or more feedback signals or signals generated therefrom to the loudspeaker protection system;

a model bank including a group of models each with associated characteristics; and a selector coupled to the feedback block, the model bank, and the estimator, and configured to accept one or more of the feedback signals or signals generated therefrom, calculate one or more measured characteristics from the feedback signals, compare one or more model characteristics to the measured characteristics to select a best fit model from the model bank, and load, enable, and/or select an associated best fit model for operation within the estimator.

5. The loudspeaker protection system in accordance with claim 4, wherein the measured characteristic is related to loudspeaker impedance and the estimated state is related to loudspeaker excursion.

6. The loudspeaker protection system in accordance with claim 4, wherein the selector is further configured to extract a test feedback signal related to the test signal from the feedback signal.

7. The loudspeaker protection system in accordance with claim 6, wherein the selector is further configured to generate a model based upon the test signal and the test feedback signal.

8. The loudspeaker protection system in accordance with claim 1, further comprising:

a feedback block coupled to an associated loudspeaker and/or driver and configured to provide one or more feedback signals or signals generated therefrom to the system;

a model bank comprising a group of feedback estimating models each associated with a corresponding state estimating model and configured to calculate a value from one or more of the input signals; and a selector coupled to the feedback block, the model bank, and the estimator, and configured to compare one or more of the values with the feedback signals to select a best fit feedback estimating model from the model bank, wherein the selector is further configured to load, enable, and/or select a corresponding best fit state estimating model for operation within the estimator.

9. The loudspeaker protection system in accordance with claim 8, wherein the feedback signals are related to loudspeaker current and/or voltage, and the estimated state is related to loudspeaker excursion.

10. The loudspeaker protection system in accordance with claim 8, wherein the protection block, the model bank, and/or the selector are configured to accept a power constraint from an external power manager.

11. The loudspeaker protection system in accordance with claim 8, wherein the estimator, the model bank, and/or the selector are configured to generate a power prediction.

12. The loudspeaker protection system in accordance with claim 11, wherein the power prediction is used in generation of the output signal.

13. The loudspeaker protection system in accordance with claim 11, wherein the protection block is configured to compare the power prediction with a power constraint in generation of the output signal.

14. The loudspeaker protection system in accordance with claim 8, wherein one or more of the selector, the model bank, and the estimator are implemented in an operating system compatible background service.

15. The loudspeaker protection system in accordance with claim 1, wherein one or more of the state estimating models are a feed forward transfer function.

16. The loudspeaker protection system in accordance with claim 1, wherein the loudspeaker protection block comprises a compressor, limiter, and/or clipper configured to accept the input signals, and wherein the compressor, limiter, and/or clipper includes one or more properties configured by the estimated states and/or estimating signal.

17. The loudspeaker protection system in accordance with claim 1, wherein the loudspeaker protection system is configured to upload one or more of the estimated states, state estimating models, and/or estimating signals to a data center.

18. The loudspeaker protection system in accordance with claim 1, wherein one or more of the models is of a type selected from a minimum phase model, a linear phase model, and a set of one or more biquad filters.

19. The loudspeaker protection system in accordance with claim 1, wherein the loudspeaker protection block is configured to superimpose a test signal onto the output signal.

20. The loudspeaker protection system in accordance with claim 1, wherein the loudspeaker protection system is configured to periodically update one or more of the state estimating models.

21. The loudspeaker protection system in accordance with claim 20, wherein the loudspeaker protection system is further configured to download an updated model from a data center.

22. A loudspeaker protection system for producing a rendered audio stream from one or more input signals, such that the rendered audio stream is output to a loudspeaker unit in a device, the loudspeaker protection system comprising:

an estimator comprising one or more state estimating models, each state estimating model configured to accept one or more of the input signals, and to generate one or more estimated states therefrom; and a loudspeaker protection block configured to accept one or more of the input signals and/or delayed versions thereof, and the estimated states and/or signals generated therefrom, and to produce an output signal from a combination thereof, wherein the loudspeaker protection block, is configured to accept a kinetic feedback signal representative of a movement of the loudspeaker unit within an environment, and to generate the output signal based upon the kinetic feedback signal.

23. The loudspeaker protection system in accordance with claim 22, wherein a kinetic feedback signal is selected from the group consisting of a linear acceleration, a rotational motion, a pressure change, a free-fall condition, an impact, and combinations thereof.

24. A method for protecting a loudspeaker, the method comprising:

receiving an input signal including an audio stream;

estimating one or more loudspeaker states from the audio stream;

determining which estimated loudspeaker states best represent an actual loudspeaker state; and modifying the audio stream based upon the determined best estimated loudspeaker state.

25. The method for protecting a loudspeaker in accordance with claim 24, wherein the modifying step includes limiting the audio stream based upon a value of the best estimated loudspeaker state.

26. The method for protecting a loudspeaker in accordance with claim 24, further comprising:

measuring a feedback signal from the loudspeaker; and basing the determination at least in part upon the feedback signal.

27. The method for protecting a loudspeaker in accordance with claim 24, wherein the estimating step includes calculating one or more of the state estimates with a feed forward model.

28. The method for protecting a loudspeaker in accordance with claim 24, further comprising:

calculating state estimates and output estimates from corresponding model pairs;

comparing the output estimates from each model pair with a feedback signal from the loudspeaker to select the best model pair; and selecting the best estimated loudspeaker state from the best model pair.

29. The method for protecting a loudspeaker in accordance with claim 24, further comprising:

calculating a power estimate from the input signal and/or a feedback signal; and using the power estimate in the modifying step.

30. The method for protecting a loudspeaker in accordance with claim 24, further comprising:

receiving a power constraint; and limiting an output signal based upon the power constraint.

31. The method for protecting a loudspeaker in accordance with claim 24, further comprising;

sending data corresponding to one or more state estimates to a data center; and receiving one or more power constraints from the data center.

32. The method for protecting a loudspeaker in accordance with claim 24, further comprising reverting to a safe operating mode if a best estimated loudspeaker state cannot be determined.

33. The method for protecting a loudspeaker in accordance with claim 32, wherein the safe operating mode comprises:

summing each of the estimates to form a worst case estimate; and modifying the audio stream based upon the worst case estimate.

* * * * *